United States Patent
Shimomura et al.

(10) Patent No.: US 8,435,871 B2
(45) Date of Patent: May 7, 2013

(54) METHOD FOR MANUFACTURING SEMICONDUCTOR DEVICE, AND SEMICONDUCTOR DEVICE AND ELECTRONIC DEVICE

(75) Inventors: Akihisa Shimomura, Kanagawa (JP); Junpei Momo, Kanagawa (JP); Fumito Isaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1026 days.

(21) Appl. No.: 12/259,241

(22) Filed: Oct. 27, 2008

(65) Prior Publication Data

US 2009/0117716 A1    May 7, 2009

(30) Foreign Application Priority Data

Oct. 30, 2007  (JP) ................................. 2007-281631

(51) Int. Cl.
  *H01L 21/20*  (2006.01)
  *H01L 21/36*  (2006.01)

(52) U.S. Cl.
  USPC .................................... 438/487; 257/E21.52

(58) Field of Classification Search .................. 438/487; 257/E21.52
  See application file for complete search history.

(56) References Cited

U.S. PATENT DOCUMENTS

| | | | |
|---|---|---|---|
| 4,330,363 A | | 5/1982 | Biegesen et al. |
| 5,188,975 A * | | 2/1993 | Kojima et al. ................ 438/396 |
| 5,382,548 A | | 1/1995 | Lee |
| 5,766,989 A * | | 6/1998 | Maegawa et al. ............. 438/166 |
| 5,893,990 A | | 4/1999 | Tanaka |
| 6,245,645 B1 * | | 6/2001 | Mitani et al. .................. 438/455 |
| 6,524,977 B1 | | 2/2003 | Yamazaki et al. |
| 6,534,380 B1 * | | 3/2003 | Yamauchi et al. ............ 438/455 |
| 6,548,370 B1 | | 4/2003 | Kasahara et al. |
| 7,220,660 B2 * | | 5/2007 | Im et al. ........................ 438/487 |
| 7,727,846 B2 | | 6/2010 | Ohnuma et al. |
| 7,795,111 B2 | | 9/2010 | Shimomura et al. |
| 8,093,135 B2 | | 1/2012 | Shimomura et al. |
| 2003/0218212 A1 * | | 11/2003 | Lee et al. ...................... 257/347 |
| 2006/0097317 A1 * | | 5/2006 | Dantz et al. ................... 257/347 |
| 2007/0148917 A1 * | | 6/2007 | Morita et al. ................. 438/459 |

(Continued)

FOREIGN PATENT DOCUMENTS

| | | |
|---|---|---|
| JP | 11-097379 | 4/1999 |
| JP | 2000-294754 | 10/2000 |
| JP | 2005-203596 | 7/2005 |
| JP | 2005-252244 | 9/2005 |

*Primary Examiner* — Lex Malsawma
(74) *Attorney, Agent, or Firm* — Fish & Richardson P.C.

(57) ABSTRACT

To provide a high-performance semiconductor device using an SOI substrate in which a substrate having low heat resistance is used as a base substrate, to provide a high-performance semiconductor device without performing mechanical polishing, and to provide an electronic device using the semiconductor device, planarity of a semiconductor layer is improved and defects in the semiconductor layer are reduced by laser beam irradiation. Accordingly, a high-performance semiconductor device can be provided without performing mechanical polishing. In addition, a semiconductor device is manufactured using a region having the most excellent characteristics in a region irradiated with the laser beam. Specifically, instead of the semiconductor layer in a region which is irradiated with the edge portion of the laser beam, the semiconductor layer in a region which is irradiated with portions of the laser beam except the edge portion is used as a semiconductor element. Accordingly, performance of the semiconductor device can be greatly improved. Moreover, an excellent electronic device can be provided.

19 Claims, 34 Drawing Sheets

U.S. PATENT DOCUMENTS

| | | |
|---|---|---|
| 2007/0151963 A1* | 7/2007 | Tanaka et al. ............ 219/121.78 |
| 2007/0161199 A1* | 7/2007 | Morita ......................... 438/311 |
| 2007/0184631 A1* | 8/2007 | Nakamura et al. ............ 438/455 |
| 2008/0076267 A1* | 3/2008 | Oishi et al. ................... 438/785 |
| 2008/0124929 A1* | 5/2008 | Okuda et al. .................. 438/692 |
| 2008/0200010 A1* | 8/2008 | Endo et al. .................... 438/458 |
| 2008/0280420 A1* | 11/2008 | Yamazaki ..................... 438/458 |

* cited by examiner

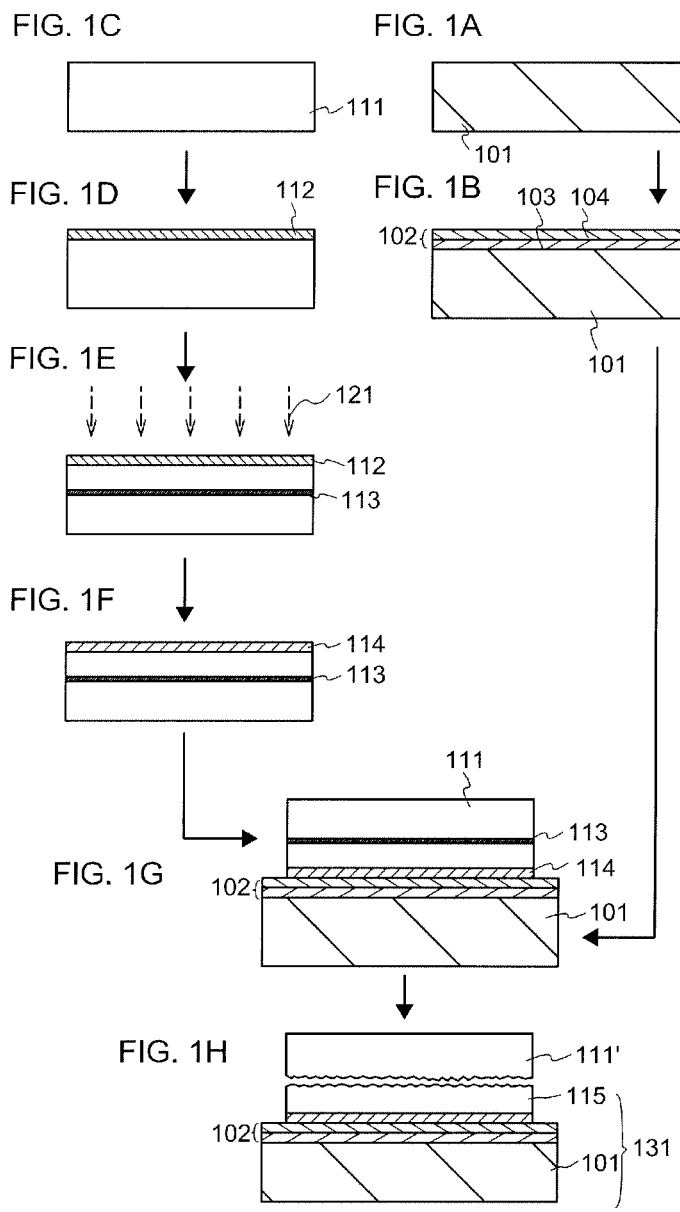

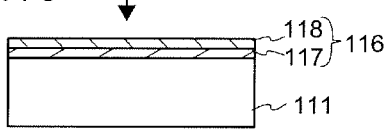
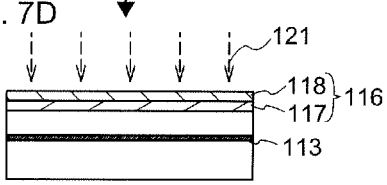
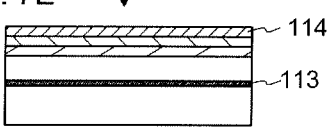
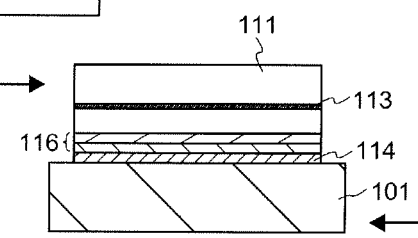
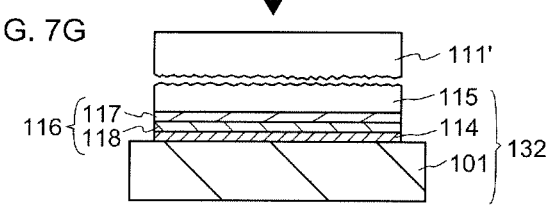

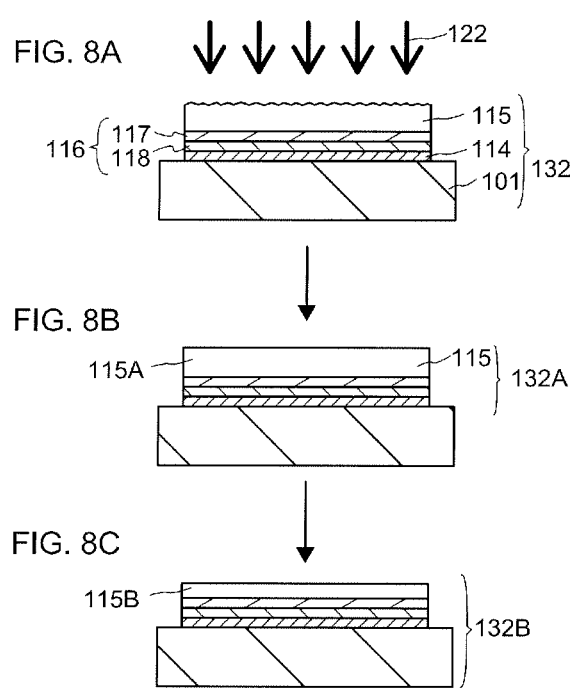

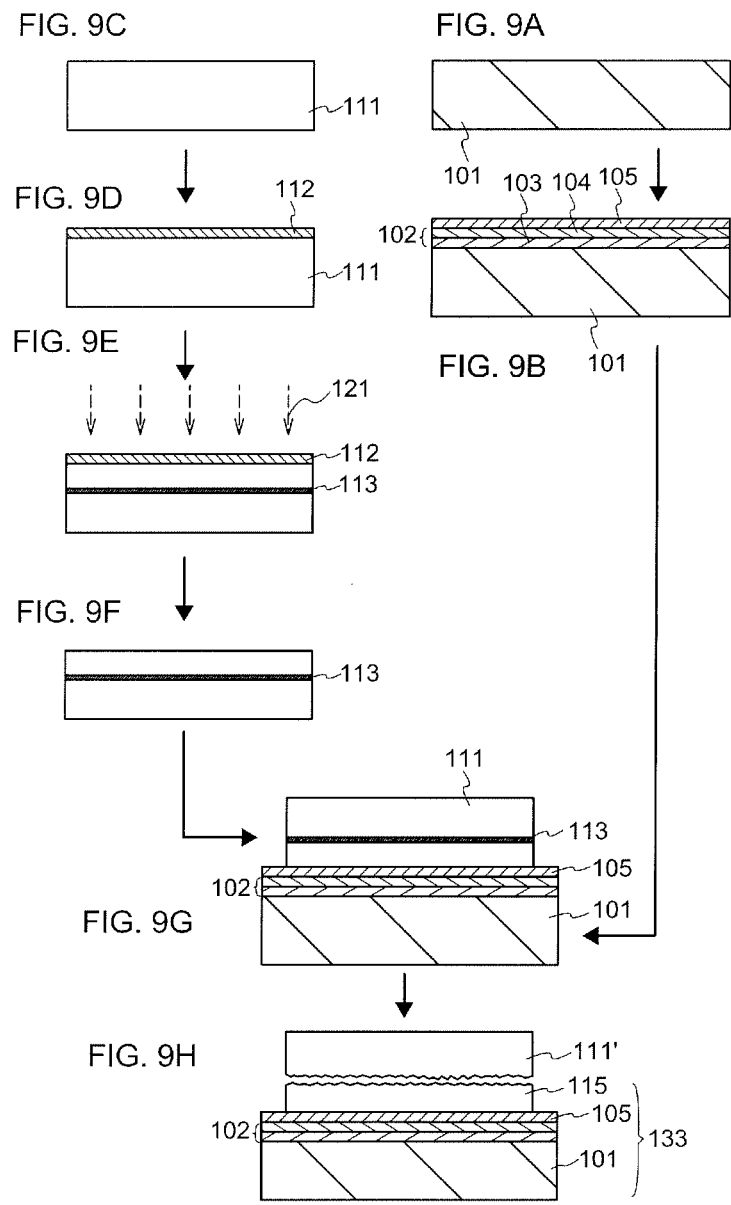

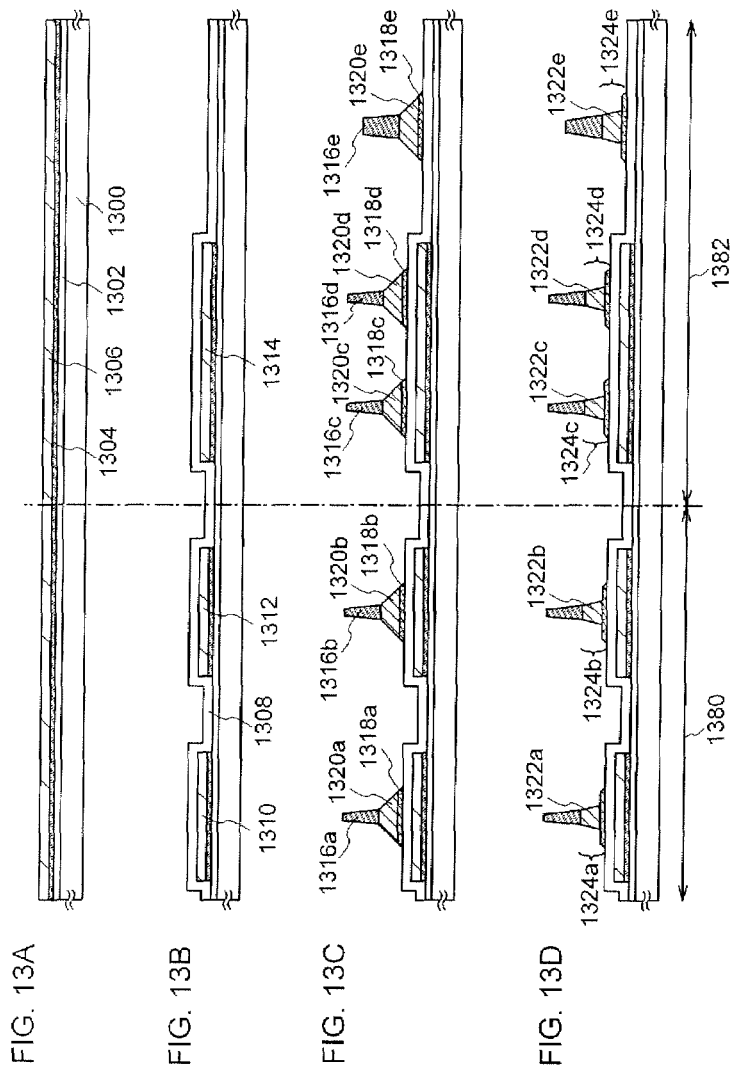

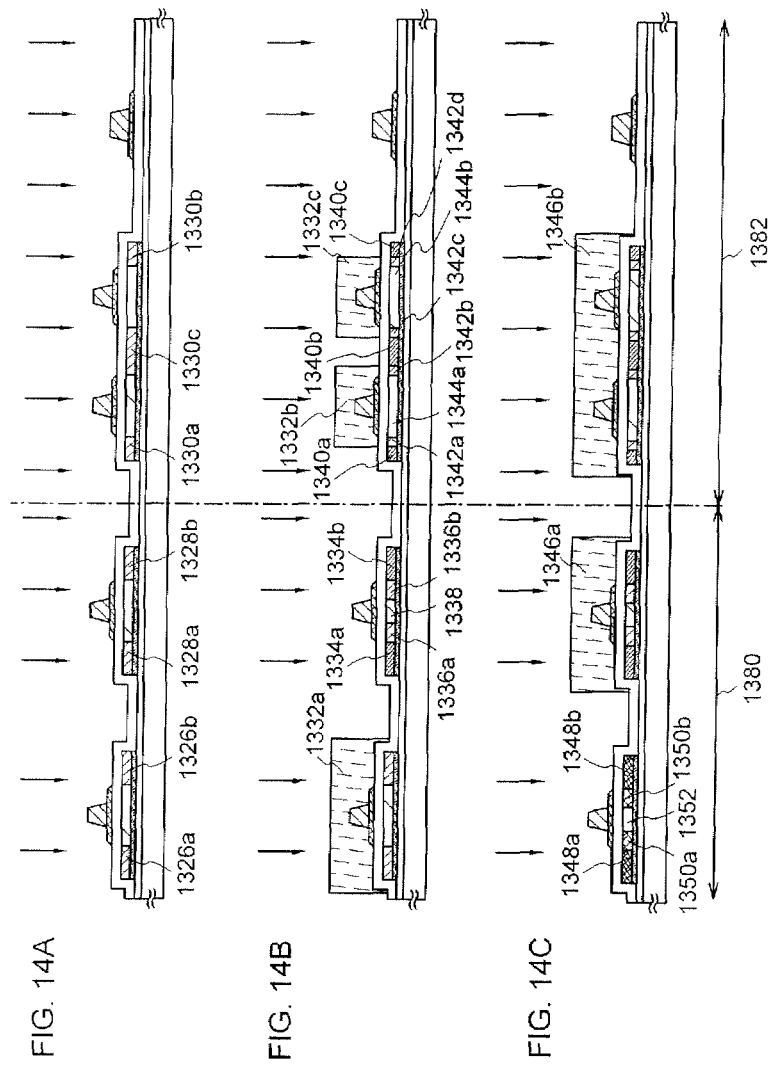

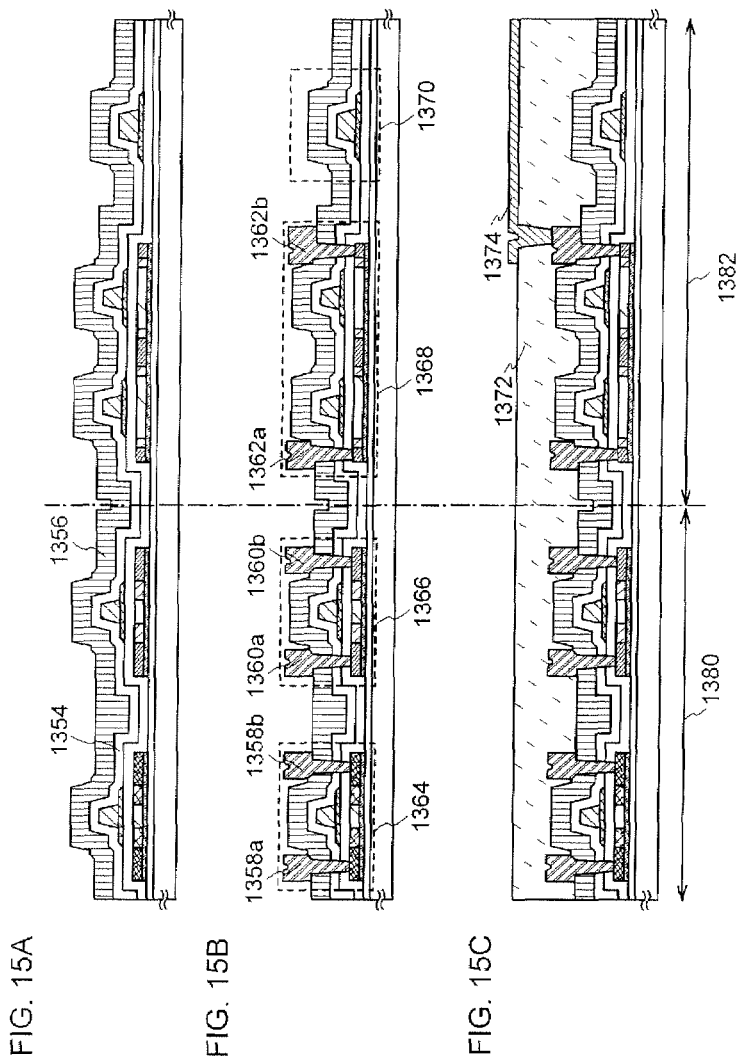

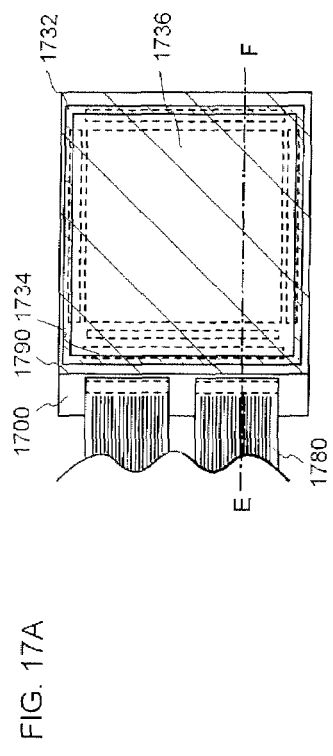
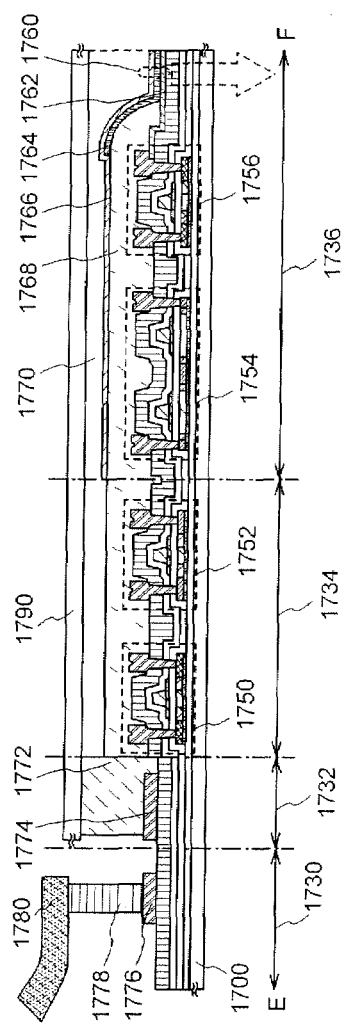
FIG. 17A
FIG. 17B

2200

2200

2200

2200

2200

FIG. 23A
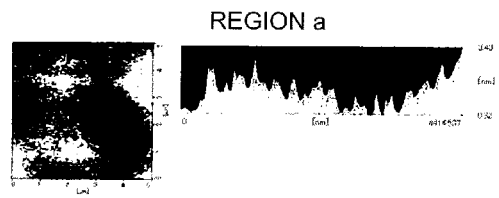
REGION a
Ra : $6.293 \times 10^{-1}$ nm
P-V : $1.085 \times 10^{1}$ nm
RMS : $8.242 \times 10^{-1}$ nm
Rz : 6.816 nm (10 points)
S : $2.501 \times 10^{7}$ nm$^2$
S ratio : 1.00028
FIG. 23B
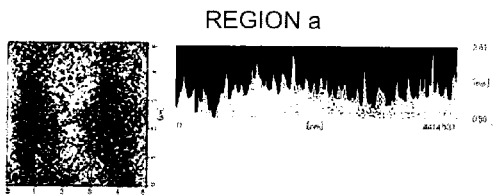
REGION a
Ra : $2.974 \times 10^{-1}$ nm
P-V : 9.864 nm
RMS : $4.087 \times 10^{-1}$ nm
Rz : 6.368 nm (10 points)
S : $2.501 \times 10^{7}$ nm$^2$
S ratio : 1.00032
FIG. 23C
|  | Ra | Rms | P-V |
|---|---|---|---|
| (A) | 0.6293 | 0.8242 | 10.85 |
| (B) | 0.2974 | 0.4087 | 9.864 |

FIG. 24A
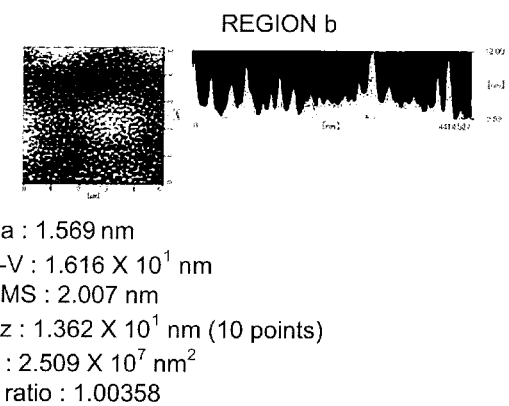
Ra : 1.569 nm
P-V : $1.616 \times 10^1$ nm
RMS : 2.007 nm
Rz : $1.362 \times 10^1$ nm (10 points)
S : $2.509 \times 10^7$ nm$^2$
S ratio : 1.00358
FIG. 24B
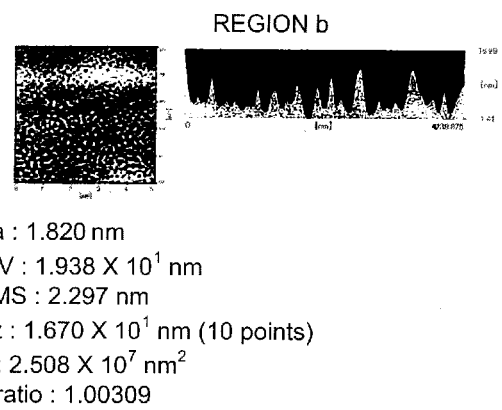
Ra : 1.820 nm
P-V : $1.938 \times 10^1$ nm
RMS : 2.297 nm
Rz : $1.670 \times 10^1$ nm (10 points)
S : $2.508 \times 10^7$ nm$^2$
S ratio : 1.00309
FIG. 24C
|     | Ra    | Rms   | P-V   |
| --- | ----- | ----- | ----- |
| (A) | 1.569 | 2.007 | 16.16 |
| (B) | 1.82  | 2.297 | 19.38 |

FIG. 34

| ACCELERATING VOLTAGE | HYDROGEN ATOM RATIO (X : Y) | HYDROGEN ION SPECIES RATIO (X : Y/3) |
|---|---|---|
| 80 kV | 1 : 44.1 | 1 : 14.7 |
| 60 kV | 1 : 42.5 | 1 : 14.2 |
| 40 kV | 1 : 43.5 | 1 : 14.5 |

METHOD FOR MANUFACTURING SEMICONDUCTOR DEVICE, AND SEMICONDUCTOR DEVICE AND ELECTRONIC DEVICE

BACKGROUND OF THE INVENTION

1. Field of the Invention

The present invention relates to a method for manufacturing a semiconductor device, and a semiconductor device and an electronic device which are manufactured using the method.

Note that in this specification, a semiconductor device means a device which can function by utilizing semiconductor characteristics, and a display device or the like as well as a semiconductor circuit is included in the semiconductor device.

2. Description of the Related Art

Integrated circuits using an SOI (silicon on insulator) substrate, instead of using a bulk silicon wafer, have been developed. By utilizing the characteristics of a thin single crystal silicon layer formed over an insulating layer, transistors formed in the integrated circuit can be separated from each other completely. Further, since the fully depleted transistors can be formed, a semiconductor integrated circuit with high added value such as high integration, high speed driving, and low power consumption can be realized.

As a manufacturing method of an SOI substrate, a hydrogen ion implantation separation method in which hydrogen ion implantation and separation by the hydrogen ion implantation are combined is known. A typical process of the hydrogen ion implantation separation method is described below.

First, hydrogen ions are implanted into a silicon wafer to form a damaged region at a predetermined depth from the surface. Next, a silicon oxide film is formed by oxidizing another silicon wafer which serves as a base substrate. After that, the silicon wafer into which the hydrogen ions are implanted is bonded to the silicon oxide film of the other silicon wafer, so that the two silicon wafers are attached to each other. Then, heat treatment is performed thereon, whereby the wafers are cleaved from each other with the damaged region used as a cleavage plane. Note that different heat treatment from the heat treatment at the time of cleavage is performed in order to improve the bonding force in the attachment.

In addition, a method for forming a single crystal silicon layer over a glass substrate by the hydrogen ion implantation separation method is known (for example, see Patent Document 1: Japanese Published Patent Application No. H11-097379). In Patent Document 1, a separation surface is mechanically polished in order to remove a defect layer which is formed by ion implantation and steps of several nm to several tens of nm at the separation surface.

A glass substrate is an inexpensive substrate with larger area than a silicon wafer, and is mainly used when a liquid crystal display device is manufactured. By using a glass substrate as a base substrate, an inexpensive and large-area SOI substrate can be manufactured.

However, the glass substrate has a predetermined strain point and low heat resistance. Therefore, the glass substrate cannot be heated at a temperature which exceeds a heat resistance temperature thereof, and the process temperature is limited to be less than or equal to the strain point. That is, there is also a process temperature limit when crystal defects are reduced and surface unevenness is reduced in a separation surface. In addition, there is a process temperature limit also in manufacturing a transistor using a single crystal silicon layer attached to a glass substrate.

Further, in a case of a large-sized substrate, an apparatus and a processing method which can be used are also limited. For example, the use of the mechanical polishing of the separation surface described in Patent Document 1 is not practical for a large-area substrate, in terms of processing accuracy, cost for an apparatus, or the like. However, to bring out the characteristics of a semiconductor element, it is necessary that the surface unevenness in the separation surface and the defect density in a semiconductor layer be suppressed to a certain value or less. Particularly when the single crystal silicon layer is used as an active layer of a semiconductor element (e.g., a channel formation region of a transistor), this point is extremely important.

As described above, in the case where a substrate which is large in area and low in heat resistance, such as a glass substrate, is used as a base substrate, it is difficult to suppress surface unevenness and the defect density of a semiconductor layer and to obtain desired characteristics.

SUMMARY OF THE INVENTION

In view of the forgoing problems, it is one object of the present invention to provide a high-performance semiconductor device using an SOI substrate in which a substrate having low heat resistance is used as a base substrate. Further, it is another object of the present invention to provide a high-performance semiconductor device without performing mechanical polishing. Further, it is still another object of the present invention to provide an electronic device using the semiconductor device.

In the present invention, planarity of a semiconductor layer is improved and defects in the semiconductor layer are reduced by laser irradiation. Accordingly, a high-performance semiconductor device can be provided without performing mechanical polishing. In addition, a semiconductor device is manufactured using a region having the most excellent characteristics in a region irradiated with the laser beam. Specifically, instead of the semiconductor layer in a region which is irradiated with the edge portion of the laser beam, the semiconductor layer in a region which is irradiated with portions of the laser beam except the edge portion is used as a semiconductor element. Accordingly, performance of the semiconductor device can be greatly improved. Moreover, an excellent electronic device can be provided.

According to one feature of the present invention, a method for manufacturing a semiconductor device includes the steps of: irradiating a main surface of a single crystal semiconductor substrate with ions to form a damaged region; forming an insulating layer on the main surface of the single crystal semiconductor substrate; bonding the insulating layer and a substrate having an insulating surface to each other; separating the single crystal semiconductor substrate at the damaged region to form a single crystal semiconductor layer over the substrate having an insulating surface; irradiating part of a region of the single crystal semiconductor layer with a pulsed laser beam to reduce defects in the single crystal semiconductor layer and improve planarity of the surface; and forming an active layer of a semiconductor element by using the single crystal semiconductor layer in a region which is irradiated with a portion of the pulsed laser beam except an edge portion.

According to another feature of the present invention, a method for manufacturing a semiconductor device includes the steps of: irradiating a main surface of a single crystal semiconductor substrate with ions to form a damaged region;

forming an insulating layer over a substrate having an insulating surface; bonding the single crystal semiconductor substrate and the insulating layer to each other; separating the single crystal semiconductor substrate at the damaged region to form a single crystal semiconductor layer over the substrate having an insulating surface; irradiating part of a region of the single crystal semiconductor layer with a pulsed laser beam to reduce defects in the single crystal semiconductor layer and improve planarity of the surface; and forming an active layer of a semiconductor element by using the single crystal semiconductor layer in a region which is irradiated with a portion of the pulsed laser beam except an edge portion.

In any of the methods described above, the insulating layer may include an insulating layer which is formed by a chemical vapor deposition method with the use of an organosilane gas. In addition, the insulating layer may be formed with a stacked-layer structure.

According to another feature of the present invention, a method for manufacturing a semiconductor device, using a semiconductor substrate having a single crystal semiconductor layer on an insulating surface, in which defects in the single crystal semiconductor layer are reduced and planarity of the surface is improved in the semiconductor substrate by irradiating part of a region of the single crystal semiconductor layer with a pulsed laser beam, and in which an active layer of a semiconductor element is formed by using the single crystal semiconductor layer in a region which is irradiated with a portion of the pulse laser beam except an edge portion.

In any of the methods described above, the light intensity in the portion of the pulsed laser beam except the edge portion is less than the light intensity at which the single crystal semiconductor layer is melted completely and greater than or equal to 85% of light intensity which serves as a boundary between complete melting and partial melting, and light intensity in the edge portion of the pulsed laser beam is less than 85% of the light intensity which serves as the boundary. In addition, an average surface roughness of the surface of the single crystal semiconductor layer in the region which is irradiated with the portion of the pulsed laser beam except the edge portion is less than 1.5 nm and a root-square roughness thereof is less than 2 nm, while an average surface roughness of the surface of the single crystal semiconductor layer in the region which is irradiated with the edge portion of the pulsed laser beam is greater than or equal to 1.5 nm and a root-square roughness thereof is greater than or equal to 2 nm. Moreover, a wavenumber of a Raman peak (a peak wavenumber in the Raman spectrum) of the single crystal semiconductor layer in the region which is irradiated with the portion of the pulsed laser beam except the edge portion is greater than or equal to 520.4 $cm^{-1}$, and a wavenumber of a Raman Peak (a peak wavenumber in the Raman spectrum) of the single crystal semiconductor layer in the region which is irradiated with the edge portion of the pulsed laser beam is less than 520.4 $cm^{-1}$.

Alternatively, in any of the methods described above, the pulsed laser beam may be an excimer laser beam. In addition, the pulsed laser beam may have a linear shape. In any of the methods described above, laser irradiation may be performed so that part of the region irradiated with the pulsed laser beam overlaps. In this case, the overlap ratio is preferably set at greater than or equal to 5% and less than or equal to 20%.

A variety of semiconductor devices can be manufactured using the above-described methods for manufacturing a semiconductor device. In addition, a variety of electronic devices can be provided using the semiconductor devices.

Note that in any of the methods described above, a single crystal semiconductor is a semiconductor which is formed to have a crystalline structure with certain regularity and crystal axes of which are all in the same direction in any portion. That is, there may be a large number of defects or a small number of defects.

In the present invention, although a substrate having low heat resistance is used, surface unevenness and defects of a single crystal semiconductor layer are reduced without performing mechanical polishing. Accordingly, a high-performance semiconductor device can be provided by using an SOI substrate in which a substrate having low heat resistance is used as a base substrate. In addition, a region which is irradiated with an edge portion of a laser beam is not used as an active layer of a semiconductor element, so that higher performance can be achieved. Further, a variety of electronic devices can be provided using the semiconductor devices.

BRIEF DESCRIPTION OF THE DRAWINGS

In the accompanying drawings:

FIGS. 1A to 1H are cross-sectional views illustrating a method for manufacturing an SOI substrate;

FIGS. 7A to 7G are cross-sectional views illustrating a method for manufacturing an SOI substrate;

FIGS. 8A to 8C are cross-sectional views illustrating a method for manufacturing an SOI substrate;

FIGS. 9A to 9H are cross-sectional views illustrating a method for manufacturing an SOI substrate;

FIGS. 13A to 13D are cross-sectional views illustrating a method for manufacturing a semiconductor device;

FIGS. 14A to 14C are cross-sectional views illustrating a method for manufacturing a semiconductor device;

FIGS. 15A to 15C are cross-sectional views illustrating a method for manufacturing a semiconductor device;

FIGS. 17A and 17B are respectively a plan view and a cross-sectional view of a semiconductor device;

FIGS. 23A and 23B are each an observation image and a cross-sectional profile, and FIG. 23C is parameter which shows planarity of a surface of a semiconductor layer observed by AFM;

FIGS. 24A to 24C are an observation image, a cross-sectional profile, and parameter which shows planarity of a surface of a semiconductor layer observed by AFM;

FIG. 34 is a list of ratios of fitting parameters (hydrogen atom ratios and hydrogen ion species ratios).

DETAILED DESCRIPTION OF THE INVENTION

Figure 2A:
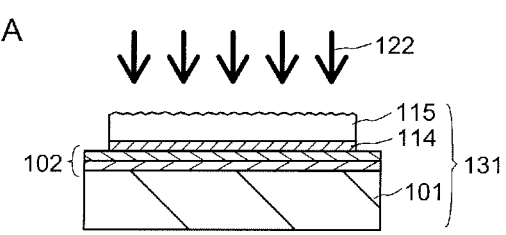
FIGS. 2A to 2C are cross-sectional views illustrating a method for manufacturing an SOI substrate.
Figure 2B:
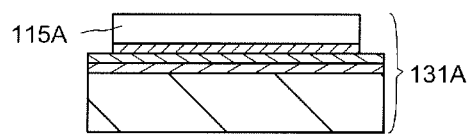

Embodiment modes and embodiments of the present invention will be described hereinafter, with reference to the drawings. The present invention is not limited to the following description, and it is easily understood by those skilled in the art that modes and details herein disclosed can be modified in various ways without departing from the spirit and the scope of the present invention. Therefore, the present invention is not to be construed with limitation to what is described in the embodiment modes and embodiments below. Note that in the structure of the present invention which will be explained below, the same portions are to be denoted by the same reference numerals through different drawings.

Embodiment Mode 1

In this embodiment mode, an example of a method for manufacturing a semiconductor device of the present invention will be described.

First, a method for manufacturing an SOI substrate which is used for a semiconductor device will be described with reference to FIGS. 1A to 1H, FIGS. 2A to 2C, and FIGS. 3A to 3C.

First, a base substrate 101 is prepared (see FIG. 1A). As the base substrate 101, a light-transmitting glass substrate used for the products of electronics industry such as a liquid crystal display device can be used. A substrate having a strain point greater than or equal to 580° C. (preferably greater than or equal to 600° C.) may be used as the glass substrate. Further, the glass substrate is preferably a non-alkali glass substrate. As a material of the non-alkali glass substrate, a glass material such as aluminosilicate glass, aluminoborosilicate glass, or barium borosilicate glass is used, for example.

Note that as the base substrate 101, as well as the glass substrate, an insulating substrate which is formed of an insulator, such as a ceramic substrate, a quartz substrate, or a sapphire substrate; a conductive substrate which is formed of a conductor such as metal or stainless steel; a semiconductor substrate which is formed of a semiconductor such as silicon or gallium arsenide; or the like can also be used.

Next, the base substrate 101 is washed, and an insulating layer 102 having a thickness greater than or equal to 10 nm and less than or equal to 400 nm is formed thereover (see FIG. 1B). The insulating layer 102 can have a single-layer structure or a multilayer structure of two or more layers.

As a film which forms the insulating layer 102, an insulating film containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film, can be used. Further, an insulating film containing a metal oxide such as aluminum oxide, tantalum oxide, or hafnium oxide; an insulating film containing a metal nitride such as aluminum nitride; an insulating film containing a metal oxynitride such as aluminum oxynitride; or an insulating film containing a metal nitride oxide such as aluminum nitride oxide can also be used.

Note that in this specification, an oxynitride is a substance that contains more oxygen than nitrogen. For example, silicon oxynitride includes oxygen in the range of greater than or equal to 50 atomic % and less than or equal to 70 atomic %, nitrogen in the range of greater than or equal to 0.5 atomic % and less than or equal to 15 atomic %, silicon in the range of greater than or equal to 25 atomic % and less than or equal to 35 atomic %, and hydrogen in the range of greater than or equal to 0.1 atomic % and less than or equal to 10 atomic %. Further, a nitride oxide is a substance that contains more nitrogen than oxygen. For example, silicon nitride oxide includes oxygen in the range of greater than or equal to 5 atomic % and less than or equal to 30 atomic %, nitrogen in the range of greater than or equal to 20 atomic % and less than or equal to 55 atomic %, silicon in the range of greater than or equal to 25 atomic % and less than or equal to 35 atomic %, and hydrogen in the range of greater than or equal to 10 atomic % and less than or equal to 30 atomic %. The ranges described above are ranges for cases measured using Rutherford backscattering spectrometry (RBS) and hydrogen forward scattering (HFS). Moreover, the total for the content ratio of the constituent elements does not exceed 100 atomic %.

In the case of using a substrate containing an impurity which reduces reliability of a semiconductor device, such as an alkali metal or an alkaline earth metal, as the base substrate 101, at least one layer of film which can prevent such an impurity from diffusing from the base substrate 101 into a semiconductor layer of an SOI substrate is preferably provided. As such a film, a silicon nitride film, a silicon nitride oxide film, an aluminum nitride film, an aluminum nitride oxide film, or the like can be given. When such a film is included, the insulating layer 102 can serve as a barrier layer.

For example, in the case of forming the insulating layer 102 as a barrier layer with a single-layer structure, a silicon nitride film, a silicon nitride oxide film, an aluminum nitride film, or an aluminum nitride oxide film having a thickness greater than or equal to 10 nm and less than or equal to 200 nm can be formed.

In the case where the insulating layer 102 serves as a barrier layer and has a two-layer structure, any of the following structures can be employed, for example: stacked films of a silicon nitride film and a silicon oxide film, stacked films of a silicon nitride film and a silicon oxynitride film, stacked films of a silicon nitride oxide film and a silicon oxide film, stacked films of a silicon nitride oxide film and a silicon oxynitride film, and the like. Note that it is preferable that, in each of the two-layer structures described above, the film described first be a film (a lower film) formed on the top surface of the base substrate 101. Further, it is preferable that, as an upper layer film, a film made of a material capable of relaxing stress be selected so that internal stress of the lower layer having a high blocking effect does not affect a semiconductor layer. Further, the thickness of the upper layer can be greater than or equal to 10 nm and less than or equal to 200 nm, and the thickness of the lower layer can be greater than or equal to 10 nm and less than or equal to 200 nm.

In this embodiment mode, the insulating layer 102 employs a two-layer structure in which the lower layer is a silicon nitride oxide film 103 formed by a plasma CVD method using $SiH_4$ and $NH_3$ as a process gas and the upper layer is a silicon oxynitride film 104 formed by a plasma CVD method using $SiH_4$ and $N_2O$ as a process gas.

A semiconductor substrate is processed along with the process shown in FIGS. 1A and 1B. First, a semiconductor substrate 111 is prepared (see FIG. 1C). The semiconductor substrate 111 is thinned to be a semiconductor layer and is attached to the base substrate 101 so that an SOI substrate is manufactured. Note that although a single crystal semiconductor substrate is preferably used as the semiconductor substrate 111, a polycrystalline semiconductor substrate can be used as well. Alternatively, a semiconductor substrate made of an element belonging to Group 4 of the periodic table, such as silicon, germanium, silicon-germanium, or silicon carbide. It is needless to say that a semiconductor substrate made of a compound semiconductor such as gallium arsenide or indium phosphide may be used as well. The size or the like of the semiconductor substrate is not limited, and any of semiconductor substrates which are, for example, 5 inches in diameter (125 mm), 8 inches in diameter (200 mm), 12 inches in diameter (300 mm), 18 inches in diameter (450 mm), and the like can be used by being processed into an appropriate size and an appropriate shape.

Next, the semiconductor substrate 111 is cleaned. Then, after that, a protective film 112 is formed on the surface of the semiconductor substrate 111 (see FIG. 1D). The protective film 112 has an effect of preventing the semiconductor substrate 111 from being contaminated by an impurity at the time of ion irradiation, an effect of preventing the semiconductor substrate 111 from being damaged by bombardment of irradiation ions, and the like. The protective film 112 can be formed by depositing silicon oxide, silicon nitride, silicon nitride oxide, silicon oxynitride, or the like by a CVD method or the like. Further, the protective film 112 can also be formed by oxidizing or nitriding the semiconductor substrate 111.

Next, the semiconductor substrate 111 is irradiated with ion beams 121 including ions accelerated by electric field through the protective film 112, so that a damaged region 113 is formed in a region at a predetermined depth from the surface of the semiconductor substrate 111 (see FIG. 1E). The depth of the region where the damaged region 113 is formed can be controlled by the accelerating energy of the ion beam 121 and the angle at which the ion beam 121 enters. The damaged region 113 is formed in a region at a depth the same or substantially the same as the average depth of introduced ions.

Depending on the depth at which the damaged region 113 described above is formed, the thickness of the semiconductor layer which is separated from the semiconductor substrate 111 is determined. The depth at which the damaged region 113 is formed is greater than or equal to 50 nm and less than or equal to 500 nm, and the preferable thickness of the semiconductor layer which is separated from the semiconductor substrate 111 is greater than or equal to 50 nm and less than or equal to 200 nm.

At the time of irradiating the semiconductor substrate 111 with ions, an ion implantation apparatus or an ion doping apparatus can be used. In the ion implantation apparatus, a source gas is excited to produce ion species, the produced ion species are mass-separated, and ion species each having a predetermined mass are implanted in a process object. In the ion doping apparatus, a process gas is excited to produce ion species, the produced ion species are not mass-separated, and a process object is irradiated with the produced ion species. Note that in the ion doping apparatus provided with a mass separator, ion irradiation with mass separation can be performed like in the ion implantation apparatus. In this specification, ion irradiation may be performed by using either apparatus when not particularly mentioned.

For example, an ion irradiation step with the ion doping apparatus can be performed in the following conditions:

Acceleration voltage is greater than or equal to 10 kV and less than or equal to 100 kV (preferably greater than or equal to 30 kV and less than or equal to 80 kV)

Dose is greater than or equal to $1\times10^{16}/cm^2$ and less than or equal to $4\times10^{16}/cm^2$ Beam current density is greater than or equal to $2\ \mu A/cm^2$ (preferably greater than or equal to $5\ \mu A/cm^2$, and more preferably greater than or equal to $10\ \mu A/cm^2$)

A hydrogen gas can be used for a source gas in the ion irradiation step with the ion doping apparatus. By using the hydrogen gas ($H_2$ gas), $H^+$, $H_2^+$, and $H_3^+$ ions can be produced as ion species. In the case where the hydrogen gas is used as a source gas, it is preferable to perform irradiation with a larger amount of $H_3^+$ ions. By irradiation with a larger amount of $H_3^+$ ions, ion irradiation efficiency is improved as compared to the case of irradiation with $H^+$ ions and/or $H_2^+$ ions. That is, irradiation time can be shortened. Further, separation from the damaged region 113 becomes easier. Further, since the average penetration depth of ions can be made shallow by using $H_3^+$ ions, the damaged region 113 can be formed in a region at a shallower depth from the surface of the semiconductor substrate 111.

When the ion implantation apparatus is used, it is preferable to implant $H_3^+$ ions through mass separation. It is needless to say that $H_2^+$ ions may be implanted. However, when the ion implantation apparatus is used, implantation is performed by selecting ion species; therefore, in some cases, ion irradiation efficiency may be decreased as compared to the case of using the ion doping apparatus.

When the ion doping apparatus is used, it is preferable that $H_3^+$ ions be included at 70% or more of the total amount of $H^+$, $H_2^+$, and $H_3^+$ ions in the ion beams 121. It is more preferable that the proportion of $H_3^+$ ions be greater than or equal to 80%. With a high proportion of $H_3^+$ ions in such a manner, the damaged region 113 can contain hydrogen at a concentration greater than or equal to $1\times10^{20}$ atoms/cm$^3$. Note that separation of a semiconductor layer can be easy when the damaged region 113 contains hydrogen at a concentration greater than or equal to $5\times10^{20}$ atoms/cm$^3$.

As the source gas in the ion irradiation step, instead of a hydrogen gas, one or more kinds of gas selected from a rare gas such as a helium gas or an argon gas, a halogen gas typified by a fluorine gas or a chlorine gas, and a halogen compound gas such as a fluorine compound gas (e.g., $BF_3$) can be used. When helium is used for the source gas, the ion beams 121 with high proportion of $He^+$ ions can be formed without mass separation. By using such ion beams as the ion beams 121, the damaged region 113 can be formed efficiently.

Further, the damaged region 113 can also be formed by performing an ion irradiation step plural times. In this case, either a different source gas or the same source gas may be used for each ion irradiation step. For example, after ion irradiation is performed using a rare gas as a source gas, ion irradiation can be performed using a hydrogen gas as a source gas. Alternatively, ion irradiation can be performed first using a halogen gas or a halogen compound gas, and then, ion irradiation can be performed using a hydrogen gas.

An ion irradiation method, which is also one aspect of the present invention, is considered below.

In the present invention, a single crystal semiconductor substrate is irradiated with ions that are derived from hydrogen (H) (hereinafter referred to as "hydrogen ion species"). More specifically, a hydrogen gas or a gas which contains hydrogen in its composition is used as a source material; a hydrogen plasma is generated; and a single crystal semiconductor substrate is irradiated with the hydrogen ion species in the hydrogen plasma.

(Ions in Hydrogen Plasma)

In such a hydrogen plasma as described above, hydrogen ion species such as $H^+$, $H_2^+$, and $H_3^+$ are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 27:
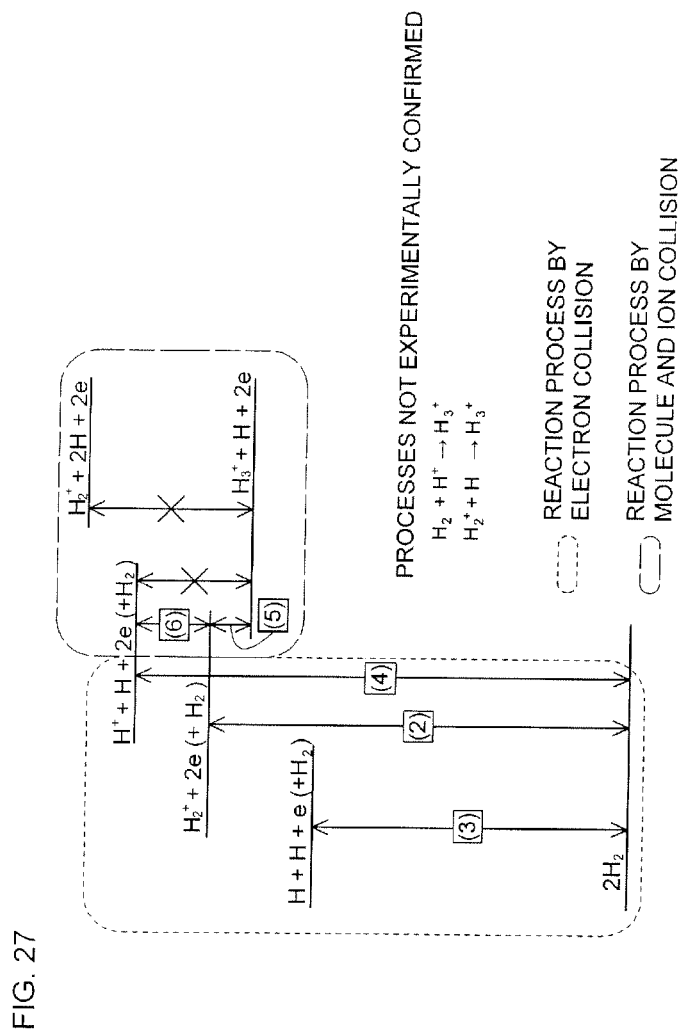
FIG. 27 is an energy diagram of hydrogen ion species.

FIG. 27 is an energy diagram which schematically shows some of the above reactions. Note that the energy diagram shown in FIG. 27 is merely a schematic diagram and does not depict the relationships of energies of the reactions exactly.

($H_3^+$ Formation Process)

As shown above, $H_3^+$ is mainly produced through the reaction process that is represented by the reaction equation (5). On the other hand, as a reaction that competes with the reaction equation (5), there is the reaction process represented by the reaction equation (6). For the amount of $H_3^+$ to increase, at the least, it is necessary that the reaction of the reaction equation (5) occur more often than the reaction of the reaction equation (6) (note that because there are also other reactions, (7), (8), and (9), through which the amount of $H_3^+$ is decreased, the amount of $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy that a given charged particle gains before colliding with another particle is equal to the difference between a potential energy at a potential before the charged particle moves and a potential energy at a potential before the collision. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of $H_2^+$ is low in a situation where the pressure inside the chamber is high. That is, because the reaction of the reaction equation (6) is the main reaction in the situation where the pressure inside the chamber is low, the amount of $H_3^+$ tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ is high, and in the opposite situation, the kinetic energy of $H_2^+$ is low. That is, because the reaction of the reaction equation (6) is the main reaction in the situation where the electric field is high, the amount of $H_3^+$ tends to be decreased, and because the reaction of the reaction equation (5) is the main reaction in a situation where the electric field is low, the amount of $H_3^+$ tends to be increased.

(Differences Depending on Ion Source)

Figure 28:
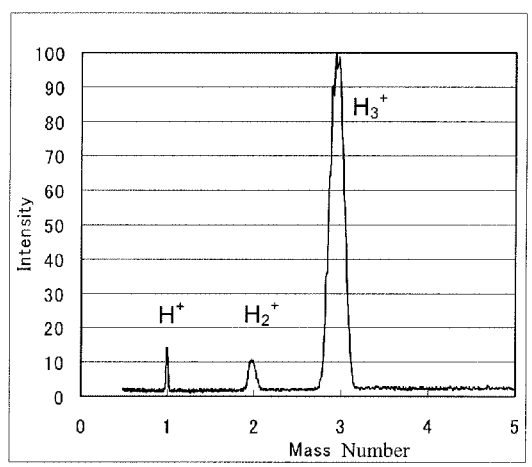
FIG. 28 is a diagram showing the results of ion mass spectrometry.

Here, an example, in which the proportions of ion species (particularly, the proportion of $H_3^+$) are different, is described. FIG. 28 is a graph showing the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass number. In the spectrum, peaks of the mass number 1, the mass number 2, and the mass number 3 correspond to $H^+$, $H_2^+$, and $H_3^+$, respectively. The vertical axis represents the intensity of the spectrum, which corresponds to the number of ions. In FIG. 28, the number of ions with different masses is expressed as a relative proportion where the number of ions with a mass of 3 is defined as 100. It can be seen from FIG. 28 that the ratio between ion species that are generated from the ion source, i.e., the ratio between $H^+$, $H_2^+$, and $H_3^+$, is about 1:1:8. Note that ions at such a ratio can also be generated by an ion doping apparatus which has a plasma source portion (ion source) that generates a plasma, an extraction electrode that extracts an ion beam from the plasma, and the like.

Figure 29:
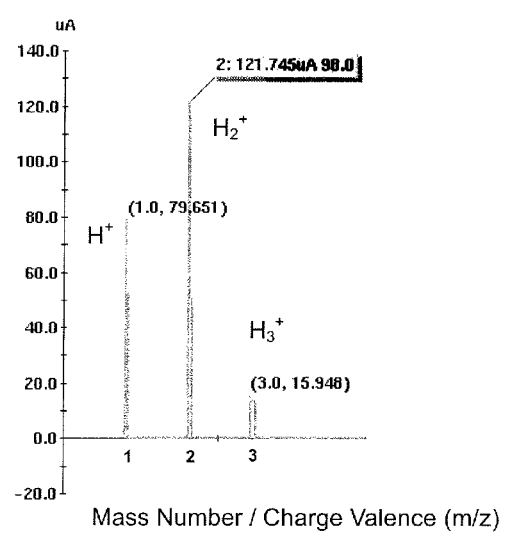
FIG. 29 is a diagram showing the results of ion mass spectrometry.

FIG. 29 is a graph showing the results of mass spectrometry of ions that are generated from $PH_3$ when an ion source different from that for the case of FIG. 28 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 28, the horizontal axis represents ion mass number, and peaks of the mass number 1, the mass number 2, and the mass number 3 correspond to $H^+$, $H_2^+$, and $H_3^+$, respectively. The vertical axis represents the intensity of a spectrum corresponding to the number of ions. It can be seen from FIG. 29 that the ratio between ion species in a plasma, i.e., the ratio between $H^+$, $H_2^+$, and $H_3^+$, is about 37:56:7. Note that although FIG. 29 shows the data obtained when the source gas is $PH_3$, the ratio between the hydrogen ion species is about the same when a 100% hydrogen gas is used as a source gas, as well.

In the case of the ion source from which the data shown in FIG. 29 is obtained, $H_3^+$, of $H^+$, $H_2^+$, and $H_3^+$, is generated at a proportion of only about 7%. On the other hand, in the case of the ion source from which the data shown in FIG. 28 is obtained, the proportion of $H_3^+$ can be up to 50% or higher (under the aforementioned conditions, about 80%). This is thought to result from the pressure and electric field inside a chamber, which is clearly shown in the above consideration.

($H_3^+$ Irradiation Mechanism)

When a plasma that contains a plurality of ion species as shown in FIG. 28 is generated and a single crystal semiconductor substrate is irradiated with the generated ion species without any mass separation being performed, the surface of the single crystal semiconductor substrate is irradiated with each of $H^+$, $H_2^+$, and $H_3^+$ ions. In order to reproduce the mechanism, from the irradiation with ions to the formation of an ion-introduced region, the following five types of models are considered.

Model 1, where the ion species used for irradiation is $H^+$, which is still $H^+$ (H) after the irradiation.

Model 2, where the ion species used for irradiation is $H_2^+$, which is still $H_2^+$($H_2$) after the irradiation.

Model 3, where the ion species used for irradiation is $H_2^+$, which splits into two H atoms ($H^+$ ions) after the irradiation.

Model 4, where the ion species used for irradiation is $H_3^+$, which is still $H_3^+$ ($H_3$) after the irradiation.

Model 5, where the ion species used for irradiation is $H_3^+$, which splits into three H atoms ($H^+$ ions) after the irradiation.

(Comparison of Simulation Results with Measured Values)

Based on the above models, the irradiation of a Si substrate with hydrogen ion species was simulated. As simulation software, SRIM, the Stopping and Range of Ions in Matter (an improved version of TRIM, the Transport of Ions in Matter, which is simulation software for ion introduction processes by a Monte Carlo method) was used. Note that for the calculation, a calculation based on Model 2 was performed with the $H_2^+$ replaced by $H^+$ that has twice the mass. In addition, a calculation based on Model 4 was performed with the $H_3^+$ replaced by $H^+$ that has three times the mass. Furthermore, a calculation based on Model 3 was performed with the $H_2^+$ replaced by $H^+$ that has half the kinetic energy, and a calculation based on Model 5, with the $H_3^+$ replaced by $H^+$ that has one-third the kinetic energy.

Note that SRIM is software intended for amorphous structures, but SRIM can be applied to cases where irradiation with the hydrogen ion species is performed with high energy at a high dose. This is because the crystal structure of a Si substrate changes into a non-single-crystal structure due to the collision of the hydrogen ion species with Si atoms.

Figure 30:
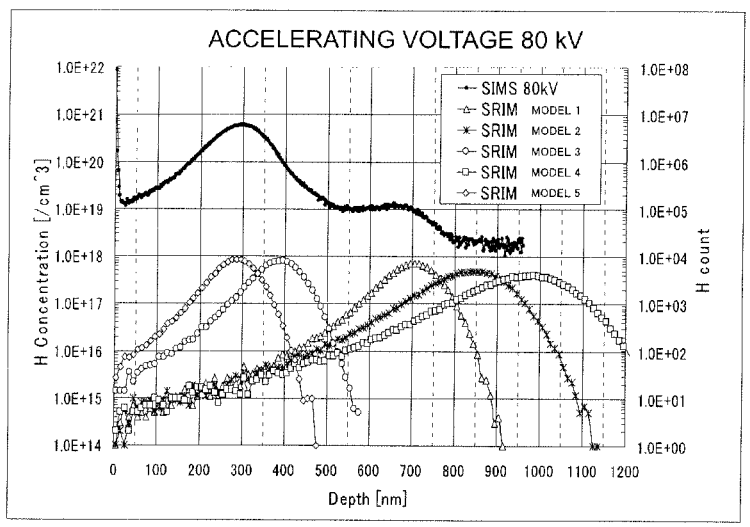
FIG. 30 is a diagram showing the profile (measured values and calculated values) of hydrogen in the depth direction when the accelerating voltage is 80 kV.

FIG. 30 shows the calculation results obtained when irradiation with the hydrogen ion species (irradiation with 100,000 atoms for H) is performed using Models 1 to 5. FIG. 30 also shows the hydrogen concentration (secondary ion mass spectrometry (SIMS) data) in a Si substrate irradiated with the hydrogen ion species of FIG. 28. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of a Si substrate. If the SIMS data, which is measured values, is compared to the calculation results, Models 2 and 4 obviously do not match the peaks of the SIMS data and a peak corresponding to Model 3 cannot be observed in the SIMS data. This shows that the contribution of each of Models 2 to 4 is relatively small. Considering that the kinetic energy of ions is about kiloelectron volts whereas the H—H bond energy is only about several electron volts, it is thought that the contribution of each of Models 2 and 4 is small because $H_2^+$ and $H_3^+$ mostly split into $H^+$ or H by colliding with Si atoms.

Figure 31:
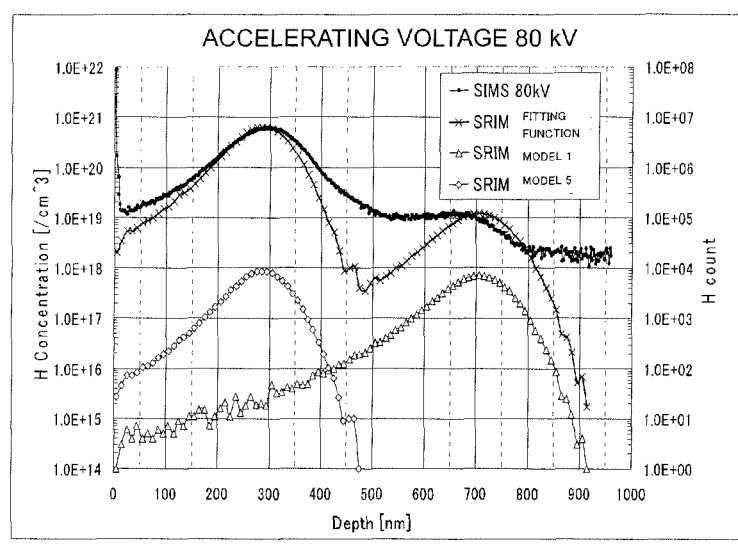
FIG. 31 is a diagram showing the profile (measured values, calculated values, and fitting functions) of hydrogen in the depth direction when the accelerating voltage is 80 kV.
Figure 32:
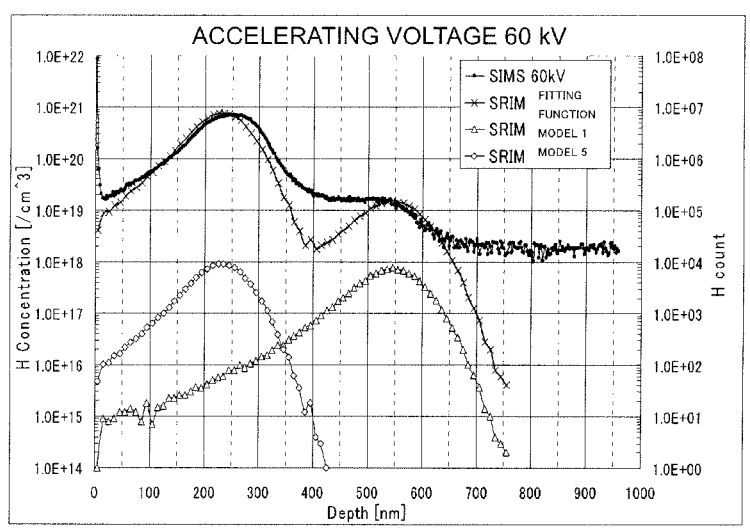
FIG. 32 is a diagram showing the profile (measured values, calculated values, and fitting functions) of hydrogen in the depth direction when the accelerating voltage is 60 kV.
Figure 33:
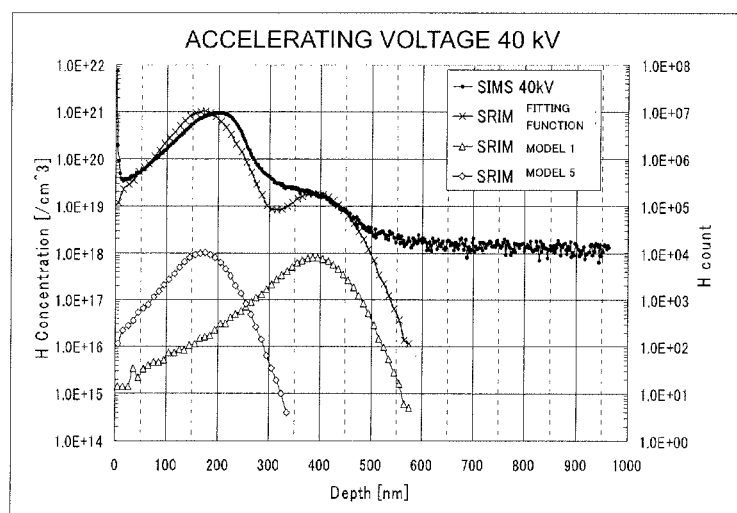
FIG. 33 is a diagram showing the profile (measured values, calculated values, and fitting functions) of hydrogen in the depth direction when the accelerating voltage is 40 kV.

Accordingly, Models 2 to 4 will not be considered hereinafter. FIGS. 31 to 33 each show the calculation results obtained when irradiation with the hydrogen ion species (irradiation with 100,000 atoms for H) is performed using Models 1 and 5. FIGS. 31 to 33 also each show the hydrogen concentration (SIMS data) in a Si substrate irradiated with the hydrogen ion species of FIG. 28, and the simulation results fitted to the SIMS data (hereinafter referred to as a fitting function). Here, FIG. 31 shows the case where the accelerating voltage is 80 kV; FIG. 32, the case where the accelerating voltage is 60 kV; and FIG. 33, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a Si substrate.

The fitting function is obtained using the calculation formula given below, in consideration of Models 1 and 5. Note that in the calculation formula, X and Y represent fitting parameters and V represents volume.

(Fitting Function)=$X/V \times$(Data of Model 1)+$Y/V \times$(Data of Model 5)

In consideration of the ratio between ion species used for actual irradiation ($H^+$: $H_2^+$: $H_3^+$ is about 1:1:8), the contribution of $H_2^+$ (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous Si and the influence due to crystallinity is not considered.

FIG. 34 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is approximately greater than or equal to 42 and less than or equal to 45), and the ratio of the number of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is approximately greater than or equal to 14 and less than or equal to 15). Considering that Model 3 is not considered and the calculation assumes amorphous Si, it can be said that values close to that of the ratio between ion species used for actual irradiation ($H^+$: $H_2^+$: $H_3^+$ is about 1:1:8) is obtained.

(Effects of Use of $H_3^+$)

A plurality of benefits resulting from $H_3^+$ can be enjoyed by irradiation of a substrate with hydrogen ion species with a higher proportion of $H_3^+$ as shown in FIG. 28. For example, because $H_3^+$ splits into $H^+$, H, or the like to be introduced into a substrate, ion introduction efficiency can be improved as compared to the case of irradiation mainly with $H^+$ or $H_2^+$. This leads to an improvement in semiconductor substrate production efficiency. In addition, because the kinetic energy of $H^+$ or H after $H_3^+$ splits similarly tends to be low, $H_3^+$ is suitable for manufacture of thin semiconductor layers.

Note that in this specification, a method is described in which an ion doping apparatus that is capable of irradiation with the hydrogen ion species as shown in FIG. 28 is used in order to efficiently perform irradiation with $H_3^+$. Ion doping apparatuses are inexpensive and excellent for use in large-area treatment. Therefore, by irradiation with $H_3^+$ by use of such an ion doping apparatus, significant effects such as an improvement in semiconductor characteristics, an increase in area, a reduction in costs, and an improvement in production efficiency can be obtained. On the other hand, if first priority is given to irradiation with $H_3^+$, there is no need to interpret the present invention as being limited to the use of an ion irradiation apparatus.

After the damaged region 113 is formed, the protective film 112 is removed by etching. Then, a bonding layer 114 is formed on the top surface of the semiconductor substrate 111 (see FIG. 1F). The bonding layer 114 may be formed over the protective film 112 without removing the protective film 112.

The bonding layer 114 is a layer having a smooth, hydrophilic surface. As the bonding layer 114, an insulating film formed by chemical reaction, in particular, a silicon oxide film is preferably used. The thickness of the bonding layer 114 can be greater than or equal to 10 nm and less than or equal to 200 nm. The preferable thickness is greater than or equal to 10 nm and less than or equal to 100 nm, and the more preferable thickness is greater than or equal to 20 nm and less than or equal to 50 nm. Note that it is necessary that the heat temperature of the semiconductor substrate 111 be a temperature at which an element or a molecule which exists in the damaged region 113 is not released in the step for forming the bonding layer 114. Specifically, the heat temperature is preferably less than or equal to 400° C.

When a silicon oxide film of the bonding layer 114 is formed by a plasma CVD method, an organosilane gas is preferably used as a silicon source gas. An oxygen ($O_2$) gas can be used as an oxygen source gas. As the organosilane gas, any of the following can be used: ethyl silicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); trisdimethylaminosilane (chemical formula: $SiH(N(CH_3)_2)_3$); and the like. Further, as the silicon source gas, instead of the organosilane gas, silane ($SiH_4$), disilane ($Si_2H_6$), or the like can be used.

The silicon oxide film can also be formed by a thermal CVD method instead of a plasma CVD method. In this case, silane ($SiH_4$), disilane ($Si_2H_6$), or the like can be used as the silicon source gas, and an oxygen ($O_2$) gas, a dinitrogen monoxide ($N_2O$) gas, or the like can be used as the oxygen source gas. It is preferable that the heat temperature be greater than or equal to 200° C. and less than or equal to 500° C. Note that the bonding layer 114 is often formed using an insulating material. In this sense, the bonding layer 114 can be included in the category of an insulating layer.

Next, the base substrate 101 and the semiconductor substrate 111 are attached to each other (see FIG. 1G). First, the base substrate 101 provided with the insulating layer 102 and the semiconductor substrate 111 provided with the bonding layer 114 are cleaned by ultrasonic cleaning or the like; and next, the insulating layer 102 and the bonding layer 114 are disposed in close contact with each other, so that the insulating layer 102 and the bonding layer 114 are bonded to each other. Note that as a bonding mechanism, a mechanism relating to van der Waals force, a mechanism relating to hydrogen bonding, or the like is conceivable.

As described above, when a silicon oxide film formed by a plasma CVD method using organosilane, a silicon oxide film formed by a thermal CVD method, or the like is used as the bonding layer 114, the insulating layer 102 and the bonding layer 114 can be bonded to each other at room temperature. Therefore, a substrate having low heat resistance such as a glass substrate can be used as the base substrate 101.

Note that although not described in this embodiment mode, the formation of the insulating layer 102 can be omitted. In this case, the bonding layer 114 is bonded to the base substrate 101. In the case where the base substrate 101 is a glass substrate, the glass substrate and the bonding layer 114 can be bonded to each other at room temperature by forming the bonding layer 114 of a silicon oxide film formed by a CVD method using organosilane, a silicon oxide film formed by a thermal CVD method, a silicon oxide film formed using siloxane as a source material, or the like.

In order to further increase the bonding force, there is a method in which oxygen plasma treatment or ozone treatment is performed on the surface of the insulating layer 102 to make the surface hydrophilic, for example. By this treatment, a hydroxyl is added to the surface of the insulating layer 102, so that a hydrogen bond can be formed at a bonding interface between the insulating layer 102 and the bonding layer 114. Note that in the case where the insulating layer 102 is not formed, treatment for making the surface of the base substrate 101 hydrophilic may be performed.

It is preferable that, after the base substrate 101 and the semiconductor substrate 111 are disposed in close contact with each other, heat treatment or pressure treatment be performed. This is because the bonding force between the insulating layer 102 and the bonding layer 114 can be improved by performing heat treatment or pressure treatment. It is preferable that the temperature of the heat treatment be less than or equal to an allowable temperature limit of the base substrate 101, and the heat temperature may be greater than or equal to 400° C. and less than or equal to the allowable temperature limit. For example, when a glass substrate is used as the base substrate 101, the strain point may be considered as the allowable temperature limit. The pressure treatment is performed so that force is applied in a direction perpendicular to the bonding interface, and the pressure to be applied is determined in consideration of strength of the base substrate 101 and the semiconductor substrate 111.

Next, the semiconductor substrate 111 is separated into a semiconductor substrate 111' and a semiconductor layer 115 (see FIG. 1H). The separation of the semiconductor substrate 111 is performed by heating the semiconductor substrate 111 after the base substrate 101 and the semiconductor substrate 111 are attached to each other. The heat temperature of the semiconductor substrate 111 can be, for example, greater than or equal to 400° C. (less than or equal to 700° C.), which depends on the allowable temperature limit of the base substrate.

By performing the heat treatment at a temperature in the range of greater than or equal to 400° C. as described above, a volume change of microvoids formed in the damaged region 113 occurs to generate a crack in the damaged region 113. As a result of this, the semiconductor substrate 111 is separated along the damaged region 113. Since the bonding layer 114 is bonded to the base substrate 101, the semiconductor layer 115 separated from the semiconductor substrate 111 remains over the base substrate 101. Further, since the bonding interface between the base substrate 101 and the bonding layer 114 is heated by this heat treatment, a covalent bond is formed at the bonding interface so that the bonding force at the bonding interface is improved.

Through the steps described above, an SOI substrate 131 in which the semiconductor layer 115 is provided for the base substrate 101 is manufactured. The SOI substrate 131 is a substrate with a multilayer structure, in which the insulating layer 102, the bonding layer 114, and the semiconductor layer 115 are stacked in this order over the base substrate 101, and a bond is formed at the interface between the insulating layer 102 and the bonding layer 114. Note that a bond is formed at an interface between the base substrate 101 and the bonding layer 114 in the case where the insulating layer 102 is not formed.

Further, heat treatment at a temperature which is greater than or equal to 400° C. can also be performed after the semiconductor substrate 111 is separated and the SOI substrate 131 is formed. By this heat treatment, bonding force between the bonding layer 114 and the insulating layer 102 in the SOI substrate 131 can be further improved. It is needless to say that the upper limit of the heat temperature is set so as not to exceed the allowable temperature limit of the base substrate 101.

Defects due to the separation step or the ion irradiation step exist in the surface of the semiconductor layer 115, and planarity of the surface is lost. It is difficult to form a thin gate insulating layer having high withstand voltage on such a surface having roughness of the semiconductor layer 115. Therefore, planarization treatment is performed on the semiconductor layer 115. Further, when defects exist in the semiconductor layer 115, treatment for reducing the defects in the semiconductor layer 115 is performed because the defects in the semiconductor layer 115 have an adverse effect on the performance and reliability of a transistor, such as increase of the localized state density at the interface between the semiconductor layer 115 and a gate insulating layer.

In the present invention, planarization and reduction in defects of the semiconductor layer 115 are realized by irradiation of the semiconductor layer 115 with a laser beam 122 (see FIG. 2A). By irradiation with the laser beam 122 from the top surface side of the semiconductor layer 115, the top surface of the semiconductor layer 115 is melted. The semiconductor layer 115 is cooled and becomes solidified after the melting, whereby a semiconductor layer 115A in which the planarity of the top surface is improved can be obtained (see FIG. 2B). Since the laser beam 122 is used in the planarization treatment, the base substrate does not need to be heated so that temperature rise of the base substrate 101 can be suppressed. Therefore, a substrate having low heat resistance such as a glass substrate can be used as the base substrate 101. In addition, sufficient planarity can be ensured without performing polishing treatment. It is needless to say that the base substrate may be heated within the range of the allowable temperature limit thereof. Even when a laser beam having relatively low energy density is used, reduction in defects can be effectively promoted by heating the base substrate.

Note that it is necessary that the semiconductor layer 115 be partially melted by the irradiation with the laser beam 122. This is because, if the semiconductor layer 115 is completely melted, the semiconductor layer 115 is recrystallized (microcrystallized) due to disordered nucleation in the semiconductor layer 115 in a liquid phase so that crystallinity of the semiconductor layer 115A is lowered. By partial melting, crystal growth proceeds from a solid-phase part of the semiconductor layer 115, which is not melted. Accordingly, the defects of the semiconductor layer 115 can be reduced. Note that complete melting means that the semiconductor layer 115 is melted to the interface between the semiconductor layer 115 and the bonding layer 114 and becomes a liquid state. On the other hand, partial melting means that the upper layer is melted and becomes a liquid phase but the lower layer is not melted and remains in a solid phase.

For the laser irradiation, a pulsed laser is preferably used. This is because a pulsed laser beam having high energy can be emitted instantaneously and a partially melting state can be formed easily. The repetition rate is, preferably, approximately greater than or equal to 1 Hz and less than or equal to 10 MHz and, more preferably, greater than or equal to 10 Hz and less than or equal to 1 MHz. As the pulsed laser described above, the following can be used: an Ar laser, a Kr laser, an excimer (ArF, KrF, XeCl, or the like) laser, a $CO_2$ laser, a YAG laser, a $YVO_4$ laser, a YLF laser, a $YAlO_3$ laser, a $GdVO_4$ laser, a $Y_2O_3$ laser, a ruby laser, an Alexandrite laser, a Ti:sapphire laser, a copper vapor laser, a gold vapor laser, or the like. Note that although it is preferable that a pulsed laser beam be used for partial melting, the present invention is not limited thereto.

It is necessary that the wavelength of the laser beam 122 be set to a wavelength which can be absorbed by the semiconductor layer 115. The wavelength may be determined in consideration of the skin depth of the laser beam and the like. For example, the wavelength can be set in the range of greater than or equal to 250 nm and less than or equal to 700 nm. Further, the energy density of the laser beam 122 can be determined in consideration of the wavelength of the laser beam 122, the skin depth of the laser beam, the thickness of the semiconductor layer 115, or the like. For example, the energy density of the laser beam 122 may be set in the range of greater than or equal to 300 mj/$cm^2$ and less than or equal to 800 mJ/$cm^2$. In this embodiment mode, the case of using a XeCl excimer laser (wavelength: 308 nm) as a pulsed laser is to be described.

Note that when the thickness of the semiconductor layer 115 is increased to be greater than 50 nm by controlling the depth of ions that are introduced in the ion irradiation step, control of the energy density of the laser beam 122 becomes easy. Accordingly, improvement in surface planarity and crystallinity of the semiconductor layer 115 by irradiation with the laser beam 122 can be realized with high yield. Note that since it is necessary to make the energy density of the laser beam 122 high as the thickness of the semiconductor layer 115 is increased, the thickness of the semiconductor layer 115 is preferably less than or equal to 200 nm.

The irradiation with the laser beam 122 can be performed in an atmosphere containing oxygen such as an air atmosphere or an inert atmosphere such as a nitrogen atmosphere. In order to perform irradiation with the laser beam 122 in an inert atmosphere, the irradiation with the laser beam 122 may be performed in an airtight chamber, and the atmosphere in the chamber may be controlled. In the case where the chamber is not used, a nitrogen atmosphere can be formed by blowing an inert gas such as a nitrogen gas to the surface which is irradiated with the laser beam 122.

Note that the inert atmosphere such as nitrogen has higher effect of improving planarity of the semiconductor layer 115 than the air atmosphere. In addition, the inert atmosphere has higher effect of suppressing generation of cracks and ridges than the air atmosphere, and the laser beam 122 can be used in a wide energy range. Note that the irradiation with the laser beam 122 may be performed in vacuum. When the irradiation with the laser beam 122 is performed in vacuum, the same effect as the irradiation in the inert atmosphere can be obtained.

Figure 3A:
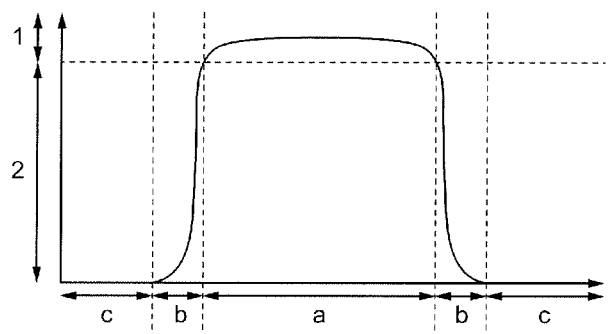
FIG. 3A is a view showing the state of a laser beam.
Figure 3B:
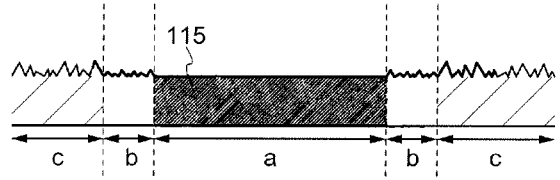
FIGS. 3B and 3C are respectively a cross-sectional view and a plan view of the state of a semiconductor layer in a region which is irradiated with the laser beam.
Figure 3C:
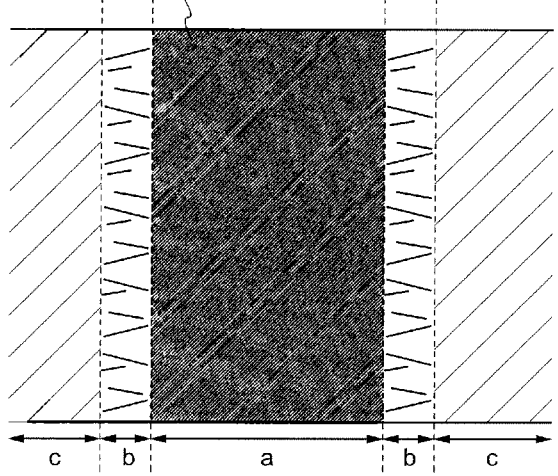

Here, FIGS. 3A to 3C show a profile of the laser beam 122 and a state of the semiconductor layer 115 in the case where the semiconductor layer 115 is irradiated with the laser beam 122 using a pulsed laser. In this embodiment mode, the shape of the laser beam is linear in order to improve productivity. It is needless to say that the present invention is not limited to a linear laser beam. FIG. 3A shows a beam profile in a direction perpendicular to a longitudinal direction of the linear pulsed laser beam. Since a beam profile in a direction parallel to the longitudinal direction is similar to the beam profile in FIG. 3A, the details are to be omitted. In FIG. 3A, the vertical axis indicates energy density (light intensity) of the laser beam, and the horizontal axis indicates a coordinate. FIG. 3B is a cross-sectional view of the semiconductor layer 115 irradiated with the laser beam having the beam profile shown in FIG. 3A, and FIG. 3C is a plan view thereof.

In FIG. 3A, the semiconductor layer 115 is melted (partially melted) in a region a where the energy density of the laser beam 122 with which the semiconductor layer 115 is irradiated is almost constant, and planarization thereof is promoted by the surface tension of the semiconductor. At the same time, cooling of the semiconductor layer 115 is promoted by diffusion of heat into the glass substrate, a temperature gradient is generated in the semiconductor layer 115 in a depth direction, and a solid-liquid interface moves in the surface direction from the vicinity of the lower interface and is recrystallized. Since the semiconductor layer 115 is partially melted in this case, a region which is not melted is left in the vicinity of the lower interface; therefore, it is considered that the recrystallization is promoted with the region serving as a nucleus.

In the region a described above, the planarity is extremely high and the defect density is reduced sufficiently. Therefore, a semiconductor element having extremely favorable characteristics can be realized by using the region a as an active layer of the semiconductor element (e.g., a channel formation region of a transistor).

On the other hand, in a region b where the energy density of the laser beam 122 with which the semiconductor layer 115 is irradiated is rapidly changed (may also referred to as a region irradiated with the edge portion of the laser beam), due to the sharp fluctuation of energy density in a direction parallel to the irradiation surface (hereinafter a lateral direction), so-called lateral growth that a solid-liquid interface moves in a lateral direction occurs. The lateral growth is accompanied by movement of the volume in the lateral direction by the movement of the solid-liquid interface; therefore, the problem arises that the surface unevenness of the semiconductor layer 115 is increased (see FIGS. 3B and 3C). Note that a region c is a region which is not irradiated with the laser beam 122, and the surface unevenness of the region c is increased much more than that of the region b.

Thus, in the present invention, only the region a described above is used as the active layer of a semiconductor element and the region b (and the region c) is (are) not used as the active layer. Accordingly, since a semiconductor device can be manufactured using only a semiconductor element having favorable characteristics, performance of the semiconductor device can be greatly improved. Note that a manufacturing process of the semiconductor device will be subsequently described in detail.

Here, defects are not sufficiently reduced in a situation where the energy density of the laser beam is less than 85% of a boundary value between the complete melting and the partial melting (in other words, a maximum value of the partial melting). Further, in the case of the profile shown in FIG. 3A, in a region where the energy density of the laser beam is less than 85% of the maximum value thereof (region 2), the fluctuation is sharp as compared to a region where the energy density is greater than or equal to 85% of the maximum value thereof (region 1). If it is considered that the upper limit of the energy density of the laser beam is an energy density with which the semiconductor layer is not melted completely, the regions a, b, and c described above can be defined as follows with the use of the energy density of the laser beam with which the semiconductor layer is irradiated:

region a: less than the energy density with which the semiconductor layer is completely melted (or microcrystallized) and greater than or equal to 85% of the energy density which serves as a boundary between the complete melting and the partial melting region b: less than 85% of the energy density which serves as a boundary between the complete melting and the partial melting (greater than or equal to 1%)

region c: less than 1% of the energy density which serves as a boundary between the complete melting and the partial melting (substantial zero)

In addition, as for the regions a, b, and c described above, surface planarity was evaluated with average surface roughness and root mean square of surface roughness. Each region is defined as follows if the average surface roughness and the root mean square of surface roughness are used as parameters of planarity:

region a: the average surface roughness is less than 1.5 nm, and the root mean square of surface roughness is less than 2 nm region b: the average surface roughness (less than 7 nm) is greater than or equal to 1.5 nm, and the root mean square of surface roughness (less than 10 nm) is greater than or equal to 2 nm region c: the average surface roughness is greater than or equal to 7 nm, and the root mean square of surface roughness is greater than or equal to 10 nm The surface roughness described above was analyzed with an atomic force microscope (AFM). Here, the average surface roughness ($R_a$) means an average surface roughness obtained by three-dimensionally expanding a centerline average roughness $R_a$ that is defined by JISB0601:2001 (ISO4287: 1997) so as to be able to apply the $R_a$ to a measurement surface. In the JISB0601:2001 described above, $R_a$ is defined as a centerline average roughness $R_a$; however, $R_a$ means only average roughness in this specification. In this case, the average roughness is expressed by an average value from absolute values of deviations between a reference surface and a specific surface, and is obtained from the following equation.

$$R_a = \frac{1}{S_0}\int_{Y_1}^{Y_2}\int_{X_1}^{X_2} |f(X,Y) - Z_0| \, dX \, dY \quad \text{[Equation 1]}$$

The measurement surface is a surface which is shown by the all measurement data, and is calculated by the following equation. In this case, the measurement data consists of three parameters (X, Y, and Z), and the range of X (and Y) is from 0 to $X_{max}$ (and $Y_{max}$), and the range of Z is from $Z_{min}$ to $Z_{max}$.

$$Z = f(X,Y) \quad \text{[Equation 2]}$$

The specific surface is a surface which is an object of roughness measurement, and is a rectangular region within four points represented by the coordinates $(X_1, Y_1)$, $(X_1, Y_2)$, $(X_2, Y_1)$, and $(X_2, Y_2)$. The area of the specific surface is referred to as $S_0$ when the specific surface is flat ideally. Note that $S_0$ is calculated from the following equation.

$$S_0 = (X_2 - X_1) \cdot (Y_2 - Y_1) \quad \text{[Equation 3]}$$

The reference surface is a plane surface represented by $Z = Z_0$ when the mean value of the height of the specific surface is referred to as $Z_0$. The reference surface is parallel to the XY plane. Note that $Z_0$ is calculated from the following equation.

$$Z_0 = \frac{1}{S_0}\int_{Y_1}^{Y_2}\int_{X_1}^{X_2} f(X,Y) \, dX \, dY \quad \text{[Equation 4]}$$

The root mean square of surface roughness ($R_{ms}$) means the root mean square obtained by three-dimensionally expanding the $R_{ms}$ of a cross-sectional curve so as to be able to be applied to the measurement surface. The $R_{ms}$ is the square root of the mean value of the square of the deviation from the reference surface to the specific surface, and is obtained from the following equation.

$$R_{ms} = \sqrt{\frac{1}{S_0}\int_{Y_1}^{Y_2}\int_{X_1}^{X_2} \{f(X,Y) - Z_0\}^2 \, dX \, dY} \quad \text{[Equation 5]}$$

Note that in this embodiment mode, the largest difference in height between peak and valley (P–V) is not used as an evaluation parameter, but it may be used as an evaluation parameter. The largest difference in height between peak and valley (P–V) is a difference between the height of the highest peak $Z_{max}$ and the height of the lowest valley $Z_{min}$ in the specific surface, and is obtained from the following equation.

$$P-V = Z_{max} - Z_{min} \quad \text{[Equation 6]}$$

In the largest difference in height between peak and valley (P–V), the peak and the valley mean the peak and the valley obtained by three-dimensionally expanding the peak and the valley defined by JISB0601:2001(ISO4287:1997). The peak is the highest place of the peaks in the specific surface, while the valley is the lowest place of the peaks in the specific surface.

Measurement conditions of the average surface roughness, the root mean square of surface roughness, and the largest difference in height between peak and valley P–V are described below:
  atomic force microscope (AFM): a scanning probe microscope SPI3800N/SPA500 manufactured by Seiko Instruments Inc.
  measurement mode: dynamic force mode (DFM)
  cantilever: SI-DF40 (made of silicon, a spring constant greater than or equal to 40 N/m and less than or equal to 45 N/m, a resonant frequency greater than or equal to 250 kHz and less than or equal to 390 kHz, and a probe tip of R≦10 nm)
  scan rate: 1.0 Hz
  measured points: 256 points×256 points Note that DFM refers to a measurement mode in which the shape of a surface of a sample is measured in a state where a cantilever is resonated at a given frequency (a frequency specific to the cantilever), the cantilever intermittently contacts with a sample coming closely, and a mode of a surface is shown by the vibration amplitude of the cantilever. In DFM, the surface of the sample and the cantilever are not in contact with each other; thus, the measurement can be preformed without damaging the surface of the sample.

Note that in the evaluation of planarity in this embodiment mode, the measurement area is less than or equal to 20 μm×20 μm, preferably greater than or equal to 5 μm×5 μm and less than or equal to 10 μm×10 μm. It is to be noted that accurate evaluation cannot be made if the measurement area is too small or too large.

Further, as for the regions a, b, and c described above, a peak wavenumber (cm$^{-1}$) in the Raman spectrum was evaluated. Each region can be defined as follows if the peak wavenumber is used as a parameter. Note that a peak wavenumber in the Raman spectrum of bulk single crystal silicon is typically 520.6 cm$^{-1}$.
  region a: a peak wavenumber is greater than or equal to 520.4 cm$^{-1}$ (less than or equal to 520.6 cm$^{-1}$)
  region b: a peak wavenumber is greater than or equal to 519.0 cm$^{-1}$ and less than 520.4 cm$^{-1}$
  region c: a peak wavenumber is less than 519.0 cm$^{-1}$ Note that the condition which is used for the Raman scattering described above is as follows:
  Raman apparatus: U1000 (manufactured by HORIBA, Ltd.)
  excitation wavelength: 532 nm (a second harmonic of a Nd:YAG laser)
  measurement area: approximately 1 μmΦ

As described above, each region of the semiconductor layer can be evaluated from various perspectives. It is found that the semiconductor layer in the region which is irradiated with the laser beam, particularly the region a, has extremely favorable characteristics.

In this embodiment mode, the laser irradiation is performed, moving the base substrate 101 or the laser beam 122. Accordingly, the laser beam is scanned with respect to the semiconductor layer 115, so that the laser irradiation can be performed over the entire surface of the semiconductor layer 115. For example, when the linear laser beam 122 is used, the semiconductor layer 115 may be irradiated with the laser beam by moving the base substrate 101 or the laser beam 122 in a direction perpendicular to the longitudinal direction of the laser beam.

Note that when the shape of the laser beam 122 is linear, the laser beam 122 is preferably shaped so that a length thereof in a direction parallel to the longitudinal direction of the laser beam 122 gets longer than one side of the semiconductor layer 115. This is because the entire surface of the semiconductor layer 115 can be irradiated with the laser beam 122 by scanning once, and efficient laser irradiation can be realized. The length of the laser beam 122 in a direction perpendicular to the longitudinal direction can be changed as appropriate depending on the size of a semiconductor element to be manufactured, an output of a laser apparatus which is used, or the like.

In the present invention, improvement in planarity of a semiconductor layer and reduction in defects can be realized by irradiation with one laser beam pulse. This is because favorable characteristics can be obtained in the region a of the semiconductor layer regardless of the irradiation time of the pulsed laser beam. Accordingly, a semiconductor element and a semiconductor device having excellent characteristics can be manufactured without irradiating the same region with the pulsed laser beam a plurality of times. In other words, as compared to a case where irradiation with a laser beam of a number of pulses is needed, manufacturing efficiency of the semiconductor element and the semiconductor device can be improved. It is needless to say that further improvement in planarity and further reduction in defects may be achieved by irradiating the same region with a laser beam of a number of pulses.

Note that in performing the irradiation with the pulsed laser beam, the irradiation with the laser beam may be performed so that part of the regions irradiated with the laser beam overlap. The area of the region b ($S_b$) with respect to the area of the region a ($S_a$) can be made small by overlapping the irradiated regions; therefore, the semiconductor layer 115 can be used effectively. At this time, the overlapping degree (an overlap ratio) can be expressed by $100 \times S_{OL}/(S_a+S_b)$ using an area ($S_a+S_b$) irradiated with one laser beam pulse and an area ($S_{OL}$) of a region which overlaps with the region irradiated with a successive one laser beam pulse.

When the length of the laser beam 122 in a direction parallel to the longitudinal direction thereof is longer than one side of the semiconductor layer 115, the region b is divided into two regions with the region a interposed therebetween, after irradiation with one laser beam pulse (corresponding to the state of FIG. 3C). In order to minimize the area of the region b ($S_b$) with respect to the area of the region a ($S_a$) in this case, the area of one of the divided regions b ($0.5 \times S_b$) and the area of the overlapped regions ($S_{OL}$) may be made equal. That is, $S_{OL}=0.5 \times S_b$ may be satisfied. Note that it is considered here that the laser beam has a symmetrical shape.

Specifically, the overlap ratio is set to be greater than or equal to 3% and less than or equal to 30%, more preferably greater than or equal to 5% and less than or equal to 20%. The area of the region b can be efficiently reduced by employing such an overlap ratio. Note that the range described above is merely a range which is limited to the case where the region a is efficiently used, and the overlap ratio may be greater than 30% or less than 3% in other objects.

It is needless to say that the present invention can be applied without a problem even when the regions irradiated with the laser beam do not overlap with each other (in other words, when the overlap ratio is zero). For example, semiconductor elements are disposed slightly apart in some cases in a pixel region or the like of a display device (particularly a large-sized display device). In such a case, reduction in productivity is rather induced in some cases by overlapping the regions irradiated with a laser beam. That is, it does not make much sense to perform laser irradiation even on a region where a semiconductor element is not to be formed. It is not necessary to dare to overlap the regions irradiated with a laser beam even in such a case.

As described above, the overlap ratio can be changed as appropriate depending on the object.

Figure 2C:
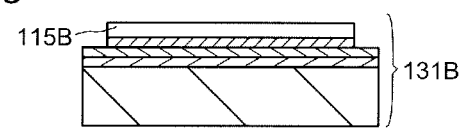

After the irradiation with the laser beam 122 is preformed as described above, a step of reducing and thinning the semiconductor layer 115A may be performed (see FIG. 2C). In order to thin the semiconductor layer 115A, one of dry etching or wet etching or a combination of both the etchings may be performed. For example, in the case where the semiconductor substrate 111 is a silicon substrate, the semiconductor layer 115A can be thinned by dry etching treatment using $SF_6$ and $O_2$ as a process gas. As described above, an SOI substrate 131B having a thin semiconductor layer 115B can be manufactured. It is needless to say that etch-back treatment may be performed instead of the etching treatment.

Note that although the etching treatment or etch-back treatment is performed after planarization or the like is performed on the surface by the laser irradiation in this embodiment mode, the present invention is not limited thereto. For example, etching treatment or etch-back treatment may be performed before the laser irradiation. In this case, roughness or defects of the surface of the semiconductor layer can be reduced to some extent by the etching treatment or etch-back treatment. Alternatively, etching treatment or etch-back treatment may be performed before and after the laser irradiation. Further alternatively, either etching treatment or etch-back treatment and the laser irradiation may be alternately repeated. By using laser irradiation and etching treatment (or etch-back treatment) in combination as described above, roughness, defects, and the like of the surface of the semiconductor layer can be significantly reduced.

In addition, after the irradiation with the laser beam 122 is performed, heat treatment at a temperature less than or equal to an allowable temperature limit of the base substrate 101 may be performed. Accordingly, the effect of the irradiation with the laser beam 122 is promoted, whereby defects can be removed and planarity can be improved with efficiency. It is needless to say that the etching treatment or etch-back treatment, the heat treatment, and the like described above are not always needed.

Through the steps described above, an SOI substrate can be manufactured. Note that in order to achieve increase in the area of an SOI substrate, the plurality of semiconductor layers 115B may be attached to one base substrate 101. For example, the process described with reference to FIGS. 1C to 1F is repeated plural times, and the plurality of semiconductor substrates 111 each provided with the damaged region 113 are prepared. Next, the attachment step of FIG. 1G is repeated plural times to fix the plurality of semiconductor substrates 111 to one base substrate 101. Then, the heating step of FIG. 1H is performed to separate each of the semiconductor substrates 111 to manufacture the SOI substrate 131 in which the plurality of semiconductor layers 115 are fixed to the base substrate 101. Then, through the steps of FIGS. 2A to 2C, the SOI substrate 131B in which the plurality of semiconductor layers 115B are attached to the base substrate 101 can be manufactured. It is needless to say that the plurality of semiconductor substrates 111 may be fixed to the base substrate 101 so that the plurality of semiconductor layers 115 can be formed simultaneously.

Next, with reference to FIGS. 4A to 4D, FIGS. 5A to 5D, and FIGS. 6A and 6B, a method for manufacturing a semiconductor device with the use of the semiconductor substrate described above will be described. Here, a method for manufacturing a semiconductor device including a plurality of transistors is described as an example of the semiconductor device. Note that various semiconductor devices can be formed with the use of transistors described below in combination.

Figure 4A:
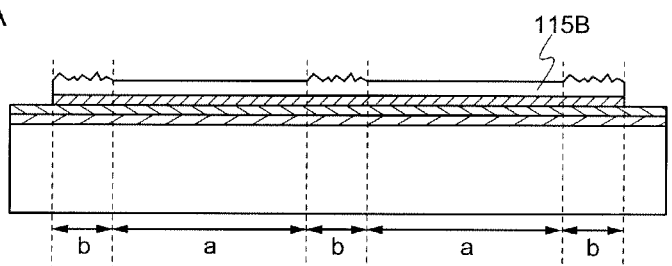
FIGS. 4A to 4D are cross-sectional views illustrating a method for manufacturing a semiconductor device.
Figure 4B:
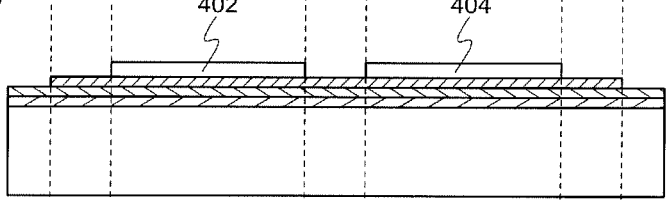

FIG. 4A shows a cross-sectional view of a semiconductor substrate manufactured by the steps described above.

In order to control threshold voltages of TFTs, an impurity element imparting p-type conductivity such as boron, aluminum, or gallium or an impurity element imparting n-type conductivity such as phosphorus or arsenic may be added to the semiconductor layer 115B. A region to which the impurity element is added and the kind of the impurity element to be added can be changed as appropriate. For example, an impurity element imparting p-type conductivity can be added to a formation region of an n-channel TFT, and an impurity element imparting n-type conductivity can be added to a formation region of a p-channel TFT. When the impurity elements described above are added, the dose may be approximately greater than or equal to $1\times10^{15}/cm^2$ and less than or equal to $1\times10^{17}/cm^2$.

The regions a and the regions b exist in the semiconductor layer 115B irradiated with the laser beam. Since it is not preferable to use the region b as a channel formation region or the like of a transistor, here, the regions b are removed and only the regions a are used to manufacture a transistor. However, the regions b can be used for a portion where the characteristics of the semiconductor layer are not so important like a source region and a drain region of a transistor, for example. Although there is no region c in FIGS. 4A to 4D, utilization efficiency of the semiconductor layer 115B can be improved by thus irradiating the semiconductor layer with the laser beam so that there is no region which is not irradiated with the laser beam. In addition, the semiconductor layer 115B can be utilized more effectively by irradiating the semiconductor layer with the laser beam so that the regions b overlap. On the other hand, it is to be noted that when a portion where the regions irradiated with the laser beams overlap is made too large, the area of the region a is reduced and thus the semiconductor layer 115B cannot be effectively utilized.

The regions b can be removed when the semiconductor layer 115B is separated in an island-like shape. Here, at the same time as removing the regions b of the semiconductor layer 115B, the semiconductor layer 115B is separated into island-shapes to form a semiconductor layer 402 and a semiconductor layer 404 (see FIG. 4B).

Figure 4C:
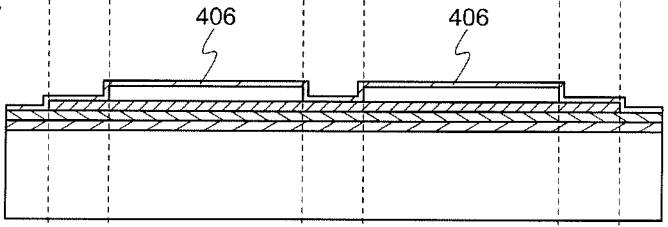

Next, a gate insulating layer 406 is formed so as to cover the semiconductor layers 402 and 404 (see FIG. 4C). Here, a silicon oxide film is formed in a single layer by a plasma CVD method. Alternatively, a film containing silicon oxynitride, silicon nitride oxide, silicon nitride, hafnium oxide, aluminum oxide, tantalum oxide, or the like may be formed with a single-layer structure or a stacked-layer structure as the gate insulating layer 406.

As a manufacturing method other than a plasma CVD method, a sputtering method or a method of oxidizing or nitriding by high density plasma treatment can be given. High-density plasma treatment is performed by using, for example, a mixed gas of a rare gas such as helium, argon, krypton, or xenon and oxygen, nitrogen oxide, ammonia, nitrogen, hydrogen, or the like. In this case, by exciting plasma by introduction of microwaves, plasma with a low electron temperature and high density can be generated. The surfaces of the semiconductor layers are oxidized or nitrided by oxygen radicals (OH radicals may be included) or nitrogen radicals (NH radicals may be included) which are produced by such high-density plasma, whereby an insulating film is formed to a thickness greater than or equal to 1 nm and less than or equal to 20 nm, preferably greater than or equal to 2 nm and less than or equal to 10 nm so as to be in contact with the semiconductor layers.

Since the semiconductor layers obtained by the high-density plasma treatment are oxidized or nitrided by a solid-phase reaction, the interface state density between the gate insulating layer 406 and each of the semiconductor layers 402 and 404 can be drastically decreased. Further, the semiconductor layers are directly oxidized or nitrided by the high-density plasma treatment, whereby variation in the thickness of the insulating films to be formed can be suppressed. Since the semiconductor layers have crystallinity, even when surfaces of the semiconductor layers are oxidized by a solid-phase reaction by using the high-density plasma treatment, nonuniform oxidation in a crystal grain boundary can be suppressed; thus, a gate insulating layer with favorable uniformity and a low interface state density can be formed. When the insulating film thus formed by high-density plasma treatment is used as part or the entire of a gate insulating layer of a transistor, variation in the characteristics of transistors can be suppressed.

A more specific example of the method for manufacturing the gate insulating layer 406 by plasma treatment is described. The surfaces of the semiconductor layers 402 and 404 are oxidized or nitrided in such a manner that nitrous oxide ($N_2O$) is diluted to be greater than or equal to 1 time and less than or equal to 3 times (the flow ratio) with argon (Ar) and a microwave power (2.45 GHz) greater than or equal to 3 kW and less than or equal to 5 kW is applied under a pressure greater than or equal to 10 Pa and less than or equal to 30 Pa. By this treatment, a lower layer of the gate insulating layer 406 with a thickness greater than or equal to 1 nm and less than or equal to 10 nm (preferably greater than or equal to 2 nm and less than or equal to 6 nm) is formed. Further, a silicon oxynitride film is formed as an upper layer of the gate insulating layer 406 by a vapor-phase growth method in such a manner that nitrous oxide ($N_2O$) and silane ($SiH_4$) are introduced and a microwave power (2.45 GHz) greater than or equal to 3 kW and less than or equal to 5 kW is applied under a pressure greater than or equal to 10 Pa and less than or equal to 30 Pa. The gate insulating layer 406 is formed by combining solid phase reaction and reaction by a vapor-phase growth method as described above, whereby the gate insulating layer 406 with a low interface state density and excellent dielectric strength can be formed. Note that the gate insulating layer 406 has a two-layer structure.

Alternatively, the gate insulating layers 406 may be formed by thermally oxidizing the semiconductor layers 402 and 404. In the case of forming the gate insulating layers 406 by such thermal oxidation, a base substrate with relatively high heat resistance is preferably used.

Further alternatively, hydrogen contained in the gate insulating layer 406 may be dispersed in the semiconductor layers 402 and 404 by performing heat treatment at a temperature greater than or equal to 350° C. and less than or equal to 450° C. after the gate insulating layer 406 containing hydrogen is formed. In this case, the gate insulating layer 406 may be formed by depositing silicon nitride or silicon nitride oxide by a plasma CVD method. Further, in this case, a process temperature is set to less than or equal to 350° C. In this manner, hydrogen is supplied to the semiconductor layers 402 and 404, whereby defects in the semiconductor layers 402 and 404, at an interface between the gate insulating layer 406 and the semiconductor layer 402 and at an interface between the gate insulating layer 406 and the semiconductor layer 404 can be effectively reduced.

Figure 4D:
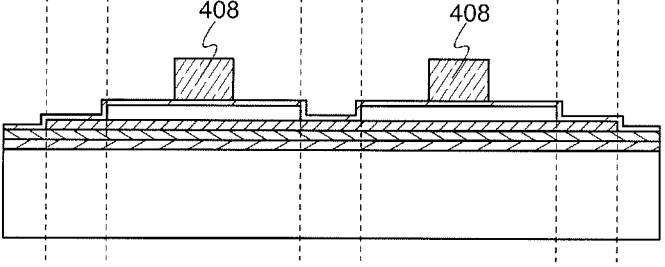

Next, a conductive layer is formed over the gate insulating layer 406, and then the conductive layer is processed (patterned) into a predetermined shape, whereby electrodes 408 are formed over the semiconductor layers 402 and 404 (see FIG. 4D). The conductive layer can be formed by a CVD method, a sputtering method, or the like. The conductive layer can be formed from a material such as tantalum (Ta), tungsten (W), titanium (Ti), molybdenum (Mo), aluminum (Al), copper (Cu), chromium (Cr), or niobium (Nb). Alternatively, an alloy material containing the metal described above as a main component or a compound containing the metal described above can also be used. Further alternatively, a semiconductor material such as polycrystalline silicon, in which a semiconductor film is doped with an impurity element imparting conductivity, may be used.

Although each of the electrodes 408 is formed of a single-layer conductive layer in this embodiment mode, the semiconductor device of the present invention is not limited to the structure. Each of the electrodes 408 may be formed of plural conductive layers which are stacked. In the case of a two-layer structure, for example, a molybdenum film, a titanium film, a titanium nitride film, or the like may be used as a lower layer, and an aluminum film or the like may be used as an upper layer. In the case of a three-layer structure, a stacked-layer structure of a molybdenum film, an aluminum film, and a molybdenum film; a stacked-layer structure of a titanium film, an aluminum film, and a titanium film; or the like may be employed.

Note that as masks used when the electrodes 408 are formed, a material such as silicon oxide or silicon nitride oxide may be used. In this case, a step of forming a mask by patterning a silicon oxide film, a silicon nitride oxide film, or the like is additionally needed; however, the amount of the reduced film thickness of the mask in etching is smaller than the resist material; thus, the electrode 408 with an accurate shape can be formed. Alternatively, the electrodes 408 may be selectively formed by a droplet discharge method without using the masks. Here, a droplet discharge method refers to a method in which droplets containing a predetermined composition are discharged or ejected to form a predetermined pattern, and includes an ink-jet method and the like in its category.

Alternatively, the electrode 408 can be formed by etching the conductive layer to have a desired tapered shape by an inductively coupled plasma (ICP) etching method with appropriate adjustment of the etching conditions (e.g., the amount of electric power applied to a coiled electrode layer, the amount of electric power applied to an electrode layer on the substrate side, the electrode temperature on the substrate side, and the like). The tapered shape can also be adjusted according to the shape of the mask. Note that as an etching gas, a chlorine-based gas such as chlorine ($Cl_2$), boron chloride ($BCl_3$), silicon chloride ($SiCl_4$), or carbon tetrachloride ($CCl_4$); a fluorine-based gas such as carbon tetrafluoride ($CF_4$), sulfur fluoride ($SF_6$), or nitrogen fluoride ($NF_3$); oxygen ($O_2$); or the like can be used as appropriate.

Figure 5A:
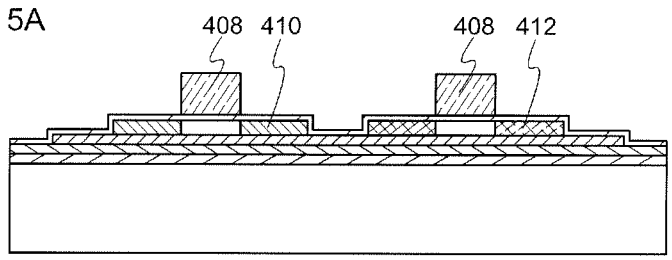
FIGS. 5A to 5D are cross-sectional views illustrating a method for manufacturing a semiconductor device.

Next, as shown in FIG. 5A, an impurity element imparting one conductivity type is added to the semiconductor layers 402 and 404 with the electrodes 408 used as masks. In this embodiment mode, an impurity element imparting n-type conductivity (for example, phosphorus or arsenic) is added to the semiconductor layer 402, and an impurity element imparting p-type conductivity (for example, boron) is added to the semiconductor layer 404. Note that when the impurity element imparting n-type conductivity is added to the semiconductor layer 402, the semiconductor layer 404 to which the impurity element imparting p-type conductivity is added is covered with a mask or the like so that the impurity element imparting n-type conductivity is added selectively. Further, when the impurity element imparting p-type conductivity is added to the semiconductor layer 404, the semiconductor layer 402 to which the impurity element imparting n-type conductivity is added is covered with a mask or the like so that the impurity element imparting p-type conductivity is added selectively. Alternatively, after the impurity element imparting one of p-type and n-type conductivities is added to the semiconductor layers 402 and 404, an impurity element imparting the other conductivity may be added only to one of the semiconductor layers so as to form a higher concentration region. By the addition of the impurity element described above, impurity regions 410 are formed in the semiconductor layer 402 and impurity regions 412 are formed in the semiconductor layer 404.

Figure 5B:
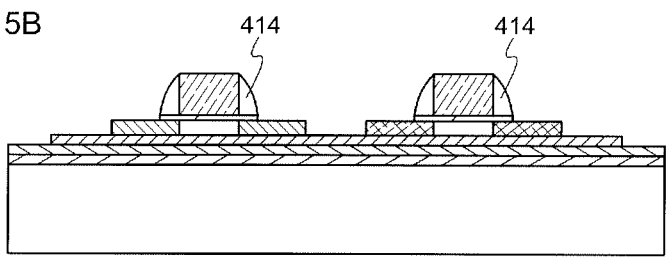

Subsequently, as shown in FIG. 5B, sidewalls 414 are formed on side surfaces of the electrodes 408. The sidewalls 414 can be formed by, for example, newly forming an insulating layer so as to cover the gate insulating layer 406 and the electrodes 408 and by partially etching the newly-formed insulating layer by anisotropic etching mainly in a perpendicular direction. Note that the gate insulating layer 406 may also be etched partially by the anisotropic etching described above. For the insulating layer for forming the sidewalls 414, a film containing silicon, silicon oxide, silicon nitride, silicon oxynitride, silicon nitride oxide, an organic material, or the like may be formed to have a single layer structure or a stacked-layer structure by a plasma CVD method, a sputtering method, or the like. In this embodiment mode, a silicon oxide film having a thickness of 100 nm is formed by a plasma CVD method. In addition, as an etching gas, a mixed gas of $CHF_3$ and helium can be used. Note that the process for forming the sidewalls 414 is not limited to these steps.

Figure 5C:
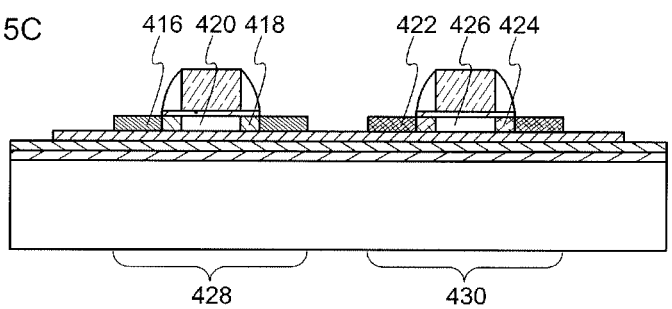

Next, as shown in FIG. 5C, an impurity element imparting one conductivity type is added to the semiconductor layers 402 and 404 with the gate insulating layers 406, the electrodes 408, and the sidewalls 414 used as masks. Note that the impurity element imparting the same conductivity type as the impurity element which has been added to the semiconductor layers 402 and 404 in the previous step are added to the semiconductor layers 402 and 404 at higher concentration than in the previous step. Note that when the impurity element imparting n-type conductivity is added to the semiconductor layer 402, the semiconductor layer 404 to which the p-type impurity element is added is covered with a mask or the like so that the impurity element imparting n-type conductivity is added selectively. Alternatively, when the impurity element imparting p-type conductivity is added to the semiconductor layer 404, the semiconductor layer 402 to which the n-type impurity element is added is covered with a mask or the like so that the impurity element imparting p-type conductivity is added selectively.

By the above-described addition of the impurity element, a pair of high-concentration impurity regions 416, a pair of low-concentration impurity regions 418, and a channel formation region 420 are formed in the semiconductor layer 402. In addition, by the above-described addition of the impurity element, a pair of high-concentration impurity regions 422, a pair of low-concentration impurity regions 424, and a channel formation region 426 are formed in the semiconductor layer 404. The high-concentration impurity region 416 and the high-concentration impurity region 422 each function as a source or a drain, and the low-concentration impurity region 418 and the low-concentration impurity region 424 each function as an LDD (lightly doped drain) region.

Note that the sidewalls 414 formed over the semiconductor layer 402 and the sidewalls 414 formed over the semiconductor layer 404 may be formed so as to have the same width in a direction where carriers move (that is, a direction parallel to a channel length), or may be formed so as to have different widths. The width of each sidewall 414 over the semiconductor layer 404 which constitutes part of a p-channel transistor may be larger than the width of each sidewall 414 over the semiconductor layer 402 which constitutes part of an n-channel transistor. This is because boron which is added for forming a source and a drain in the p-type transistor is easily diffused and a short channel effect is easily induced. By increasing the widths of the sidewalls 414 of the p-channel transistor, boron can be added to the source and the drain at high concentration, whereby the resistance of the source and the drain can be reduced.

A silicide layer in which silicide is formed in part of the semiconductor layers 402 and 404 may be formed in order to further reduce the resistance of the source and the drain. The silicide is formed by placing a metal in contact with the semiconductor layers and causing a reaction between the metal and silicon in the semiconductor layers by heat treatment (e.g., a GRTA method, an LRTA method, or the like). The silicide layer may be formed from cobalt silicide or nickel silicide. In the case where the semiconductor layers 402 and 404 are thin, silicide reaction may proceed to bottoms of the semiconductor layers 402 and 404. As a metal material used for forming silicide, the following can be given: titanium (Ti), nickel (Ni), tungsten (W), molybdenum (Mo), cobalt (Co), zirconium (Zr), hafnium (Hf), tantalum (Ta), vanadium (V), neodymium (Nd), chromium (Cr), platinum (Pt), palladium (Pd), and the like. Further, a silicide layer can also be formed by laser irradiation or the like.

Through the processes described above, an n-channel transistor 428 and a p-channel transistor 430 are formed. Note that although conductive layers each serving as a source electrode or a drain electrode are not formed in a stage shown in FIG. 5C, a structure including these conductive layers each serving as a source electrode or a drain electrode may also be referred to as a transistor.

Figure 5D:
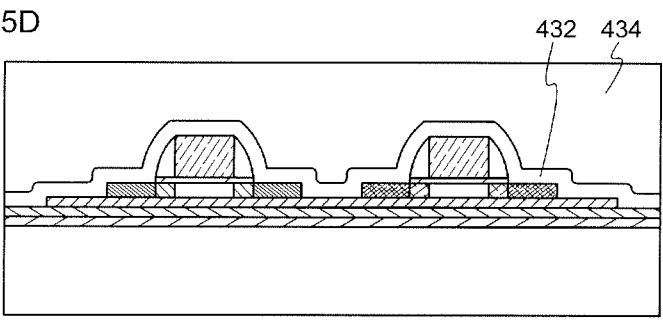

Next, as shown in FIG. 5D, an insulating layer 432 is formed so as to cover the n-channel transistor 428 and the p-channel transistor 430. The insulating layer 432 is not always necessary; however, the formation of the insulating layer 432 can prevent impurities such as an alkali metal and an alkaline earth metal from penetrating the n-channel transistor 428 and the p-channel transistor 430. Specifically, the insulating layer 432 is preferably formed using a material such as silicon oxide, silicon nitride, silicon oxynitride, silicon nitride oxide, aluminum nitride, or aluminum oxide. In this embodiment mode, a silicon nitride oxide film with a thickness of approximately 600 nm is used as the insulating layer 432. In this case, the hydrogenation step described above may be performed after the silicon nitride oxide film is formed. Note that although the insulating layer 432 is formed to have a single-layer structure in this embodiment mode, it is needless to say that the insulating layer 432 may have a stacked-layer structure. For example, in the case of a two-layer structure, the insulating layer 432 can have a stacked-layer structure of a silicon oxynitride film and a silicon nitride oxide film.

Next, an insulating layer 434 is formed over the insulating layer 432 so as to cover the n-channel transistor 428 and the p-channel transistor 430. The insulating layer 434 may be formed from an organic material having heat resistance, such as polyimide, acrylic, benzocyclobutene, polyamide, or epoxy. As an alternative to the organic materials described above, a low-dielectric constant material (a low-k material), a siloxane-based resin, silicon oxide, silicon nitride, silicon oxynitride, silicon nitride oxide, PSG (phosphosilicate glass), BPSG (borophosphosilicate glass), alumina, or the like can also be used. Here, a siloxane-based resin corresponds to a resin including a Si—O—Si bond, which is formed using a siloxane-based material as a starting material. As a substituent, the siloxane-based resin may include at least any one of hydrogen, fluorine, an alkyl group, and aromatic hydrocarbon. Alternatively, the insulating layer 434 may be formed by stacking plural insulating layers formed of any of these materials. The insulating layer 434 may be planarized by a CMP method or the like.

For the formation of the insulating layer 434, the following method can be employed depending on the material of the insulating layer 434: a CVD method, a sputtering method, an SOG method, a spin coating method, a dipping method, a spray application method, a droplet discharge method (e.g., an ink-jet method, screen printing, offset printing, or the like), a doctor knife, a roll coater, a curtain coater, a knife coater, or the like.

Next, contact holes are formed in the insulating layers 432 and 434 so that each of the semiconductor layers 402 and 404 is partially exposed. Then, conductive layers 436 and conductive layers 438 are formed to be in contact with the semiconductor layers 402 and 404, respectively, through the contact holes. The conductive layers 436 and the conductive layers 438 each serve as a source electrode or a drain electrode of the respective transistors. Note that although a mixed gas of $CHF_3$ and He is employed as an etching gas for forming the contact holes, the etching gas is not limited thereto.

The conductive layers 436 and the conductive layers 438 can be formed by a CVD method, a sputtering method, or the like. Specifically, the conductive layers 436 and the conductive layers 438 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Moreover, an alloy containing the metal described above as a main component or a compound containing the metal described above may be used. The conductive layers 436 and the conductive layers 438 may each have a single-layer structure or a stacked-layer structure.

As an example of an alloy containing aluminum as its main component, an alloy containing aluminum as its main component and also containing nickel is given. In addition, an alloy containing aluminum as its main component and also containing nickel and one of or both carbon and silicon can also be given as an example thereof. Since aluminum and aluminum silicon (Al—Si) have low resistance and are inexpensive, aluminum and aluminum silicon are suitable as a material for forming the conductive layers 436 and the conductive layers 438. In particular, the aluminum silicon (Al—Si) is preferable because generation of hillocks in resist baking at the time of patterning can be prevented. A material in which approximately 0.5% of Cu is mixed into aluminum may be used instead of silicon.

In the case where each of the conductive layers 436 and the conductive layers 438 is formed to have a stacked-layer structure, a stacked-layer structure of a barrier film, an aluminum silicon film, and a barrier film; a stacked-layer structure of a barrier film, an aluminum silicon film, a titanium nitride film, and a barrier film; or the like may be employed, for example. Note that the barrier film refers to a film formed using titanium, a nitride of titanium, molybdenum, a nitride of molybdenum, or the like. By forming the conductive layers so as to sandwich an aluminum silicon film between the barrier films, generation of hillocks of aluminum or aluminum silicon can be further prevented. Moreover, by forming the barrier film using titanium that is a highly reducible element, even if a thin oxide film is formed over the semiconductor layers 402 and 404, the oxide film is reduced by the titanium contained in the barrier film, whereby preferable contact between the conductive layers 436 and the semiconductor layer 402 and between the conductive layers 438 and the semiconductor layer 404 can be obtained. Further, a plurality of barrier films may be stacked. In that case, for example, each of the conductive layers 436 and the conductive layers 438 can be formed to have a five-layer structure of titanium, titanium nitride, aluminum silicon, titanium, and titanium nitride in order from the bottom or a stacked-layer structure of more than the five layers.

For the conductive layers 436 and the conductive layers 438, tungsten silicide formed by a chemical vapor deposition method using a $WF_6$ gas and a $SiH_4$ gas may be used. Alternatively, tungsten formed by hydrogen reduction of $WF_6$ may be used for the conductive layers 436 and the conductive layers 438.

Note that the conductive layer 436 is connected to the high-concentration impurity region 416 of the n-channel transistor 428. The conductive layer 438 is connected to the high-concentration impurity region 422 of the p-channel transistor 430.

Figure 6A:
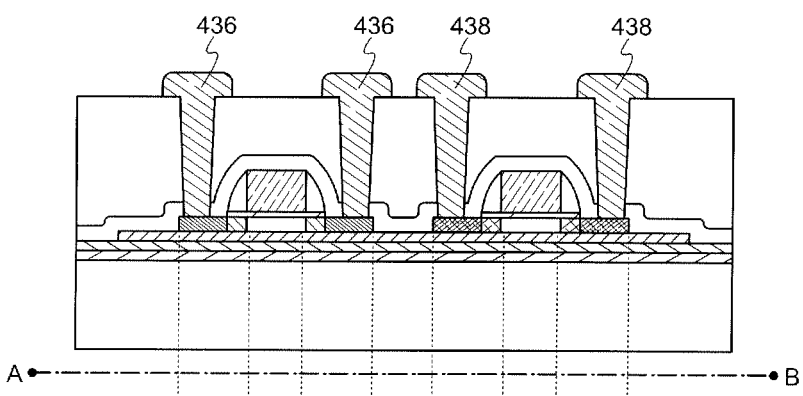
FIGS. 6A and 6B are respectively a cross-sectional view and a plan view of a semiconductor device.
Figure 6B:
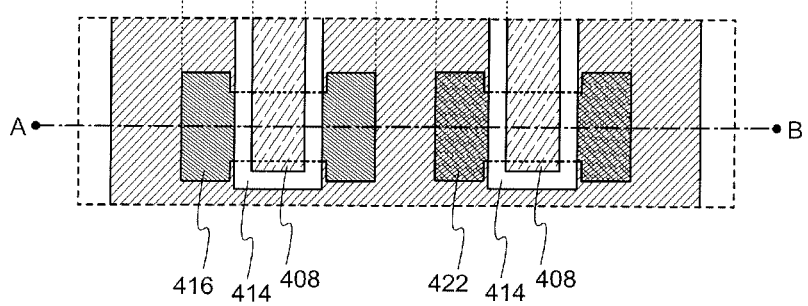

FIG. 6B shows a plan view of the n-channel transistor 428 and the p-channel transistor 430 which are shown in FIG. 6A. Here, the cross section taken along line A-B in FIG. 6B corresponds to a cross-sectional view of FIG. 6A. However, in FIG. 6B, the conductive layers 436, the conductive layers 438, the insulating layers 432 and 434, and the like are omitted for simplicity.

Note that although the case where each of the n-channel transistor 428 and the p-channel transistor 430 includes one electrode 408 serving as the gate electrode is shown as an example in this embodiment mode, the present invention is not limited to this structure. The transistor manufactured in the present invention may have a multi-gate structure in which a plurality of electrodes serving as gate electrodes are included and electrically connected to one another.

In the present invention, although a substrate having low heat resistance is used, surface unevenness and defects of a single crystal semiconductor layer are reduced without performing mechanical polishing. In addition, a region which is irradiated with an edge portion of a laser beam (a region where surface unevenness exists and defects are not sufficiently reduced) is not used as an active layer of a semiconductor element but only a region where planarity is high and defects are reduced sufficiently is used as an active layer of a semiconductor element. As described in this embodiment mode, a transistor is manufactured using the region where planarity is high with less defects, so that a gate insulating layer can be thinned and the localized state density in a semiconductor layer and at the interface can be reduced. Accordingly, a transistor which can be operated at high speed and can be driven at low voltage and has a low subthreshold value and high field-effect mobility can be manufactured.

Note that in the present invention, improvement in planarity of a semiconductor layer and reduction in defects can be realized by irradiation with one laser beam pulse. Accordingly, a semiconductor element and a semiconductor device having excellent characteristics can be manufactured without irradiating the same region with the pulsed laser beam a plurality of times. In other words, as compared to a case where irradiation with a laser beam of a number of pulses is needed, manufacturing efficiency of the semiconductor element and the semiconductor device can be improved.

In addition, since CMP treatment which is unsuitable for increase in area is not necessary, increase in area of a high-performance semiconductor device can be realized. It is needless to say that a favorable semiconductor device can be provided not only in the case of using a large-area substrate but also in the case of using a small substrate.

Note that a main surface of the semiconductor substrate which is used in this embodiment mode may be any one of a (100) surface, a (110) surface, or a (111) surface. Since the interface state density can be reduced in the case of using the (100) surface, the (100) surface is suitable for manufacture of a transistor. In addition, since, in the case of the (110) surface, a close bond between an element which is included in a bonding layer and an element which is included in or is a semiconductor (e.g., a silicon element) is formed, adhesiveness between an insulating layer and a semiconductor layer is improved. In other words, separation of the semiconductor layer can be suppressed. Moreover, since atoms are arranged closely in the (110) surface, planarity of a single crystal silicon layer in the manufactured SOI substrate can be further improved. In other words, a transistor manufactured using the semiconductor layer has extremely excellent characteristics. Note that the (110) surface has a higher Young's modulus than the (100) surface and also has an advantage that cleavage is easily performed.

Embodiment Mode 2

In this embodiment mode, another example of a method for manufacturing an SOI substrate will be described with reference to FIGS. 7A to 7G and FIGS. 8A to 8C.

The base substrate 101 to be a base substrate of an SOI substrate is prepared in a manner similar to that of Embodiment Mode 1 (see FIG. 7A). FIG. 7A is a cross-sectional view of the base substrate 101. The semiconductor substrate 111 is prepared (see FIG. 7B). FIG. 7B is a cross-sectional view of the semiconductor substrate 111.

After the semiconductor substrate 111 is washed, an insulating layer 116 is formed on the surface of the semiconductor substrate 111 (see FIG. 7C). The insulating layer 116 can have a single-layer structure or a multilayer structure of two or more layers. The thickness of the insulating layer 116 can be greater than or equal to 10 nm and less than or equal to 400 nm.

As a film which forms the insulating layer 116, an insulating film containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film, can be used. Further, an insulating film containing a metal oxide such as aluminum oxide, tantalum oxide, or hafnium oxide; an insulating film containing a metal nitride such as aluminum nitride; an insulating film containing a metal oxynitride such as aluminum oxynitride; or an insulating film containing a metal nitride oxide such as aluminum nitride oxide can also be used.

As a method for forming the insulating film included in the insulating layer 116, a CVD method, a sputtering method, a method of oxidizing (or nitriding) the semiconductor substrate 111, and the like can be given.

In the case of using a substrate containing an impurity which reduces reliability of a semiconductor device, such as an alkali metal or an alkaline earth metal, as the base substrate 101, at least one layer of film which can prevent such an impurity from diffusing from the base substrate 101 into a semiconductor layer of an SOI substrate is preferably provided. As such a film, a silicon nitride film, a silicon nitride oxide film, an aluminum nitride film, an aluminum nitride oxide film, or the like can be given. When such a film is included, the insulating layer 116 can serve as a barrier layer.

For example, in the case of forming the insulating layer 116 as a barrier layer with a single-layer structure, a silicon nitride film, a silicon nitride oxide film, an aluminum nitride film, or an aluminum nitride oxide film having a thickness greater than or equal to 10 nm and less than or equal to 200 nm can be formed.

In the case where the insulating layer 116 serves as a barrier layer and has a two-layer structure, any of the following structures can be employed, for example: stacked films of a silicon oxide film and a silicon nitride film, stacked films of a silicon oxynitride film and a silicon nitride film, stacked films of a silicon oxide film and a silicon nitride oxide film, stacked films of a silicon oxynitride film and a silicon nitride oxide film, and the like. Note that it is preferable that, in each of the two-layer structures described above which are exemplified, the film described first is formed on the semiconductor substrate 111 side (in a lower layer). Further, it is preferable that, as a lower layer film, a film made of a material capable of relaxing stress be selected so that internal stress of an upper layer having a high blocking effect does not affect a semiconductor layer. Further, the thickness of the upper layer can be greater than or equal to 10 nm and less than or equal to 200 nm, and the thickness of the lower layer can be greater than or equal to 10 nm and less than or equal to 200 nm.

In this embodiment mode, the insulating layer 116 employs a two-layer structure in which the lower layer is a silicon oxynitride film 117 formed by a plasma CVD method using $SiH_4$ and $N_2O$ as a process gas and the upper layer is a silicon nitride oxide film 118 formed by a plasma CVD method using $SiH_4$ and $NH_3$ as a process gas.

Next, the semiconductor substrate 111 is irradiated with the ion beams 121 including ions accelerated by electric field through the insulating layer 116, so that a damaged region 113 is formed in a region at a predetermined depth from the surface of the semiconductor substrate 111 (see FIG. 7D). This step can be performed in a manner similar to that of the case which is described with reference to FIG. 1E. The insulating layer 116 has an effect of preventing the semiconductor substrate 111 from being contaminated by an impurity at the time of ion irradiation, an effect of preventing the semiconductor substrate 111 from being damaged by bombardment of irradiation ions, and the like.

After the damaged region 113 is formed, a bonding layer 114 is formed on the top surface of the insulating layer 116 (see FIG. 7E).

Note that in this embodiment mode, the bonding layer 114 is formed after the ion irradiation step; however, the bonding layer 114 can also be formed before the ion irradiation step. In this case, after the insulating layer 116 is formed in FIG. 7C, the bonding layer 114 is formed over the insulating layer 116. After that, the semiconductor substrate 111 is irradiated with the ion beam 121 through the bonding layer 114 and the insulating layer 116.

As described in Embodiment Mode 1, ion irradiation can also be performed after the protective film 112 is formed. In this case, after the steps shown in FIGS. 1C to 1E, the protective film 112 may be removed so that the insulating layer 116 and the bonding layer 114 are formed over the semiconductor substrate 111.

Next, the base substrate 101 and the semiconductor substrate 111 are attached to each other (see FIG. 7F). This attachment step is performed in the following manner. First, a surface of the base substrate 101 and a surface of the bonding layer 114, which form a bonding interface, are cleaned by ultrasonic cleaning or the like. Next, the base substrate 101 and the bonding layer 114 are disposed in close contact with each other in a manner similar to that of the attachment step which is described in Embodiment Mode 1, so that the base substrate 101 and the bonding layer 114 are bonded to each other.

Before the base substrate 101 and the bonding layer 114 are bonded to each other, the surface of the base substrate 101 may be subjected to oxygen plasma treatment or ozone treatment to have a hydrophilic property. Accordingly, the bond between the base substrate 101 and the bonding layer 114 can be further increased. After the base substrate 101 and the bonding layer 114 are disposed in close contact to each other, the heat treatment or pressure treatment described in Embodiment Mode 1 can be performed in order to improve the bonding force.

Next, the semiconductor substrate 111 is separated into a semiconductor substrate 111' and a semiconductor layer 115 (see FIG. 7G). The separation step shown in this embodiment mode can be performed in a manner similar to the separation step described in Embodiment Mode 1. The separation of the semiconductor substrate 111 is performed by heating the semiconductor substrate 111 after the base substrate 101 and the semiconductor substrate 111 are attached to each other. The heat temperature of the semiconductor substrate 111 can be, for example, greater than or equal to 400° C. and less than or equal to 700° C., which depends on the allowable temperature limit of the base substrate.

Through the steps described above, an SOI substrate 132 in which the semiconductor layer 115 is provided for the base substrate 101 is manufactured. The SOI substrate 132 is a substrate with a multilayer structure, in which the bonding layer 114, the insulating layer 116, and the semiconductor layer 115 are stacked in this order over the base substrate 101, and a bond is formed at the interface between the base substrate 101 and the bonding layer 114.

After that, the SOI substrate 132 is irradiated with the laser beam 122 (see FIG. 8A). This laser irradiation step can be performed in a manner similar to that of the case shown in Embodiment Mode 1. As shown in FIG. 8A, by irradiation with the laser beam 122 from the top surface side of the semiconductor layer 115, the semiconductor layer 115 is partially melted, so that a semiconductor layer 115A in which the planarity is improved and defects are reduced can be obtained (see FIG. 8B).

After an SOI substrate 132A including the semiconductor layer 115A is formed by irradiation with the laser beam 122, a thinning step of the semiconductor layer in which the semiconductor layer 115A is thinned may be performed (see FIG. 8C). This thinning step can be performed in a manner similar to that of the thinning step shown in Embodiment Mode 1. Specifically, etching or (etch-back) is performed on the semiconductor layer 115A to thin the semiconductor layer 115A. The final thickness of a semiconductor layer 115B is preferably greater than or equal to 5 nm and less than or equal to 100 nm and more preferably greater than or equal to 5 nm and less than or equal to 50 nm.

Note that although the etching treatment or etch-back treatment is performed after planarization or the like is performed on the surface by the laser irradiation in this embodiment mode, the present invention is not limited thereto. For example, etching treatment or etch-back treatment may be performed before the laser irradiation. In this case, roughness or defects of the surface of the semiconductor layer can be reduced to some extent by the etching treatment or etch-back treatment. Alternatively, etching treatment or etch-back treatment may be performed before and after the laser irradiation. Further alternatively, either etching treatment or etch-back treatment and the laser irradiation may be alternately repeated. By using laser irradiation and etching treatment (or etch-back treatment) in combination as described above, roughness, defects, and the like of the surface of the semiconductor layer can be significantly reduced.

In addition, after the irradiation with the laser beam 122 is performed, heat treatment at a temperature less than or equal to an allowable temperature limit of the base substrate 101 may be performed. Accordingly, the effect of the irradiation with the laser beam 122 is promoted, whereby defects can be removed and planarity can be improved with efficiency. It is needless to say that the etching treatment or etch-back treatment, the heat treatment, and the like described above are not always needed.

An SOI substrate 132B to which the semiconductor layer 115B is attached can be formed by performing the steps shown in FIGS. 7A to 7G and FIGS. 8A to 8C.

Note that in this embodiment mode, the SOI substrate 132B in which the plurality of semiconductor layers 115B are attached to one base substrate 101 can be manufactured in a manner similar to that of Embodiment Mode 1. In addition, the plurality of semiconductor substrates 111 may be fixed to the base substrate 101 so that the plurality of semiconductor layers 115 can be formed simultaneously.

This embodiment mode can be implemented by being combined with Embodiment Mode 1 as appropriate.

Embodiment Mode 3

In this embodiment mode, another example of a method for manufacturing an SOI substrate will be described with reference to FIGS. 9A to 9H and FIGS. 10A to 10C.

The base substrate 101 to be a base substrate of an SOI substrate is prepared in a manner similar to that of Embodiment Mode 1 (see FIG. 9A), and the insulating layer 102 is formed over the base substrate. Also in this embodiment, the insulating layer 102 is a film with a two-layer structure including the silicon nitride oxide film 103 and the silicon oxynitride film 104. Next, a bonding layer 105 is formed over the insulating layer 102 (see FIG. 9B). This bonding layer 105 can be formed similarly to the bonding layer 114 formed over the semiconductor substrate 111 which is shown in Embodiment Mode 1 or 2.

FIGS. 9C to 9E shows steps similar to those in FIGS. 1C to 1E. As described in Embodiment Mode 1, the protective film 112 is formed over the semiconductor substrate 111, and the damaged region 113 is formed in the semiconductor substrate 111. After the damaged region 113 is formed, as shown in FIG. 9F, the protective film 112 is removed. Note that after the protective film 112 is removed, the bonding layer 114 can also be formed in a manner similar to that of FIG. 1F. Alternatively, the following attachment step may be performed with the protective film 112 remaining. Further alternatively, the bonding layer 114 can be formed over the protective film 112 with the protective film 112 remaining.

Next, the base substrate 101 and the semiconductor substrate 111 are attached to each other (see FIG. 9G). This attachment step can be performed similarly to the attachment step shown in Embodiment Mode 1, and the semiconductor substrate 111 and the bonding layer 105 are disposed in close contact with each other to bond the semiconductor substrate 111 and the bonding layer 105 to each other.

Before the semiconductor substrate 111 and the bonding layer 105 are bonded to each other, the surface of the semiconductor substrate 111 may be subjected to oxygen plasma treatment or ozone treatment to have a hydrophilic property. After the semiconductor substrate 111 and the bonding layer 105 are bonded to each other, the heat treatment or pressure treatment described in Embodiment Mode 1 can be performed in order to improve the bonding force.

Next, the semiconductor substrate 111 is separated into a semiconductor substrate 111' and a semiconductor layer 115 (see FIG. 9H). The separation step shown in this embodiment mode can be performed in a manner similar to the separation step described in Embodiment Mode 1. That is, after the semiconductor substrate 111 and the bonding layer 105 are bonded to each other, the semiconductor substrate 111 may be heated at a temperature greater than or equal to 400° C. and less than or equal to 700° C. It is needless to say that the upper limit of the heat temperature is set so as not to exceed the strain point of the base substrate 101.

Through the steps described above, an SOI substrate 133 in which the semiconductor layer 115 is provided for the base substrate 101 is manufactured. The SOI substrate 133 is a substrate with a multilayer structure, in which the insulating layer 102, the bonding layer 105, and the semiconductor layer 115 are stacked in this order over the base substrate 101, and a bond is formed at the interface between the semiconductor layer 115 and the bonding layer 105.

Figure 10A:
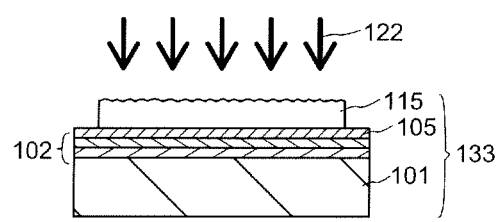
FIGS. 10A to 10C are cross-sectional views illustrating a method for manufacturing an SOI substrate.
Figure 10B:
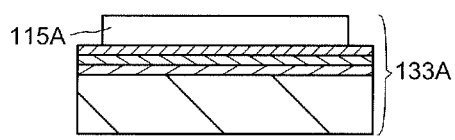

After that, the SOI substrate 133 is irradiated with the laser beam 122 (see FIG. 10A). This laser irradiation step can be performed in a manner similar to that of the case shown in Embodiment Mode 1. As shown in FIG. 10A, by irradiation with the laser beam 122 from the top surface side of the semiconductor layer 115 and the partial melting of the semiconductor layer 115, a semiconductor layer 115A in which the planarity is improved and defects are reduced can be obtained (see FIG. 10B).

Figure 10C:
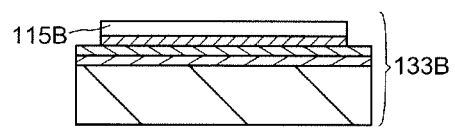

After an SOI substrate 133A including the semiconductor layer 115A is formed by irradiation with the laser beam 122, a thinning step of the semiconductor layer in which the semiconductor layer 115A is thinned may be performed (see FIG. 10C). This thinning step can be performed in a manner similar to that of the thinning step shown in Embodiment Mode 1. Specifically, etching or (etch-back) is performed on the semiconductor layer 115A to thin the semiconductor layer 115A. The final thickness of a semiconductor layer 115B is preferably greater than or equal to 5 nm and less than or equal to 100 nm and more preferably greater than or equal to 5 nm and less than or equal to 50 nm.

Note that although the etching treatment or etch-back treatment is performed after planarization or the like is performed on the surface by the laser irradiation in this embodiment mode, the present invention is not limited thereto. For example, etching treatment or etch-back treatment may be performed before the laser irradiation. In this case, roughness or defects of the surface of the semiconductor layer can be reduced to some extent by the etching treatment or etch-back treatment. Alternatively, etching treatment or etch-back treatment may be performed before and after the laser irradiation. Further alternatively, either etching treatment or etch-back treatment and the laser irradiation may be alternately repeated. By using laser irradiation and etching treatment (or etch-back treatment) in combination as described above, roughness, defects, and the like of the surface of the semiconductor layer can be significantly reduced.

In addition, after the irradiation with the laser beam 122 is performed, heat treatment at a temperature less than or equal to an allowable temperature limit of the base substrate 101 may be performed. Accordingly, the effect of the irradiation with the laser beam 122 is promoted, whereby defects can be removed and planarity can be improved with efficiency. It is needless to say that the etching treatment or etch-back treatment, the heat treatment, and the like described above are not always needed.

An SOI substrate 133B to which the semiconductor layer 115B is attached can be formed by performing the steps shown in FIGS. 9A to 9H and FIGS. 10A to 10C.

Note that in this embodiment mode, the SOI substrate 133B in which the plurality of semiconductor layers 115B are attached to one base substrate 101 can be manufactured in a manner similar to that of Embodiment Mode 1. In addition, the plurality of semiconductor substrates 111 may be fixed to the base substrate 101 so that the plurality of semiconductor layers 115 can be formed simultaneously.

This embodiment mode can be implemented by being combined with Embodiment Mode 1 or 2 as appropriate.

Embodiment Mode 4

In this embodiment mode, a method for forming an island-like semiconductor layer by removing the region b (and the region c) when a semiconductor device is manufactured will be described with reference to FIGS. 11A to 11C and FIGS. 12A to 12D.

Figure 11A:
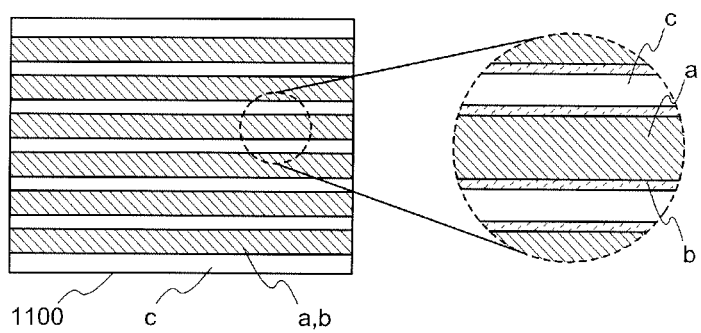
FIGS. 11A to 11C are views illustrating a method for manufacturing an island-like semiconductor layer.
Figure 11B:
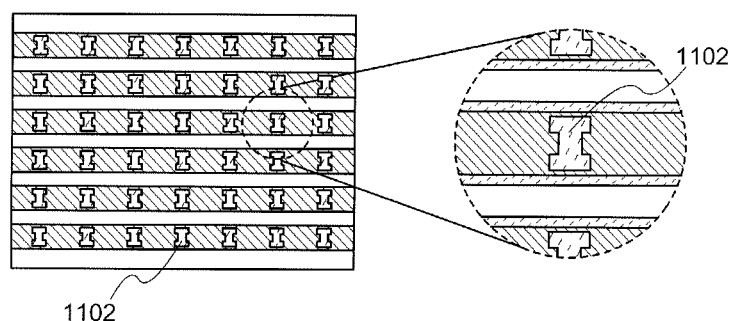
Figure 11C:
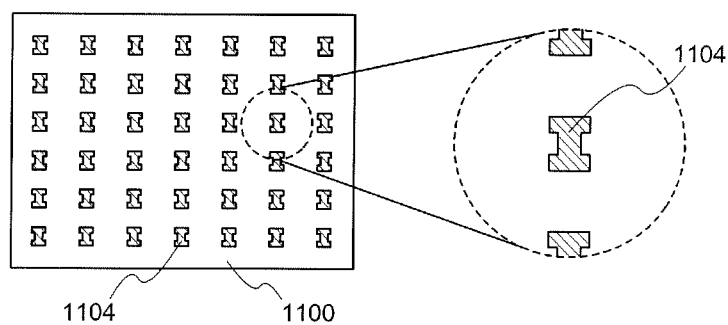

A method for patterning a semiconductor layer with the use of an irradiation trace of a laser beam is described first with reference to FIGS. 11A to 11C. Note that FIGS. 11A to 11C are merely schematic views and the present invention is not limited to the structure shown in FIGS. 11A to 11C.

First, in accordance with any of the methods shown in Embodiment Modes 1 to 3, a semiconductor layer having a region a, a region b, and a region c is formed over a base substrate 1100 (see FIG. 11A). Here, the region a is a region where the energy density of a laser beam with which the semiconductor layer is irradiated is almost constant, the region b is a region where the energy density of the laser beam with which the semiconductor layer is irradiated is rapidly changed, and the region c is a region where the semiconductor layer is substantially not irradiated with the laser beam. Note that although an example having the region c is shown in FIGS. 11A to 11C, a semiconductor layer where there is no region c can also be formed by changing the irradiation conditions of the laser beam. As shown in FIG. 11A, the regions a, b, and c are arranged periodically when seen from above the substrate. The irradiation trace of the laser beam can be detected by utilizing difference in crystallinity between the region which is irradiated with the laser beam (the region a or b) and the region which is not irradiated with the laser beam (the region c), surface unevenness caused on the edge portion (the region b) of the region irradiated with the laser beam, and the like.

Next, a resist material is applied over the semiconductor layer and then exposed to light to form a resist mask 1102 (see FIG. 11B). A CCD camera or the like can be used for alignment of a metal mask which is used at the time of the light-exposure and the irradiation trace of the laser beam. Note that the metal mask is formed to have such a pattern that the regions b and c in the semiconductor layer are removed. Here, the region b or c may be left in order to use it for a region where the characteristics of the semiconductor layer are not much required (for example, a source region, a drain region, or the like of a transistor). In addition, although the method for manufacturing the resist mask 1102 using the metal mask is described in this embodiment mode, the present invention is not limited thereto. Alternatively, the resist mask 1102 may be formed by a droplet discharge method typified by an ink-jet method. Also in this case, the alignment can be performed by utilizing difference in crystallinity between the region which is irradiated with the laser beam and the region which is not irradiated with the laser beam, surface unevenness caused on the edge portion of the region irradiated with the laser beam, and the like.

Then, the semiconductor layer is etched using the resist mask 1102 to form an island-like semiconductor layer 1104 (see FIG. 11C). Here, since the resist mask 1102 is formed so that the regions b and c are removed, the island-like semiconductor layer 1104 including only the region a can be formed. That is, a semiconductor device can be manufactured using only a single crystal semiconductor in which defects are reduced sufficiently and surface planarity is excellent. Note that the resist mask 1102 described above is removed after the island-like semiconductor layer 1104 is formed by etching.

Next, a method for forming a pattern for alignment and patterning a semiconductor layer is described with reference to FIGS. 12A to 12D.

There are a plurality of methods for forming a pattern 1210 for alignment over a base substrate 1200, and, for example, the pattern 1210 for alignment can be formed by forming a layer to be a pattern for alignment and then etching the layer. Alternatively, the pattern 1210 for alignment may be formed by ablation of the base substrate 1200, an insulating layer over the base substrate 1200, and the like by irradiation with a laser beam or the like. With such a method described above, the pattern 1210 for alignment can be formed before or after a semiconductor layer is formed over the base substrate 1200. Here, the case of forming the pattern 1210 for alignment before a semiconductor layer is formed is described (see FIG. 12A).

Figure 12A:
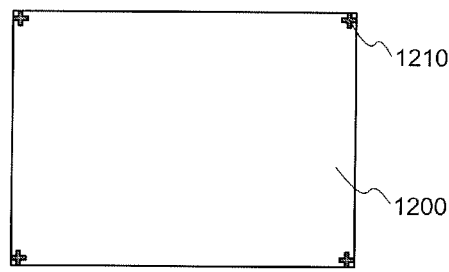
FIGS. 12A to 12D are views illustrating a method for manufacturing an island-like semiconductor layer.
Figure 12B:
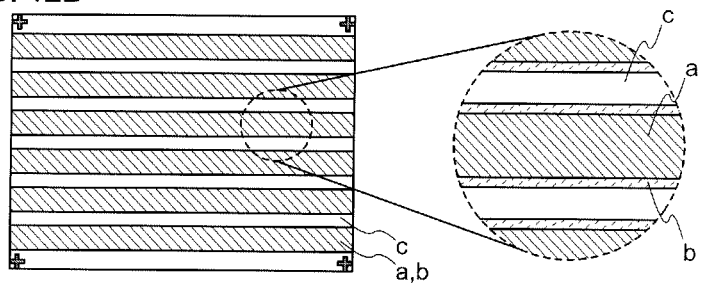

After the semiconductor layer is formed, a semiconductor layer having a region a, a region b, and a region c is formed by adjusting a region irradiated with a laser beam in accordance with the pattern 1210 for alignment (see FIG. 12B). At this time, fine adjustment of the laser irradiation position or the like may be performed by irradiating a region, which is not used for manufacturing a semiconductor device, with the laser beam on a trial basis and using the irradiation trace of the laser beam. It is possible to refer to Embodiment Modes 1 to 3 for other details. Note that also in FIG. 12B, the regions a, b, and c are arranged periodically.

Figure 12C:
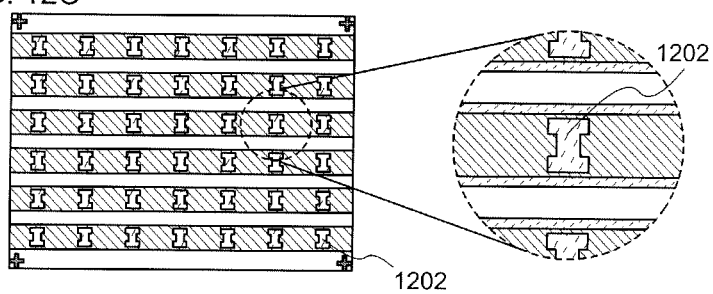

Next, a resist material is applied over the semiconductor layer and then exposed to light to form a resist mask 1202 (see FIG. 12C). Alignment of a metal mask which is used at the time of the exposure can be performed using the pattern 1210 for alignment. Although a method for manufacturing the resist mask 1202 using the metal mask is described in this embodiment mode, the present invention is not limited thereto. Alternatively, the resist mask 1202 may be formed by a droplet discharge method typified by an ink-jet method.

Figure 12D:
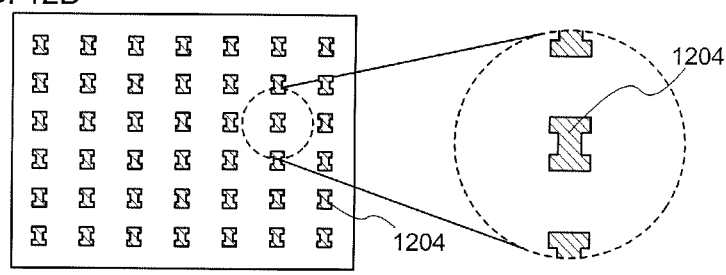

Then, the semiconductor layer is etched using the resist mask 1202 to form an island-like semiconductor layer 1204 (see FIG. 12D). Here, since the resist mask 1202 is formed so that the regions b and c are removed, the island-like semiconductor layer 1204 including only the region a can be formed. That is, a semiconductor device can be manufactured using only a single crystal semiconductor in which defects are reduced sufficiently and surface planarity is excellent. Note that the resist mask 1202 described above is removed after the island-like semiconductor layer 1204 is formed by etching.

This embodiment mode can be implemented by being combined with any of Embodiment Modes 1 to 3 as appropriate.

Embodiment Mode 5

In this embodiment mode, an example of a method for manufacturing a semiconductor device of the present invention will be described with reference to FIGS. 13A to 13D, FIGS. 14A to 14C, FIGS. 15A to 15C, and FIGS. 16A and 16B. Note that although a liquid crystal display device is given as an example of a semiconductor device in this embodiment mode, the semiconductor device of the present invention is not limited to a liquid crystal display device.

First, a single crystal semiconductor layer is formed over a substrate having an insulating surface by the method shown in any of Embodiment Modes 1 to 3 or the like (see FIG. 13A). Although description is made here using a structure in which an insulating layer 1302, an insulating layer 1304 including a bonding layer, and a single crystal semiconductor layer 1306 are provided in this order over a substrate 1300 having an insulating surface, the present invention is not limited thereto.

Next, the single crystal semiconductor layer 1306 and the insulating layer 1304 are patterned to have desired shapes so as to form island-like single crystal semiconductor layers. At this time, regions of the single crystal semiconductor layer 1306 except the region corresponding to the region a in Embodiment Mode 1 are removed by etching. Note that as etching processing in patterning, either dry etching (plasma etching or the like) or wet etching may be employed. For treating a large-area substrate, plasma etching is more suitable. As an etching gas, a fluorine-based gas or a chlorine-based gas such as tetrafluoride ($CF_4$), nitrogen fluoride ($NF_3$), chlorine ($Cl_2$), or boron chloride ($BCl_3$) is used, and an inert gas such as helium (He) or argon (Ar) may be added thereto as appropriate. Further, in the case of applying etching processing by atmospheric pressure discharge, local discharge processing can be realized, whereby etching can be performed without forming a mask layer over an entire surface of the substrate. Note that although part of the insulating layer 1304 is removed by etching in this embodiment mode, a structure in which the insulating layer 1304 is not etched may also be employed.

After the single crystal semiconductor layer 1306 and the insulating layer 1304 are patterned, an impurity element imparting p-type conductivity such as boron, aluminum, or gallium may be added in order to control a threshold voltage. For example, as an impurity element imparting p-type conductivity, boron can be added at a concentration greater than or equal to $5 \times 10^{16}$ cm$^{-3}$ and less than or equal to $1 \times 10^{18}$ cm$^{-3}$.

The insulating layer 1304 preferably has a barrier layer against an impurity element, in addition to the bonding layer. The barrier layer can be formed using a material such as silicon nitride or silicon nitride oxide. In the case of providing a barrier layer, a stacked-layer structure of a bonding layer, silicon nitride oxide, and silicon oxynitride from the side in contact with the substrate having an insulating surface can be used for the insulating layer 1304, for example. Silicon nitride may be used instead of silicon nitride oxide. Further, silicon oxide may be used instead of silicon oxynitride.

Next, a gate insulating layer 1308 which covers the island-like single crystal semiconductor layers is formed (see FIG. 13B). Note that for convenience, the island-like single crystal semiconductor layers which are formed by patterning are each referred to as a single crystal semiconductor layer 1310, a single crystal semiconductor layer 1312, and a single crystal semiconductor layer 1314, here. The gate insulating layer 1308 is formed of an insulating film containing silicon by a plasma CVD method, a sputtering method, or the like, with a thickness greater than or equal to 10 nm and less than or equal to 150 nm. Specifically, the gate insulating layer 1308 may be formed from a material such as an oxide material or a nitride material of silicon, which is typified by silicon nitride, silicon oxide, silicon oxynitride, and silicon nitride oxide. Note that the gate insulating layer 1308 may have a single-layer structure or a stacked-layer structure. Further, a thin silicon oxide film with a thickness of greater than or equal to 1 nm and less than or equal to 100 nm, preferably greater than or equal to 1 nm and less than or equal to 10 nm, and more preferably greater than or equal to 2 nm and less than or equal to 5 nm may be formed between the single crystal semiconductor layer and the gate insulating layer. In order to form a gate insulating film having less leakage current at a low temperature, a rare gas element such as argon may be contained in a reaction gas.

Next, a first conductive film and a second conductive film, which serve as gate electrode layers, are stacked over the gate insulating layer 1308. The first conductive film may be formed with a thickness approximately greater than or equal to 20 nm and less than or equal to 100 nm, and the second conductive film may be formed with a thickness approximately greater than or equal to 100 nm and less than or equal to 400 nm. The first conductive film and the second conductive film can be formed by a sputtering method, an evaporation method, a CVD method, or the like. The first conductive film and the second conductive film may be formed using an element selected from tantalum, tungsten, titanium, molybdenum, aluminum, copper, chromium, neodymium, or the like, an alloy material or a compound material including any of those elements as its main component, or the like. Further, for the first conductive film and the second conductive film, a semiconductor film typified by a polycrystalline silicon film doped with an impurity element such as phosphorus, an AgPdCu alloy, or the like may be used. Note that although a conductive layer with a two-layer structure is described in this embodiment mode, the present invention is not limited thereto. Alternatively, a single-layer structure or a stacked-layer structure including three or more layers may be employed.

Then, a photolithography method is used to form a mask 1316a, a mask 1316b, a mask 1316c, a mask 1316d, and a mask 1316e from a resist material. Then, the first conductive film and the second conductive film are processed into a desired shape with the use of the masks to form each of a first gate electrode layer 1318a, a first gate electrode layer 1318b, a first gate electrode layer 1318c, a first gate electrode layer 1318d, a first conductive layer 1318e, a conductive layer 1320a, a conductive layer 1320b, a conductive layer 1320c, a conductive layer 1320d, and a conductive layer 1320e (see FIG. 13C).

Here, an inductively coupled plasma (ICP) etching method is used, and etching conditions (e.g., the amount of electric power applied to a coiled electrode layer, the amount of electric power applied to an electrode layer on the substrate side, the electrode temperature on the substrate side, and the like) are adjusted as appropriate, whereby etching can be performed so as to obtain a desired tapered shape. An angle and the like of the tapered shape can also be controlled by the shape of the masks. Note that as an etching gas, a chlorine-based gas typified by chlorine ($Cl_2$), boron chloride ($BCl_3$), silicon chloride ($SiCl_4$), carbon tetrachloride ($CCl_4$), or the like; a fluorine-based gas typified by tetrafluoride ($CF_4$), sulfur fluoride ($SF_6$), nitrogen fluoride ($NF_3$), or the like; or oxygen ($O_2$) can be used as appropriate. In this embodiment mode, the second conductive film is etched using an etching gas containing tetrafluoride ($CF_4$), chlorine ($Cl_2$), and oxygen ($O_2$), and then, the first conductive film is successively etched using an etching gas containing tetrafluoride ($CF_4$) and chlorine ($Cl_2$).

Next, the conductive layers 1320a, 1320b, 1320c, 1320d, and 1320e are each processed into a desired shape using the masks 1316a, 1316b, 1316c, 1316d, and 1316e. At this time, etching is performed under an etching condition in which the selectivity of the second conductive film, which forms the conductive layers, to the first conductive film, which forms the first gate electrode layers and the first conductive layer, is high. By the etching, a second gate electrode layer 1322a, a second gate electrode layer 1322b, a second gate electrode layer 1322c, a second gate electrode layer 1322d, and a second conductive layer 1322e are formed. In this embodiment mode, each of the second gate electrode layers and the second conductive layer has a tapered shape, and a taper angle of each of the second gate electrode layers and the second conductive layer is larger than a taper angle of each of the first gate electrode layers and the first conductive layer. Here, a "taper angle" refers to an angle formed by the meeting of a bottom surface with a side surface of an object. Thus, when the taper angle is 90°, the conductive layer has a perpendicular side surface to the bottom surface. With each taper angle set to a degree of less than 90°, a film to be stacked thereover adequately covers the conductive layer; thus, defects can be reduced. Note that $Cl_2$, $SF_6$, and $O_2$ are used as an etching gas for forming the second gate electrode layers and the second conductive layer in this embodiment mode.

Through the processes described above, a gate electrode layer 1324a and a gate electrode layer 1324b can be formed in a peripheral driver circuit region 1380, and a gate electrode layer 1324c, a gate electrode layer 1324d, and a conductive layer 1324e can be formed in a pixel region 1382 (see FIG. 13D). Note that the masks 1316a, 1316b, 1316c, 1316d, and 1316e are removed after the process described above.

Next, an impurity element imparting n-type conductivity is added using the gate electrode layers 1324a, 1324b, 1324c, and 1324d as masks to form a first n-type impurity region 1326a, a first n-type impurity region 1326b, a first n-type impurity region 1328a, a first n-type impurity region 1328b, a first n-type impurity region 1330a, a first n-type impurity region 1330b, and a first n-type impurity region 1330c (see FIG. 14A). In this embodiment mode, doping is performed using phosphine ($PH_3$) as a doping gas containing an impurity element. Here, doping is performed so that phosphorus (P) that is an impurity element imparting n-type conductivity is contained in the first n-type impurity regions at a concentration approximately greater than or equal to $1\times10^{16}/cm^3$ and less than or equal to $5\times10^{19}/cm^3$.

Next, a mask 1332a, a mask 1332b, and a mask 1332c which cover the single crystal semiconductor layer 1310 and part of the single crystal semiconductor layer 1314 are formed. An impurity element imparting n-type conductivity is added using the masks 1332a, 1332b, and 1332c, and the second gate electrode layer 1322b as masks. Accordingly, the following are formed: a second n-type impurity region 1334a, a second n-type impurity region 1334b, a second n-type impurity region 1340a, a second n-type impurity region 1340b, a second n-type impurity region 1340c, a third n-type impurity region 1336a, a third n-type impurity region 1336b, a third n-type impurity region 1342a, a third n-type impurity region 1342b, a third n-type impurity region 1342c, and a third n-type impurity region 1342d. In this embodiment mode, doping is performed using phosphine ($PH_3$) as a doping gas containing an impurity element. Here, doping is performed so that phosphorus (P) that is an impurity element imparting n-type conductivity is contained in the second n-type impurity regions at a concentration approximately greater than or equal to $1\times10^{17}/cm^3$ and less than or equal to $1\times10^{21}/cm^3$. An impurity element imparting n-type conductivity is added to the third n-type impurity regions 1336a and 1336b so as to contain the impurity element imparting n-type conductivity at a concentration which is the same as or substantially the same as or at a slightly higher concentration than that of the third n-type impurity regions 1342a, 1342b, 1342c, and 1342d. In addition, a channel formation region 1338, a channel formation region 1344a, and a channel formation region 1344b are formed (see FIG. 14B).

Each of the second n-type impurity regions is a high-concentration impurity region and functions as a source or a drain. On the other hand, each of the third n-type impurity regions is a low-concentration impurity region and functions as a so-called LDD (lightly doped drain) region. Each of the third n-type impurity regions 1336a and 1336b is formed in a region overlapping with the first gate electrode layer 1318b. Accordingly, an electric field in the vicinity of a source or a drain can be relieved, and deterioration of on-state current due to hot carriers can be prevented. On the other hand, each of the third n-type impurity regions 1342a, 1342b, 1342c, and 1342d does not overlap with the gate electrode layer 1324c or 1324d; thus, an effect of reducing off-state current can be obtained.

Next, the masks 1332a, 1332b, and 1332c are removed, and a mask 1346a and a mask 1346b which cover the single crystal semiconductor layers 1312 and 1314 are formed. An impurity element imparting p-type conductivity is added using the masks 1346a and 1346b and the gate electrode layer 1324a as masks. Accordingly, a first p-type impurity region 1348a, a first p-type impurity region 1348b, a second p-type impurity region 1350a, and a second p-type impurity region 1350b are formed. In this embodiment mode, doping is performed using diborane ($B_2H_6$) as a doping gas containing an impurity element. Here, boron (B) that is an impurity element imparting p-type conductivity is added to the first p-type impurity regions and the second p-type impurity regions at a concentration approximately greater than or equal to $1\times10^{18}/cm^3$ and less than or equal to $5\times10^{21}/cm^3$. Further, a channel formation region 1352 is formed (see FIG. 14C).

Each of the first p-type impurity regions is a high-concentration impurity region and functions as a source or a drain. On the other hand, each of the second p-type impurity regions is a low-concentration impurity region and functions as a so-called LDD (lightly doped drain) region.

After that, the masks 1346a and 1346b are removed. After the masks are removed, an insulating film may be formed so as to cover the side surfaces of the gate electrode layers. The insulating film can be formed by a plasma CVD method or a low-pressure CVD (LPCVD) method. Heat treatment, intense light irradiation, laser irradiation, or the like may be performed to activate the impurity elements.

Subsequently, an interlayer insulating layer which covers the gate electrode layers and the gate insulating layer is formed. In this embodiment mode, a stacked-layer structure of an insulating film 1354 and an insulating film 1356 is employed (see FIG. 15A). A silicon nitride oxide film is formed as the insulating film 1354 with a thickness of 100 nm, and a silicon oxynitride film is formed as the insulating film 1356 with a thickness of 900 nm. Although the two-layer structure is employed in this embodiment mode, a single-layer structure or a stacked-layer structure including three or more layers may be employed. In this embodiment mode, the insulating films 1354 and 1356 are successively formed by a plasma CVD method without being exposed to the air. Note that materials for the insulating films 1354 and 1356 are not limited to the material described above.

The insulating films 1354 and 1356 can also be formed using a material selected from substances including silicon oxide, silicon nitride, aluminum oxide, aluminum nitride, aluminum oxynitride, aluminum nitride oxide containing more nitrogen than oxygen, diamond-like carbon (DLC), a carbon film containing nitrogen, and other substances containing an inorganic insulating material. Further, a siloxane resin may also be used. Note that a siloxane resin is a resin containing a Si—O—Si bond. A skeleton structure of siloxane includes the bond of silicon (Si) and oxygen (O), in which an organic group (e.g., an alkyl group and an aryl group) or a fluoro group may be used as a substituent. The organic group may include the fluoro group. Alternatively, an organic insulating material such as polyimide, acrylic, polyamide, polyimide amide, benzocyclobutene, or polysilazane can also be used.

Next, contact holes (openings) that reach the single crystal semiconductor layers and the gate electrode layers (not shown) are formed in the insulating films 1354 and 1356 and the gate insulating layer 1308, using a mask made of a resist material. Etching may be performed once or a plurality of times depending on the selectivity of materials to be used. In this embodiment mode, first etching is performed under a condition that selectivity of the insulating film 1356 that is a silicon oxynitride film to each of the insulating film 1354 that is a silicon nitride oxide film and the gate insulating layer 1308 can be obtained; thus, the insulating film 1356 is removed. Next, the insulating film 1354 and the gate insulating layer 1308 are removed by second etching, and openings each of which reaches a source or a drain are formed.

Then, a conductive film is formed so as to cover the openings, and the conductive film is etched. Accordingly, a source or drain electrode layer 1358a, a source or drain electrode layer 1358b, a source or drain electrode layer 1360a, a source or drain electrode layer 1360b, a source or drain electrode layer 1362a, and a source or drain electrode layer 1362b which are each electrically connected to part of a source or drain region are formed. For each source or drain electrode layer, one or a plurality of elements selected from aluminum, tantalum, titanium, molybdenum, tungsten, neodymium, chromium, nickel, platinum, gold, silver, copper, magnesium, scandium, cobalt, nickel, zinc, niobium, silicon, phosphorus, boron, arsenic, gallium, indium, and tin; a compound or an alloy material that contains any of the given elements as its main component (e.g., indium tin oxide (ITO), indium zinc oxide (IZO), indium tin oxide to which silicon oxide is added (ITSO), zinc oxide, aluminum-neodymium (Al—Nd), magnesium-silver (Mg—Ag), or the like); a material that is a combination of any of these compounds; or the like can be used. Alternatively, a silicide (e.g., aluminum-silicon, molybdenum-silicon, or nickel silicide), a compound containing nitrogen (e.g., titanium nitride, tantalum nitride, or molybdenum nitride), silicon (Si) doped with an impurity element such as phosphorus (P), or the like can be used.

Through the processes described above, a p-channel thin film transistor 1364 and an n-channel thin film transistor 1366 are formed in the peripheral driver circuit region 1380, and an n-channel thin film transistor 1368 and a capacitor wiring 1370 are formed in the pixel region 1382 (see FIG. 15B).

Next, an insulating film 1372 is formed as a second interlayer insulating layer. The insulating film 1372 can be formed from a material selected from silicon oxide, silicon nitride, silicon oxynitride, silicon nitride oxide, aluminum oxide, aluminum nitride, aluminum oxynitride, aluminum nitride oxide containing more nitrogen than oxygen, diamond-like carbon (DLC), a carbon film containing nitrogen, phosphosilicate glass (PSG), borophosphosilicate glass (BPSG), an alumina film, polysilazane, or other substances containing an inorganic insulating material. Further, a siloxane resin may also be used. Alternatively, an organic insulating material such as polyimide, acrylic, polyamide, polyimide amide, or benzocyclobutene can be used.

Next, a contact hole is formed in the insulating film 1372 of the pixel region 1382 to form a pixel electrode layer 1374 (see FIG. 15C). The pixel electrode layer 1374 can be formed using indium tin oxide (ITO), indium zinc oxide (IZO) in which indium oxide is mixed with zinc oxide, a conductive material in which indium oxide is mixed with silicon oxide, organic indium, organic tin, indium oxide containing tungsten oxide, indium zinc oxide containing tungsten oxide, indium oxide containing titanium oxide, indium tin oxide containing titanium oxide, metal such as tungsten, molybdenum, zirconium, hafnium, vanadium, niobium, tantalum, chromium, cobalt, nickel, titanium, platinum, aluminum, copper, or silver, or an alloy or a metal nitride thereof.

A conductive composition including a conductive macromolecule (also referred to as a conductive polymer) can be used for the pixel electrode layer 1374. A thin film of a conductive composition preferably has a sheet resistance less than or equal to 10000 Ω/sq. When a thin film of a conductive composition is formed as a pixel electrode layer having a light-transmitting property, light transmittance is preferably greater than or equal to 70% at a wavelength of 550 nm. In addition, the resistance of the conductive macromolecule which is contained in the conductive composition is preferably less than or equal to 0.1 Ω·cm.

As the conductive macromolecule described above, a so-called π electron conjugated conductive macromolecule can be used. For example, polyaniline and a derivative thereof, polypyrrole and a derivative thereof, polythiophene and a derivative thereof, a copolymer of those materials, and the like can be given.

As Specific examples of the conjugated conductive macromolecule, the following can be given: polypyrrole, poly(3-methylpyrrole), poly(3-butylpyrrole), poly(3-octylpyrrole), poly(3-decylpyrrole), poly(3,4-dimethylpyrrole), poly(3,4-dibutylpyrrole), poly(3-hydroxypyrrole), poly(3-methyl-4-hydroxypyrrole), poly(3-methoxypyrrole), poly(3-ethoxypyrrole), poly(3-octoxypyrrole), poly(3-carboxylpyrrole), poly(3-methyl-4-carboxylpyrrole), polyN-methylpyrrole, polythiophene, poly(3-methylthiophene), poly(3-butylthiophene), poly(3-octylthiophene), poly(3-decylthiophene), poly(3-dodecylthiophene), poly(3-methoxythiophene), poly(3-ethoxythiophene), poly(3-octoxythiophene), poly(3-carboxylthiophene), poly(3-methyl-4-carboxylthiophene), poly(3,4-ethylenedioxythiophene), polyaniline, poly(2-methylaniline), poly(2-octylaniline), poly(2-isobutylaniline), poly(3-isobutylaniline), poly(2-anilinesulfonic acid), poly(3-anilinesulfonic acid), and the like.

The conductive macromolecule described above may be used alone, or an organic resin may be added thereto in order to adjust the characteristics of the films.

Furthermore, by doping a conductive composition with an acceptor type dopant or a donor type dopant, an oxidation-reduction potential of a conjugated electron of a conjugated conductive macromolecule may be changed to adjust electrical conductivity.

The conductive composition as described above is dissolved in water or an organic solvent (e.g., an alcohol-based solvent, a ketone-based solvent, an ester-based solvent, a hydrocarbon-based solvent, an aromatic-based solvent, or the like), so that a thin film which serves as the pixel electrode layer 1374 can be formed by an application method, a coating method, a droplet discharge method (also referred to as an ink-jet method), a printing method, or the like.

Figure 16A:
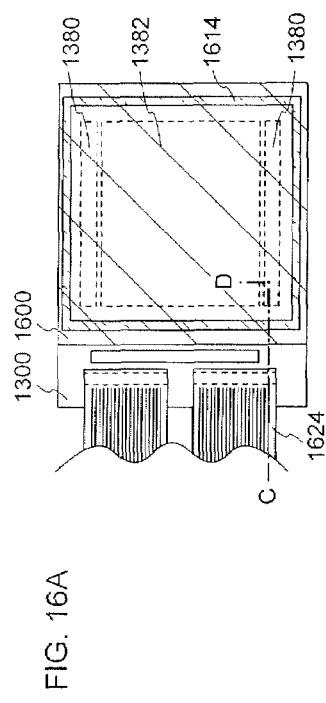
FIGS. 16A and 16B are respectively a plan view and a cross-sectional view of a semiconductor device.
Figure 16B:
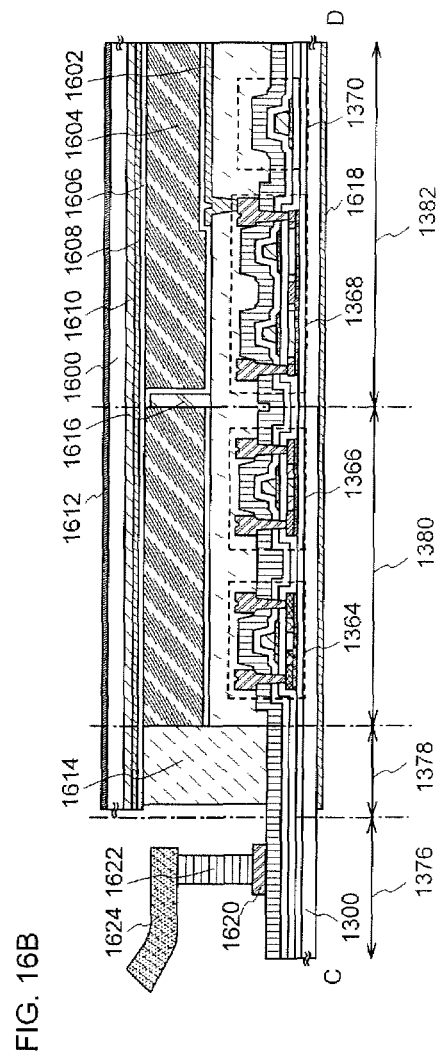

Next, an insulating layer 1602 referred to as an alignment film is formed so as to cover the pixel electrode layer 1374 and the insulating film 1372 (see FIG. 16B). The insulating layer 1602 can be formed by a screen printing method or an offset printing method. Note that FIGS. 16A and 16B show a plan view and a cross-sectional view of a semiconductor device, respectively. FIG. 16A is a plan view of a semiconductor device, and FIG. 16B is a cross-sectional view taken along line C-D of FIG. 16A. The semiconductor device includes an external terminal connection region 1376, a sealing region 1378, the peripheral driver circuit region 1380, and the pixel region 1382.

After the insulating layer 1602 is formed, rubbing treatment is performed. An insulating layer 1606 which serves as an alignment film can be formed in a manner similar to that of the insulating layer 1602.

Then, a counter substrate 1600 is attached to the substrate 1300 having an insulating surface with a sealing material 1614 and a spacer 1616 interposed therebetween, and a liquid crystal layer 1604 is provided in a gap therebetween. Note that the counter substrate 1600 is provided with the insulating layer 1606 which serves as an alignment film, a conductive layer 1608 which serves as a counter electrode, a coloring layer 1610 which serves as a color filter, a polarizer 1612 (also referred to as a polarizing plate), and the like. Note that although the substrate 1300 having an insulating surface is also provided with a polarizer 1618 (a polarizing plate), the present invention is not limited thereto. For example, a polarizer may be provided on one side in a reflective type liquid crystal display device.

Subsequently, an FPC 1624 is connected to a terminal electrode layer 1620 that is electrically connected to the pixel region, with an anisotropic conductive layer 1622 interposed therebetween. The FPC 1624 has a function of transmitting a signal from the external. A liquid crystal display device can be manufactured by the process described above.

A liquid crystal display device is manufactured using the method described in Embodiment Mode 1 or the like in this embodiment mode. Accordingly, the characteristics of a semiconductor element (e.g., a transistor in a pixel region) which serves as switching of the liquid crystal can be greatly improved. In addition, operation speed of a semiconductor element in a driver circuit region can be greatly improved. Therefore, the display characteristics of the liquid crystal display device can be greatly improved according to the present invention.

Note that although a method for manufacturing a liquid crystal display device is described in this embodiment mode, the present invention is not limited thereto. This embodiment mode can be implemented by being combined with any of Embodiment Modes 1 to 4 as appropriate.

Embodiment Mode 6

In this embodiment mode, a semiconductor device having a light-emitting element according to the present invention (an electroluminescence display device) will be described. Note that since it is possible to refer to Embodiment Mode 5 for a method for manufacturing transistors which are used for a peripheral driver circuit, a pixel region, and the like, the details are omitted.

As to a semiconductor device having a light-emitting element, any one of bottom emission, top emission, and dual emission can be employed. Although a semiconductor device employing bottom emission is described in this embodiment mode with reference to FIGS. 17A and 17B, the present invention is not limited thereto.

In a semiconductor device shown in FIGS. 17A and 17B, light is emitted downwardly (in a direction indicated by an arrow). Here, FIG. 17A is a plan view of the semiconductor device, and FIG. 17B is a cross-sectional view taken along line E-F of FIG. 17A. In FIGS. 17A and 17B, the semiconductor device includes an external terminal connection region 1730, a sealing region 1732, a driver circuit region 1734, and a pixel region 1736.

The semiconductor device shown in FIGS. 17A and 17B includes an element substrate 1700, a thin film transistor 1750, a thin film transistor 1752, a thin film transistor 1754, and a thin film transistor 1756, a light-emitting element 1760, an insulating layer 1768, a filler 1770, a sealant 1772, a wiring layer 1774, a terminal electrode layer 1776, an anisotropic conductive layer 1778, an FPC 1780, and a sealing substrate 1790. Note that the light-emitting element 1760 includes a first electrode layer 1762, a light-emitting layer 1764, and a second electrode layer 1766.

As the first electrode layer 1762, a light-transmitting conductive material is used so that light emitted from the light-emitting layer 1764 can be transmitted. On the other hand, as the second electrode layer 1766, a conductive material which can reflect light emitted from the light-emitting layer 1764 is used.

As the first electrode layer 1762, indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide to which silicon oxide is added (ITSO), or the like may also be used.

A conductive composition containing a conductive macromolecule (also referred to as a conductive polymer) can also be used as the first electrode layer 1762. Note that since it is possible to refer to Embodiment Mode 4 for the details, the descriptions are omitted here.

As the second electrode layer 1766, a conductive film formed of titanium, tungsten, nickel, gold, platinum, silver, copper, tantalum, molybdenum, aluminum, magnesium, calcium, lithium, or an alloy thereof can be used. A substance having high reflectivity in a visible region is preferably used, and an aluminum film is used in this embodiment mode.

Note that in the case of employing each of top emission and dual emission, the design of the electrode layers may be changed as appropriate. Specifically, in the case of top emission, the first electrode layer 1762 is formed using a reflective material, and the second electrode layer 1766 is formed using a light-transmitting material. In the case of dual emission, the first electrode layer 1762 and the second electrode layer 1766 may be formed using a light-transmitting material. Note that in the case of bottom emission and top emission, a structure may be employed in which one electrode layer is formed using a light-transmitting material and the other electrode layer is formed in a stacked-layer structure of a light-transmitting material and a light-reflecting material. The material that can be used for the electrode layers is similar to the material in the case of bottom emission; thus, the descriptions are omitted here.

Note that even a material like metal which is generally considered to have no light-transmitting property can transmit light when it has a small thickness (a thickness approximately greater than or equal to 5 nm and less than or equal to 30 nm). Accordingly, an electrode layer which transmits light can also be formed using the light-reflecting material described above.

The sealing substrate 1790 may be provided with a color filter (a coloring layer). The color filter (a coloring layer) can be formed by an evaporation method or a droplet discharge method. Alternatively, a color conversion layer may be used.

An electroluminescence display device is manufactured using the method described in Embodiment Mode 1 or the like in this embodiment mode. Accordingly, the characteristics of a semiconductor element (e.g., a transistor in a pixel region) which serves as switching of the light emission of the electroluminescence display device can be greatly improved. In addition, operation speed of a semiconductor element in a driver circuit region can be greatly improved. Therefore, the display characteristics of the electroluminescence display device can be greatly improved according to the present invention.

Note that although the description is made in this embodiment mode using an electroluminescence display device, the present invention is not limited thereto. This embodiment mode can be implemented by being combined with any of Embodiment Modes 1 to 5 as appropriate.

Embodiment Mode 7

In this embodiment mode, another example of a semiconductor device of the present invention will be described with reference to FIG. 18 and FIG. 19. Note that although a microprocessor and an electronic tag (also referred to as a wireless tag) are given as examples in this embodiment mode, the semiconductor device of the present invention is not limited thereto.

Figure 18:
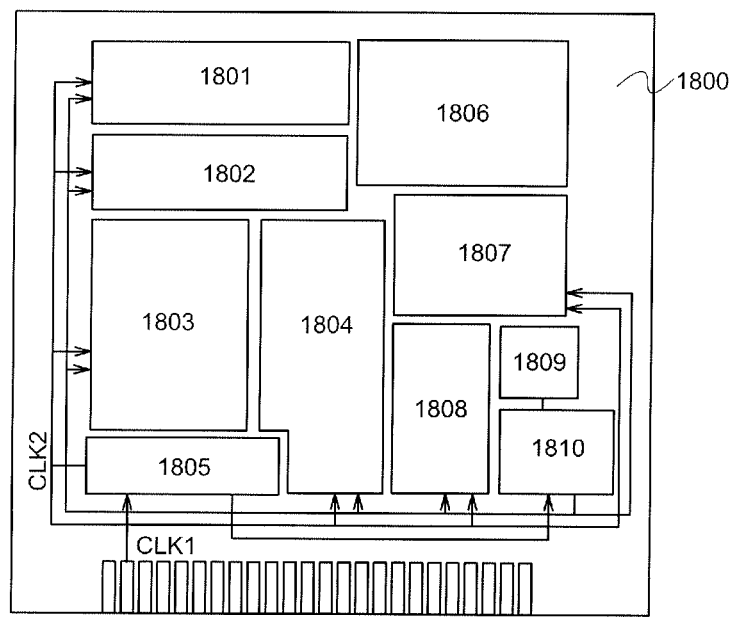
FIG. 18 is a diagram illustrating a structure of a semiconductor device.
Figure 19:
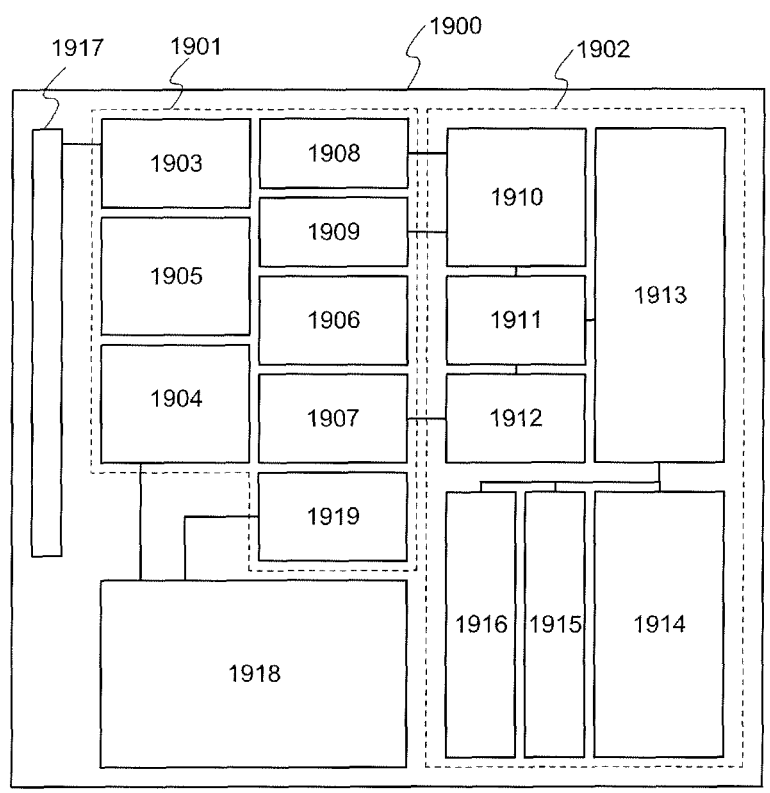
FIG. 19 is a diagram illustrating a structure of a semiconductor device.

FIG. 18 shows an example of a microprocessor of the present invention. A microprocessor 1800 in FIG. 18 is manufactured using the semiconductor substrate of the present invention. This microprocessor 1800 has an arithmetic logic unit (ALU) 1801, an ALU controller 1802, an instruction decoder 1803, an interrupt controller 1804, a timing controller 1805, a register 1806, a register controller 1807, a bus interface (Bus I/F) 1808, a read-only memory (ROM) 1809, and a ROM interface (ROM I/F) 1810.

An instruction inputted to the microprocessor 1800 through the bus interface 1808 is inputted to the instruction decoder 1803, decoded therein, and then inputted to the ALU controller 1802, the interrupt controller 1804, the register controller 1807, and the timing controller 1805. The ALU controller 1802, the interrupt controller 1804, the register controller 1807, and the timing controller 1805 conduct various controls based on the decoded instruction. Specifically, the ALU controller 1802 generates signals for controlling the operation of the ALU 1801. While the microprocessor 1800 is executing a program, the interrupt controller 1804 processes an interrupt request from an external input/output device or a peripheral circuit based on its priority or the like. The register controller 1807 generates an address of the register 1806, and reads and writes data from and to the register 1806 depending on the state of the microprocessor 1800. The timing controller 1805 generates signals for controlling timing of operation of the ALU 1801, the ALU controller 1802, the instruction decoder 1803, the interrupt controller 1804, and the register controller 1807. For example, the timing controller 1805 is provided with an internal clock generator for generating an internal clock signal CLK2 based on a reference clock signal CLK1, and supplies the internal clock signal CLK2 to the various circuits described above. Note that the structure of the microprocessor 1800 shown in FIG. 18 is merely an example, and can be changed as appropriate depending on the uses.

A microprocessor is manufactured in this embodiment mode by the method described in Embodiment Mode 1 or the like. Accordingly, operation speed of a semiconductor element is greatly improved, which contributes to improvement in performance of the microprocessor.

Next, an example of a semiconductor device having an arithmetic function, which is capable of transmitting and receiving data without contact, is described with reference to FIG. 19. FIG. 19 shows an example of a wireless tag which transmits and receives signals to/from an external device by wireless communication. Note that the wireless tag of the present invention includes a central processing unit (CPU), so to speak, a miniaturized computer. A wireless tag 1900 has an analog circuit portion 1901 and a digital circuit portion 1902. The analog circuit portion 1901 has a resonance circuit 1903 with a resonance capacitor, a rectifier circuit 1904, a constant voltage circuit 1905, a reset circuit 1906, an oscillator circuit 1907, a demodulation circuit 1908, a modulation circuit 1909, and a power management circuit 1919. The digital circuit portion 1902 has an RF interface 1910, a control register 1911, a clock controller 1912, a CPU interface 1913, a CPU 1914, a RAM 1915, and a ROM 1916.

The operation of the wireless tag 1900 having such a structure is described below. When an antenna 1917 receives a signal from outside, an induced electromotive force is generated in the resonance circuit 1903 based on the signal. A capacitor portion 1918 is charged with the induced electromotive force which has passed through the rectifier circuit 1904. This capacitor portion 1918 is preferably formed using a capacitor such as a ceramic capacitor or an electric double layer capacitor. The capacitor portion 1918 may be formed over the same substrate as the wireless tag 1900 or may be attached as another component to a substrate having an insulating surface that partially constitutes the wireless tag 1900.

The reset circuit 1906 generates a signal for resetting and initializing the digital circuit portion 1902. For example, a signal that rises after rise in power supply voltage with delay is generated as the reset signal. The oscillator circuit 1907 changes the frequency and duty ratio of a clock signal in response to a control signal generated by the constant voltage circuit 1905. The demodulator circuit 1908 having a low pass filter binarizes fluctuation in amplitude of an amplitude-modulated (ASK) reception signals, for example. The modulator circuit 1909 fluctuates the amplitude of an amplitude-modulated (ASK) transmission signal and transmits the signal. The modulator circuit 1909 varies the resonance point of the resonance circuit 1903, thereby varying the amplitude of communication signals. The clock controller 1912 generates a control signal for changing the frequency and duty ratio of a clock signal depending on the power supply voltage or a consumption current of the CPU 1914. The power supply voltage is monitored by the power management circuit 1919.

A signal that is inputted to the wireless tag 1900 from the antenna 1917 is demodulated by the demodulator circuit 1908, and then divided into a control command, data, and the like by the RF interface 1910. The control command is stored in the control register 1911. The control command includes a reading instruction of data stored in the ROM 1916, a writing instruction of data to the RAM 1915, an arithmetic instruction to CPU 1914, and the like. The CPU 1914 accesses the ROM 1916, the RAM 1915, and the control register 1911 via the CPU interface 1913. The CPU interface 1913 has a function to generate an access signal for any one of the ROM 1916, the RAM 1915, and the control register 1911 based on an address requested by the CPU 1914.

As an arithmetic method of the CPU 1914, a method may be employed in which the ROM 1916 stores an operating system (OS) and a program is read and executed at the time of starting operation. Alternatively, a method may be employed in which an arithmetic circuit is formed and an arithmetic process is conducted using hardware. In a method in which both hardware and software are used, a method can be employed in which the circuit dedicated to arithmetic conducts part of the process and the CPU 1914 conducts the other part of the arithmetic process by using a program.

A wireless tag is manufactured in this embodiment mode by the method described in Embodiment Mode 1 or the like. Accordingly, operation speed of a semiconductor element is greatly improved, which contributes to improvement in performance of the wireless tag.

This embodiment mode can be implemented by being combined with any of Embodiment Modes 1 to 6 as appropriate.

Embodiment Mode 8

In this embodiment mode, an electronic device using the semiconductor device, in particular, the display device of the present invention will be described with reference to FIGS. 20A to 20H and FIGS. 21A to 21C.

As electronic devices manufactured using the semiconductor device of the present invention (particularly, the display device), the following can be given: a camera such as a video camera or a digital camera, a goggle type display (a head mounted display), a navigation system, an audio reproducing device (car audio set or the like), a computer, a game machine, a portable information terminal (mobile computer, a cellular phone, a portable game machine, an e-book, or the like), and an image reproducing device provided with a recording medium (specifically, a device provided with a display that can reproduce a recording medium such as a digital versatile disc (DVD) and display the image), and the like.

Figure 20A:
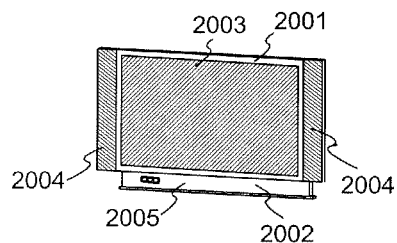
FIGS. 20A to 20H are views each illustrating an electronic device.

FIG. 20A shows a television receiver or a monitor of a personal computer. The television receiver or monitor of a personal computer includes a housing 2001, a support stand 2002, a display portion 2003, speaker portions 2004, a video input terminal 2005, and the like. The semiconductor device of the present invention is used for the display portion 2003. According to the present invention, a television receiver or a monitor of a personal computer with high performance can be provided.

Figure 20B:
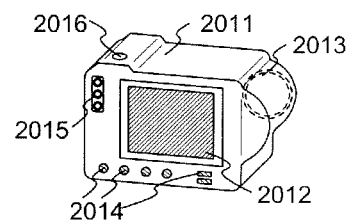

FIG. 20B shows a digital camera. An image receiving portion 2013 is provided on the front side part of a main body 2011, and a shutter button 2016 is provided on the top side part of the main body 2011. Furthermore, on the back side part of the main body 2011, a display portion 2012, operation keys 2014, and an external connection port 2015 are provided. The semiconductor device of the present invention is used for the display portion 2012. According to the present invention, a digital camera with high performance can be provided.

Figure 20C:
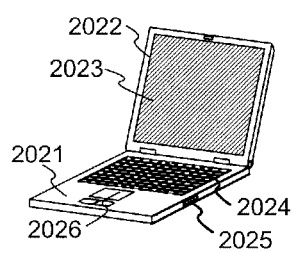

FIG. 20C shows a laptop personal computer. In a main body 2021, a keyboard 2024, an external connection port 2025, and a pointing device 2026 are provided. Furthermore, a housing 2022 having a display portion 2023 is attached to the main body 2021. The semiconductor device of the present invention is used for the display portion 2023. According to the present invention, a laptop personal computer with high performance can be provided.

Figure 20D:
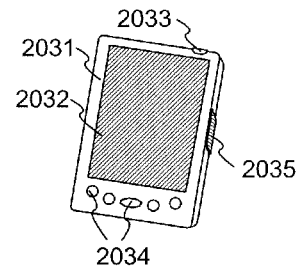

FIG. 20D shows a mobile computer which includes a main body 2031, a display portion 2032, a switch 2033, operation keys 2034, an infrared port 2035, and the like. Furthermore, an active matrix display device is provided in the display portion 2032. The semiconductor device of the present invention is used for the display portion 2032. According to the present invention, a mobile computer with high performance can be provided.

Figure 20E:
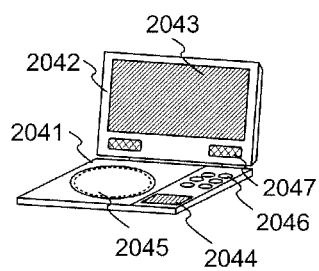

FIG. 20E shows an image reproducing device. In a main body 2041, a display portion 2044, a storage media reader 2045, and operation keys 2046 are provided. Furthermore, a housing 2042 having speaker portions 2047 and a display portion 2043 is attached to the main body 2041. The semiconductor device of the present invention is used for each of the display portions 2043 and 2044. According to the present invention, an image reproducing device with high performance can be provided.

Figure 20F:
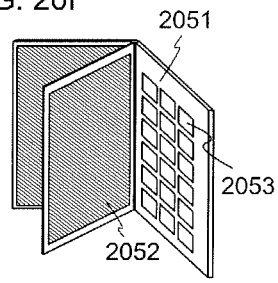

FIG. 20F shows an electronic book. In a main body 2051, operation keys 2053 are provided. Furthermore, a plurality of display portions 2052 is attached to the main body 2051. The semiconductor device of the present invention is used for the display portion 2052. According to the present invention, an electronic book with high performance can be provided.

Figure 20G:
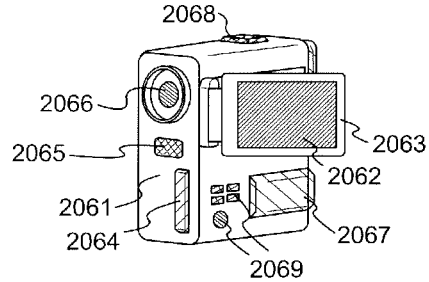

FIG. 20G shows a video camera. In a main body 2061, an external connection port 2064, a remote control receiver 2065, an image receiving portion 2066, a battery 2067, an audio input portion 2068, and operation keys 2069 are provided. Furthermore, a housing 2063 having a display portion 2062 is attached to the main body 2061. The semiconductor device of the present invention is used for the display portion 2062. According to the present invention, a video camera with high performance can be provided.

Figure 20H:
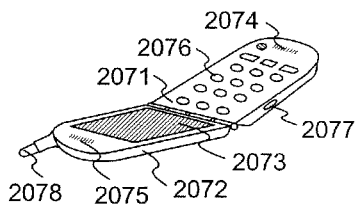

FIG. 20H shows a cellular phone which includes a main body 2071, a housing 2072, a display portion 2073, an audio input portion 2074, an audio output portion 2075, operation keys 2076, an external connection port 2077, an antenna 2078, and the like. The semiconductor device of the present invention is used for the display portion 2073. According to the present invention, a cellular phone with high performance can be provided.

Figure 21A:
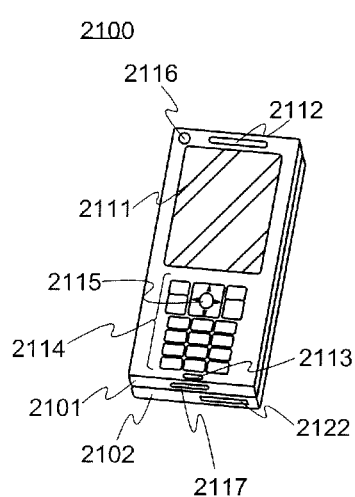
FIGS. 21A to 21C are views each illustrating an electronic device.
Figure 21B:
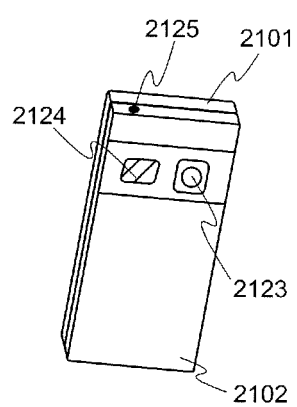
Figure 21C:
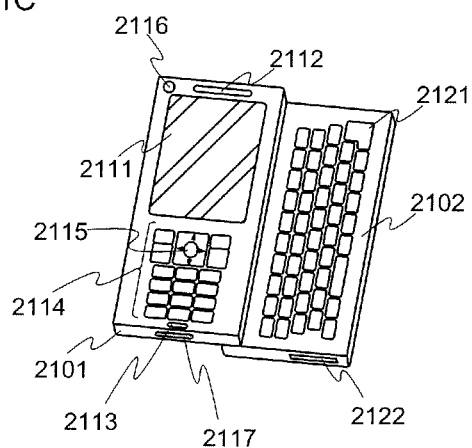
Figure 22A:
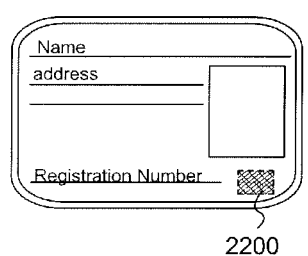
FIGS. 22A to 22F are views each illustrating usage of a semiconductor device.
Figure 22B:
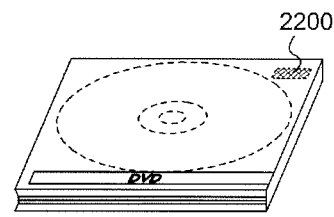
Figure 22C:
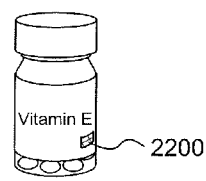
Figure 22D:
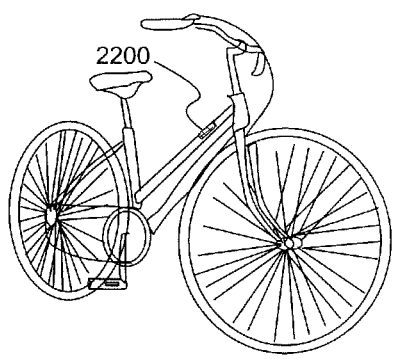
Figure 22E:
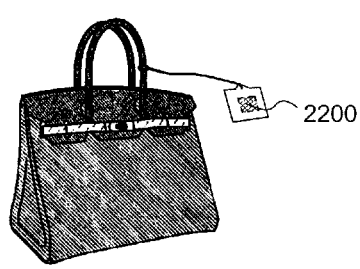
Figure 22F:
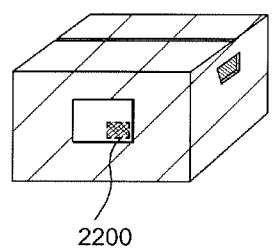

FIGS. 21A to 21C shows a structural example of a portable electronic device 2100 having functions as a telephone and an information terminal. FIG. 21A is a front view, FIG. 21B is a back view, and FIG. 21C is a development view. The portable electronic device 2100 has functions as both a telephone and an information terminal and is an electronic device so-called a smartphone which is capable of various data processing besides voice call.

The portable electronic device 2100 includes a housing 2101 and a housing 2102. The housing 2101 is provided with a display portion 2111, a speaker 2112, a microphone 2113, operation keys 2114, a pointing device 2115, a lens 2116 for camera, an external connection terminal 2117, and the like. The housing 2102 is provided with a keyboard 2121, an external memory slot 2122, a lens 2123 for camera, a light 2124, an earphone terminal 2125, and the like. Moreover, an antenna is built into the housing 2101. In addition to the structure described above, a non-contact IC ship, a small size memory device, or the like can be built therein.

The semiconductor device of the present invention is incorporated in the display portion 2111. Note that an image displayed (and direction in which the image is displayed) in the display portion 2111 variously changes with respect to the usage pattern of the portable electronic device 2100. Moreover, since the display portion 2111 and the lens 2116 for camera are provided on the same surface, voice call (so-called videophone) with images is possible. Note that the speaker 2112 and the microphone 2113 can be used not only for voice call but also for recording, reproducing, or the like. In the case where a still image and a moving image are shot by using the lens 2123 for camera (and the light 2124), the display portion 2111 is used as a finder. The operation keys 2114 are used for incoming/outgoing of phone call, inputting simple information such as e-mail, screen scrolling, moving cursor, and the like.

The housings 2101 and 2102 overlap with each other (FIG. 21A) slide and can be developed as shown in FIG. 21C, so that the portable electronic device 2100 can be used as an information terminal. In this case, smooth operation with the keyboard 2121 and the pointing device 2115 can be performed. The external connection terminal 2117 can be connected to various cables such as an AC adopter or a USB cable, whereby the portable electronic device 2100 can be charged or can perform data communication with a computer or the like. Moreover, by inserting a recording medium into the external memory slot 2122, the portable electronic device 2100 can deal with storing and moving data with higher capacitance. In addition to the functions described above, a function of wireless communication using electromagnetic waves such as infrared rays, a function of receiving television, and the like may be included. According to the present invention, a portable electronic device with high performance can be provided.

As described above, the present invention can be widely applied to and used in electronic devices in a variety of fields. Note that this embodiment mode can be implemented by being combined with any of Embodiment Modes 1 to 7 as appropriate.

Embodiment Mode 9

In this embodiment mode, uses of a semiconductor device, in particular, a wireless tag (also referred to as a RFID tag) of the present invention will be described with reference to FIGS. 22A to 22F.

According to the present invention, a semiconductor device which functions as a wireless tag can be formed. A wireless tag can be used in a wide variety of uses, and may be used by being mounted on objects such as bills, coins, securities, bearer bonds, certificates (driver's licenses, resident cards, and the like, see FIG. 22A), containers for wrapping objects (wrapping paper, bottles, and the like, see FIG. 22C), recording media (DVD software, video tapes, and the like, see FIG. 22B), vehicles (bicycles and the like, see FIG. 22D), personal belongings (bags, glasses, and the like), foods, plants, clothes, lifestyle goods, and products such as electronic devices, or shipping tags of baggage (see FIGS. 22E and 22F). Note that the wireless tag is indicated by reference numeral 2200 in each of FIGS. 22A to 22F.

Note that the electronic device refers to a liquid crystal display device, an EL display device, a television unit (also simply referred to as a TV, a TV receiver, or a television receiver), a cellular phone, and the objects shown in Embodiment Mode 5, for example. The semiconductor device can be mounted on animals, human body, and the like.

The wireless tag is attached to a surface of an object or embedded to be fixed on an object. For example, the RFID tag may be embedded in paper of a book, or an organic resin of a container for wrapping an object to be fixed on each object. Counterfeits can be prevented by providing an RFID tag on the bills, coins, securities, bearer bonds, certificates, and the like. Further, by providing an RFID tag in containers for wrapping objects, recording media, personal belongings, foods, clothes, lifestyle goods, electronic devices, and the like, inspection systems, rental systems, and the like can be performed more efficiently. The wireless tag that can be formed according to the present invention has high reliability though it is inexpensive, and can be applied to various objects.

When a wireless tag that can be formed according to the present invention is applied to a management system or a distribution system of articles, the system can have high functionality. For example, when information which is recorded in an RFID tag provided in a tag is read by a reader/writer provided near a conveyor belt, information about a distribution process, a delivery destination, or the like is read out, and inspection of merchandise or distribution of goods can be easily carried out.

As described, the present invention can be widely applied to and used in a variety of objects. Note that this embodiment mode can be implemented by being combined with any of Embodiment Modes 1 to 8 as appropriate.

Embodiment 1

In this embodiment, the surface unevenness of an SOI substrate which was manufactured by the method shown in Embodiment Mode 1 or the like was observed. The SOI substrate of this embodiment which was used for an observation has a structure in which silicon oxide, silicon nitride oxide, silicon oxynitride, and single crystal silicon are stacked in this order over a glass substrate. In addition, the thicknesses of the glass substrate, the silicon oxide, the silicon nitride oxide, the silicon oxynitride, and the single crystal silicon were 0.7 mm, 50 nm, 50 nm, 50 nm, and 120 nm, respectively.

The planarity of the surface of the single crystal silicon can be analyzed using, for example, an optical microscope, an atomic force microscope (AFM), a scanning electron microscope (SEM), or the like.

In this embodiment, the surface unevenness of the region a (the region where the energy density of the laser beam with which the semiconductor layer is irradiated is almost constant) and the region b (the region where the energy density of the laser beam with which the semiconductor layer is irradiated is rapidly changed) in Embodiment Mode 1 was observed using AFM. Note that the laser irradiation conditions for manufacturing a sample which was used in this embodiment were as follows:

wavelength: 308 nm (XeCl excimer laser)
energy density of laser beam: 661.7 mJ/cm$^2$ (peak value)
repetition rate: 30 Hz
scanning speed: 1 mm/sec.
number of irradiation pulses: approximately 10 pulses (overlap ratio: 89%)

In the conditions described above, the overlap ratio is as high as 89%, which is merely the condition to examine the state of the region which is irradiated with the laser beam; however, actual manufacturing conditions of a semiconductor device are not limited to the conditions described above. Note that since the overlap ratio is 89%, the same spot is to be irradiated with approximately 10 laser beam pulses.

FIGS. 23A and 23B are examples of a plane observation image and a cross-sectional profile of the surface of the single crystal silicon layer in the region a which was observed by AFM. Note that a region of 5 μm×5 μm which was observed is shown in this embodiment. The cross-sectional profile is shown on the right side of each of FIGS. 23A and 23B, and the plane observation image is shown on the left side of each of FIGS. 23A and 23B. FIG. 23C shows parameters of the surface roughness which were calculated based on data of FIGS. 23A and 23B. Note that the measurement apparatus, the data processing method, and the like are similar to those of Embodiment Mode 1.

A similar observation was also performed on the region b. FIGS. 24A and 24B are examples of a plane observation image and a cross-sectional profile of the surface of the single crystal silicon layer in the region b which was observed by AFM. In addition, FIG. 24C shows parameters of the surface roughness which were calculated based on data of FIGS. 24A and 24B.

From the observation results shown in FIGS. 23A to 23C and FIGS. 24A to 24C, it is found that the range of the average surface roughness ($R_a$) and the root mean square of surface roughness ($R_{ms}$) is as follows:

region a: the average surface roughness is less than 1.5 nm, and the root mean square of surface roughness is less than 2 nm region b: the average surface roughness is greater than or equal to 1.5 nm, and the root mean square of surface roughness is greater than or equal to 2 nm Note that the average surface roughness in the region which is not irradiated with the laser beam (the region c in Embodiment Mode 1) is greater than or equal to 7 nm, and the root mean square of surface roughness thereof is greater than or equal to 10 nm. That is, the planarity of the surface of the single crystal silicon is much higher even in the region b as compared to the region c which is not irradiated with the laser beam. Therefore, there is no problem in using the region b for any region except a region where extremely high planarity is required. In addition, since the same spot is irradiated with a number of laser beam pulses, unevenness at the time of separating silicon is completely disappeared; thus, it is found that the unevenness of the region b is purely caused only by the laser irradiation on the edge portion of the laser beam.

Figure 25A:
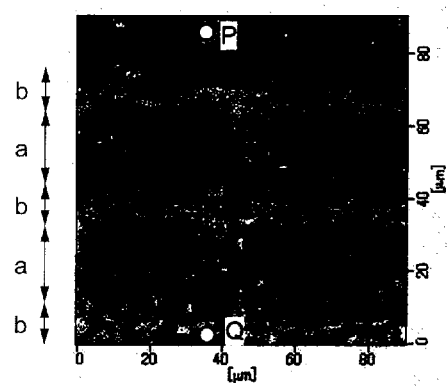
FIGS. 25A and 25B are an observation image and a cross-sectional profile of a surface of a semiconductor layer observed by AFM.
Figure 25B:
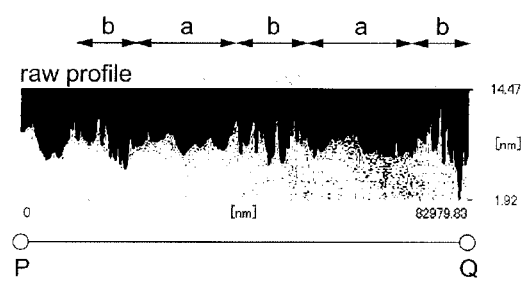

FIGS. 25A and 25B show the results of an observation which was performed in a measurement region different from those of FIGS. 23A to 23C and FIGS. 24A to 24C (the measurement region is 90 μm×90 μm). FIG. 25A shows a plane observation image and FIG. 25B shows a cross-sectional profile taken along line P-Q in FIG. 25A. It is found from FIGS. 25A and 25B that the region b which is irradiated with the edge portion of the laser beam is in a stripe shape. In addition, the regions a and b appear alternately.

This embodiment can be implemented by being combined with any of Embodiment Modes 1 to 9 as appropriate.

Embodiment 2

In this embodiment, Raman scattering measurement was performed in order to evaluate crystallinity of a single crystal silicon layer in an SOI substrate. The SOI substrate of this embodiment which was used for the Raman scattering measurement has a structure in which silicon oxide, silicon nitride oxide, silicon oxynitride, and single crystal silicon are stacked in this order over a glass substrate. In addition, the thicknesses of the glass substrate, the silicon oxide, the silicon nitride oxide, the silicon oxynitride, and the single crystal silicon were 0.7 mm, 50 nm, 50 nm, 50 nm, and 100 nm, respectively.

Laser irradiation conditions for improving the planarity of a sample which was used in this embodiment were as follows:
wavelength: 308 nm (XeCl excimer laser)
energy density of laser beam: 567.1 mJ/cm$^2$ (a peak value)
repetition rate: 30 Hz
scanning speed: 8 mm/sec.
number of irradiation pulses: approximately 1 pulse (overlap ratio: 11%)

Note that the sample used in this embodiment was formed in which a substrate temperature at the time of performing laser irradiation was 420° C. Reduction in defects effectively proceeds by heating the substrate even when the energy density is relatively low and the number of irradiation pulses is small. On the other hand, reduction in defects does not proceed at a temperature of approximately 420° C.; thus, it is found that the laser irradiation is essential in this sense.

Figure 26:
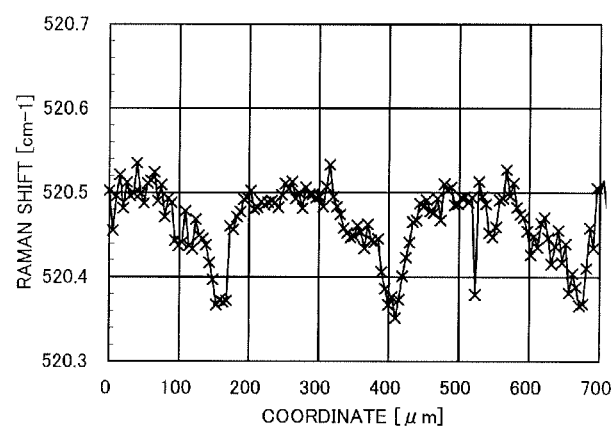
FIG. 26 is a graph showing the distribution of peak wavenumbers of a Raman spectrum in a semiconductor layer irradiated with a laser beam.

FIG. 26 shows the measurement result of the Raman scattering. The vertical axis indicates a Raman shift (cm$^{-1}$), and the horizontal axis indicates a coordinate (μm). Here, the peak value of the Raman spectrum in each coordinate was employed as a Raman shift value. In addition, the measurement of the Raman spectrum was performed while scanning an excited laser beam, with spacing of 2 μm. Other measurement conditions are similar to those in Embodiment Mode 1.

It is found from FIG. 26 that there are periodical regions where Raman shifts are less than 520.4 cm$^{-1}$. The regions each corresponds to the region b in Embodiment Mode 1. The Raman shift value in ideal single crystal silicon is 520.6 cm$^{-1}$, and as the Raman shift value comes closer to 520.6 cm$^{-1}$, the bond state of an element is ideal. Accordingly, if a Raman shift deviates from this value, it implies that an ideal bond state is far to reach. Note that although there are regions where respective Raman shifts are less than 520.4 cm$^{-1}$ at a coordinate around 520 μm, this is data error.

It is found from the measurement result shown in FIG. 26 that the peak positions of Raman spectra in the regions a and b are in the following ranges:
region a: greater than or equal to 520.4 cm$^{-1}$ (less than or equal to 520.6 cm$^{-1}$)
region b: less than 520.4 cm$^{-1}$ This embodiment can be implemented by being combined with any of Embodiment Modes 1 to 9 and Embodiment 1 as appropriate.

The present application is based on Japanese Patent Application serial No. 2007-281631 filed with Japan Patent Office on Oct. 30, 2007, the entire contents of which are hereby incorporated by reference.

What is claimed is:

1. A method for manufacturing a semiconductor device comprising:
forming an insulating layer over a single crystal semiconductor substrate;
irradiating the single crystal semiconductor substrate with ions through the insulating layer to form a damaged region;
forming a bonding layer on a surface of the insulating layer after forming the damaged region;
bonding the bonding layer and a substrate having an insulating surface to each other;
separating the single crystal semiconductor substrate at the damaged region to form a single crystal semiconductor layer over the substrate having the insulating surface;
irradiating the single crystal semiconductor layer with a pulsed laser beam to reduce defects and improve a planarity of the single crystal semiconductor layer; and
forming an active layer of a semiconductor element by using the single crystal semiconductor layer excluding a region which is irradiated with an edge portion of the pulsed laser beam,
wherein the insulating layer includes a stacked-layer structure of a silicon oxynitride film and a silicon nitride oxide film.

2. The method for manufacturing a semiconductor device according to claim 1, wherein the bonding layer is formed by a chemical vapor deposition method which uses an organosilane gas.

3. The method for manufacturing a semiconductor device according to claim 1, wherein the bonding layer is formed with a stacked-layer structure.

4. The method for manufacturing a semiconductor device according to claim 1,
wherein a light intensity of the pulsed laser beam except the edge portion is less than the light intensity at which the single crystal semiconductor layer is melted completely, and greater than or equal to 85% of the light intensity which serves as a boundary between complete melting and partial melting, and wherein a light intensity in the edge portion of the pulsed laser beam is less than 85% of the light intensity which serves as the boundary.

5. The method for manufacturing a semiconductor device according to claim 1, wherein an average surface roughness of the single crystal semiconductor layer excluding the region which is irradiated with the edge portion of the pulsed laser beam is less than 1.5 nm, and a root-square roughness thereof is less than 2 nm, and wherein an average surface roughness of the single crystal semiconductor layer in the region which is irradiated with the edge portion of the pulsed laser beam is greater than or equal to 1.5 nm, and a root-square roughness thereof is greater than or equal to 2 nm.

6. The method for manufacturing a semiconductor device according to claim 1, wherein a wavenumber of Raman peak of the single crystal semiconductor layer excluding the region which is irradiated with the edge portion of the pulsed laser beam is greater than or equal to 520.4 $cm^{-1}$, and wherein a wavenumber of Raman Peak of the single crystal semiconductor layer in the region which is irradiated with the edge portion of the pulsed laser beam is less than 520.4 $cm^{-1}$.

7. The method for manufacturing a semiconductor device according to claim 1, wherein the pulsed laser beam is an excimer laser beam.

8. The method for manufacturing a semiconductor device according to claim 1, wherein the pulsed laser beam has a linear shape on an irradiation surface of the single crystal semiconductor layer.

9. The method for manufacturing a semiconductor device according to claim 1, wherein the pulsed laser beam does not overlap on an irradiation surface of the single crystal semiconductor layer.

10. The method for manufacturing a semiconductor device according to claim 1, wherein the semiconductor device is one selected from the group consisting of a television receiver, a camera, a computer, an image reproducing device, an electronic book, a phone, and a wireless tag.

11. The method for manufacturing a semiconductor device according to claim 1, wherein the damaged region contains hydrogen at a concentration greater than or equal to $1\times10^{20}$ atoms/$cm^3$.

12. A method for manufacturing a semiconductor device comprising:

forming an insulating layer over a single crystal semiconductor substrate;

irradiating the single crystal semiconductor substrate with ions through the insulating layer to form a damaged region;

forming a bonding layer on a surface of the insulating layer after forming the damaged region;

bonding the bonding layer and a substrate having an insulating surface to each other;

separating the single crystal semiconductor substrate at the damaged region to form a single crystal semiconductor layer over the substrate having the insulating surface;

irradiating the single crystal semiconductor layer with a pulsed laser beam to reduce defects and improve a planarity of the single crystal semiconductor layer; and forming an active layer of a semiconductor element by using the single crystal semiconductor layer, wherein the insulating layer includes a stacked-layer structure of a silicon oxynitride film and a silicon nitride oxide film.

13. The method for manufacturing a semiconductor device according to claim 12, wherein the damaged region contains hydrogen at a concentration greater than or equal to $1\times10^{20}$ atoms/$cm^3$.

14. The method for manufacturing a semiconductor device according to claim 12, wherein the bonding layer is formed by a chemical vapor deposition method which uses an organosilane gas.

15. The method for manufacturing a semiconductor device according to claim 12, wherein the bonding layer is formed with a stacked-layer structure.

16. The method for manufacturing a semiconductor device according to claim 12, wherein the pulsed laser beam is an excimer laser beam.

17. The method for manufacturing a semiconductor device according to claim 12, wherein the pulsed laser beam has a linear shape on an irradiation surface of the single crystal semiconductor layer.

18. The method for manufacturing a semiconductor device according to claim 12, wherein the pulsed laser beam does not overlap on an irradiation surface of the single crystal semiconductor layer.

19. The method for manufacturing a semiconductor device according to claim 12, wherein the semiconductor device is one selected from the group consisting of a television receiver, a camera, a computer, an image reproducing device, an electronic book, a phone, and a wireless tag.

* * * * *